United States Patent
Shiono et al.

(10) Patent No.: US 8,221,956 B2
(45) Date of Patent: Jul. 17, 2012

(54) RESIST COMPOSITION FOR IMMERSION EXPOSURE, METHOD OF FORMING RESIST PATTERN, AND FLOURINE-CONTAINING POLYMERIC COMPOUND

(75) Inventors: Daiju Shiono, Kawasaki (JP);
Tomoyuki Hirano, Kawasaki (JP);
Sanae Furuya, Kawasaki (JP);
Takahiro Dazai, Kawasaki (JP);
Hiroaki Shimizu, Kawasaki (JP);
Tsuyoshi Kurosawa, Kawasaki (JP);
Hideto Nito, Kawasaki (JP); Tsuyoshi Nakamura, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 259 days.

(21) Appl. No.: 12/457,705

(22) Filed: Jun. 18, 2009

(65) Prior Publication Data
US 2009/0317743 A1   Dec. 24, 2009

(30) Foreign Application Priority Data
Jun. 23, 2008   (JP) .................. P2008-163861

(51) Int. Cl.
G03F 7/039   (2006.01)
G03F 7/20    (2006.01)
G03F 7/30    (2006.01)
C08F 14/18   (2006.01)

(52) U.S. Cl. .................. 430/270.1; 430/311; 430/326; 430/907; 430/910; 526/242; 526/245

(58) Field of Classification Search ................ None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 2005/0014090 A1* | 1/2005 | Hirayama et al. | 430/270.1 |
| 2008/0193879 A1* | 8/2008 | Allen et al. | 430/285.1 |
| 2009/0197204 A1* | 8/2009 | Shiono et al. | 430/286.1 |

FOREIGN PATENT DOCUMENTS

| | | |
|---|---|---|
| JP | 9-208554 | 8/1997 |
| JP | 11-35551 | 2/1999 |
| JP | 11-35552 | 2/1999 |
| JP | 11-35573 | 2/1999 |
| JP | 11-322707 | 11/1999 |
| WO | 2004/074242 | 9/2004 |

OTHER PUBLICATIONS

D. Gil et al., "First Microprocessors with Immersion Lithography", Proceedings of SPIE (U.S.), vol. 5754, pp. 119-128, 2005.
Shun-ichi Kodama et al., "Synthesis of Novel Fluoropolymer for 157nm Photoresists by Cyclo-polymerization", Proceedings of SPIE (U.S.), vol. 4690, pp. 76-83, 2002.
Makiko Irie et al., "Surface Property Control for 193nm Immersion Resist", Journal of Photopolymer Science and Technology, vol. 19, No. 4, pp. 565-568, 2006.

* cited by examiner

*Primary Examiner* — Sin J. Lee
(74) *Attorney, Agent, or Firm* — Wenderoth, Lind & Ponack, L.L.P.

(57) ABSTRACT

A resist composition for immersion exposure including: a fluorine-containing polymeric compound (F) containing a structural unit (f1) having a base dissociable group and a structural unit (f2) represented by general formula (f2-1) (wherein R represents a hydrogen atom, a lower alkyl group or a halogenated lower alkyl group; and W is a group represented by any one of general formulas (w-1) to (w-4)); a base component (A) that exhibits changed solubility in an alkali developing solution under the action of acid; and an acid generator component (B) that generates acid upon exposure.

[Chemical Formula 1]

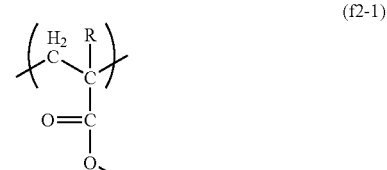

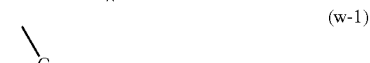

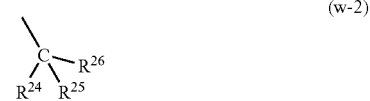

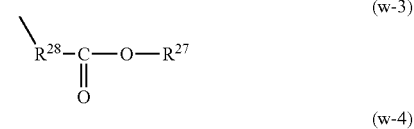

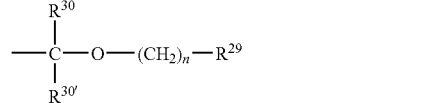

9 Claims, 1 Drawing Sheet

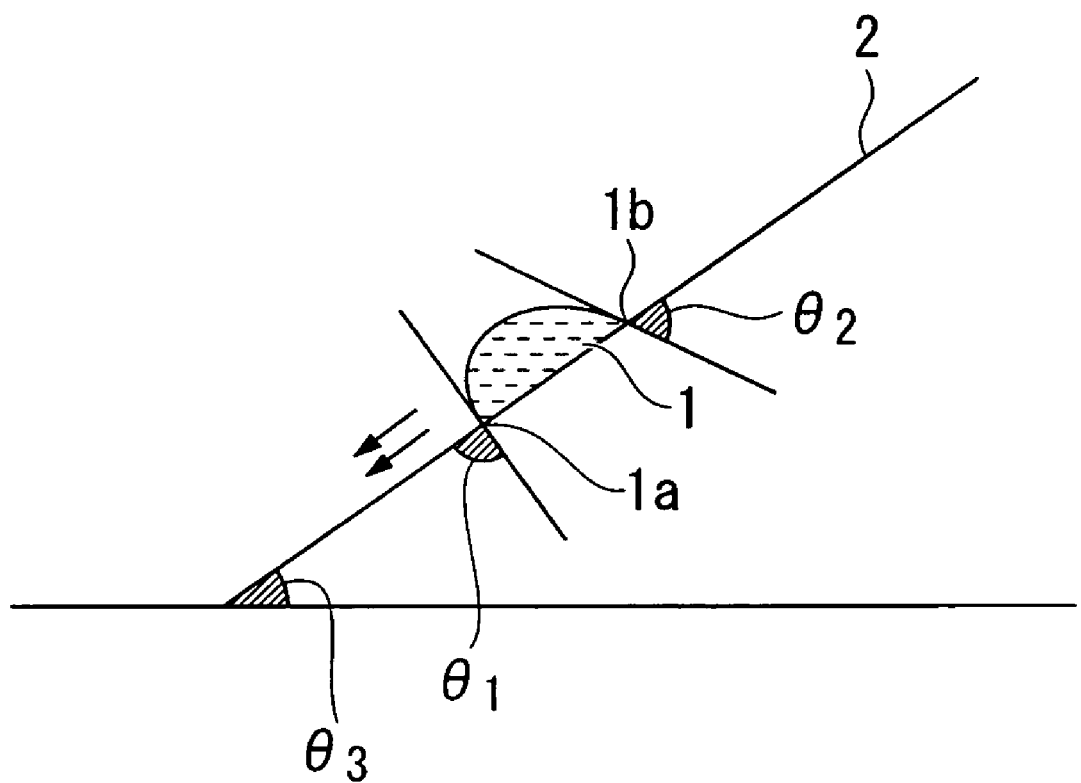

RESIST COMPOSITION FOR IMMERSION EXPOSURE, METHOD OF FORMING RESIST PATTERN, AND FLOURINE-CONTAINING POLYMERIC COMPOUND

BACKGROUND OF THE INVENTION

1. Field of the Invention

The present invention relates to a resist composition for immersion exposure (liquid immersion lithography), a method of forming a resist pattern that uses the resist composition for immersion exposure, and a fluorine-containing compound useful as an additive for a resist composition for immersion exposure.

Priority is claimed on Japanese Patent Application No. 2008-163861, filed Jun. 23, 2008, the content of which is incorporated herein by reference.

2. Description of Related Art

In lithography techniques, for example, a resist film composed of a resist material is formed on a substrate, and the resist film is subjected to selective exposure of radial rays such as light or an electron beam through a mask having a predetermined pattern, followed by development, thereby forming a resist pattern having a predetermined shape on the resist film.

For miniaturization of semiconductor devices, shortening of the wavelength of the exposure light source, and increasing of the numerical aperture (NA) of the projector lens have progressed. Currently, exposure apparatuses in which an ArF excimer laser having a wavelength of 193 mm is used as an exposure light source and NA=0.84 have been developed. As shortening of the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structural units derived from (meth)acrylate esters within the main chain (acrylic resins) are typically used as base resins for chemically amplified resists that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift methods and modified illumination methods. Currently, as the immersion exposure technique, a technique using an ArF excimer laser as an exposure source is being actively studied, and water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxyethyl group, tert-butyl group or tert-butyloxycarbonyl group is being introduced into a fluorine-containing polymeric compound, and the fluorine-containing polymeric compound is used as a base resin for a chemically amplified positive resist. However, when such a fluorine-containing polymeric compound is used as a base resin for a chemically amplified positive resist, disadvantages are caused in that a large quantity of out gas is generated following exposure, and the resistance to dry etching gases (namely, the etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2). In addition, a fluorine-containing polymeric compound has been reported in order to provide a resist film with water repellency in a resist composition for immersion exposure (see, for example, Non-Patent Document 3).

[Non-Patent Document 1] Proceedings of SPIE (U.S.), vol. 5754, pp. 119-128 (2005)

[Non-Patent Document 2] Proceedings of SPIE (U.S.), vol. 4690, pp. 76-83 (2002)

[Non-Patent Document 3] Journal of Photopolymer Science and Technology, Vol. 19, No. 4, pp. 565-568 (2006)

SUMMARY OF THE INVENTION

In immersion exposure, a resist material is required which exhibits not only general lithography properties (e.g., sensitivity, resolution, etching resistance and the like), but also properties suited for immersion lithography. For example, in immersion exposure, when the resist film comes into contact with the immersion medium, elution of a substance contained in the resist film into the immersion medium (substance elution) occurs. This elution of a substance causes phenomena such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced. Further, when the immersion medium is water, and immersion exposure is performed using a scanning-type immersion exposure apparatus as disclosed in Non-Patent Document 1, a water tracking ability wherein the immersion medium is capable of tracking the movement of the lens is required. When the water tracking ability is poor, the exposure speed decreases, and as a result, there is a possibility that the productivity may be adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface. However, if the resist film is simply rendered hydrophobic, then adverse effects are seen on the lithography properties. For example, as the hydrophobicity of the resist film is increased, defects tend to occur more readily on the surface of the formed resist pattern following alkali developing. The term "defects" refers to general abnormalities within a resist film that are detected when observed from directly above the developed resist film using, for example, a surface defect detection apparatus (product name: "KLA") manufactured by KLA-TENCOR Corporation. Examples of these abnormalities include post-developing scum, foam, dust, bridges (structures that bridge different portions of the resist pattern), color irregularities, and foreign deposits.

It is considered that a material which is hydrophobic during immersion exposure but then becomes hydrophilic during developing can address the problems described above. However, materials exhibiting such properties are essentially unknown in the art.

The present invention takes the above circumstances into consideration, with an object of providing a resist composition preferable for use in immersion exposure, a method of forming a resist pattern that uses the resist composition, and a fluorine-containing polymeric compound that is useful as an additive for the resist composition.

In order to solve the above-mentioned problems, the present invention employs the following aspects.

Specifically, a first aspect of the present invention is a resist composition for immersion exposure including a fluorine-containing polymeric compound (F) containing a structural unit (f1) having a base dissociable group and a structural unit (f2) represented by general formula (f2-1) shown below, a base component (A) that exhibits changed solubility in an alkali developing solution under the action of acid, and an acid generator component (B) that generates acid upon exposure.

[Chemical Formula 1]

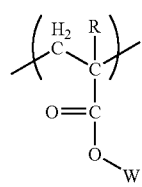

wherein R represents a hydrogen atom, a lower alkyl group or a halogenated lower alkyl group; and W is a group represented by any one of general formulas (w-1) to (w-4).

[Chemical Formula 2]

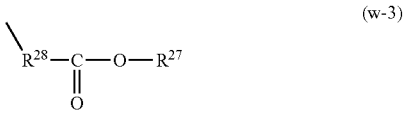

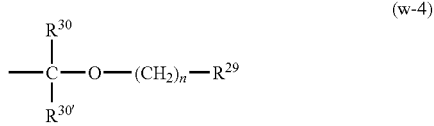

In general formula (w-1), $R^{21}$ represents an alkyl group of 2 or more carbon atoms, and $R^{22}$ and $R^{23}$ are bonded to each other to form an aliphatic monocyclic group of 7 or more carbon atoms. In general formula (w-2), $R^{24}$ represents a branched alkyl group of 3 or more carbon atoms, and $R^{25}$ and $R^{26}$ are bonded to each other to form an aliphatic cyclic group. In general formula (w-3), $R^{27}$ represents an acid dissociable, dissolution inhibiting group, and $R^{28}$ represents a divalent linking group. In general formula (w-4), $R^{29}$ represents a linear or branched alkyl group or an aliphatic cyclic group; n represents an integer of 0 to 3; $R^{30}$ and $R^{30'}$ each independently represent a linear or branched alkyl group or a hydrogen atom; and $R^{29}$ and $R^{30}$ may be bonded to each other to form an aliphatic cyclic group.

A second aspect of the present invention is a method of forming a resist pattern including applying a resist composition for immersion exposure according to the first aspect to a substrate to form a resist film, subjecting the resist film to immersion exposure, and subjecting the resist film to alkali developing to form a resist pattern.

A third aspect of the present invention is a fluorine-containing polymeric compound containing a structural unit (f1) having a base dissociable group and a structural unit (f2) represented by general formula (f2-1) shown below.

[Chemical Formula 3]

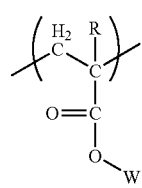

wherein R represents a hydrogen atom, a lower alkyl group or a halogenated lower alkyl group; and W is a group represented by any one of general formulas (w-1) to (w-4).

[Chemical Formula 4]

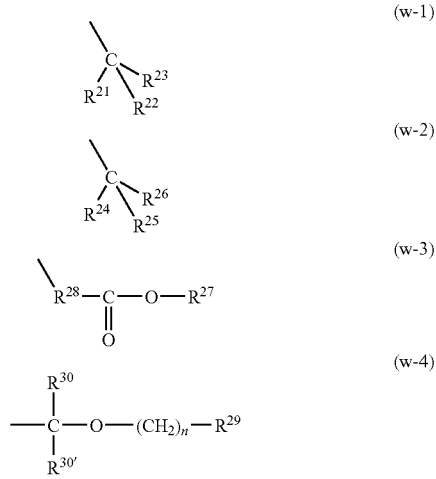

In general formula (w-1), $R^{21}$ represents an alkyl group of 2 or more carbon atoms, and $R^{22}$ and $R^{23}$ are bonded to each other to form an aliphatic monocyclic group of 7 or more carbon atoms. In general formula (w-2), $R^{24}$ represents a branched alkyl group of 3 or more carbon atoms, and $R^{25}$ and $R^{26}$ are bonded to each other to form an aliphatic cyclic group. In general formula (w-3), $R^{27}$ represents an acid dissociable, dissolution inhibiting group, and $R^{28}$ represents a divalent linking group. In general formula (w-4), $R^{29}$ represents a linear or branched alkyl group or an aliphatic cyclic group; n represents an integer of 0 to 3; $R^{30}$ and $R^{30'}$ each independently represent a linear or branched alkyl group or a hydrogen atom; and $R^{29}$ and $R^{30}$ may be bonded to each other to form an aliphatic cyclic group.

In the present description and claims, an "alkyl group", unless otherwise specified, includes linear, branched and cyclic, monovalent saturated hydrocarbon groups.

An "alkylene group", unless otherwise specified, includes linear, branched and cyclic, divalent saturated hydrocarbon groups.

A "lower alkyl group" is an alkyl group of 1 to 5 carbon atoms.

A "halogenated alkyl group" is a group in which part or all of the hydrogen atoms of an alkyl group is substituted with halogen atoms. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (namely, a polymer or a copolymer).

The term "exposure" is used as a general concept that includes irradiation with any form of radiation.

According to the present invention, there are provided a resist composition preferable for use in immersion exposure, a method of forming a resist pattern that uses the resist composition, and a fluorine-containing polymeric compound that is useful as an additive for the resist composition.

BRIEF DESCRIPTION OF THE DRAWINGS

FIG. 1 is an explanatory diagram of an advancing angle ($\theta_1$), a receding angle ($\theta_2$) and a sliding angle ($\theta_3$).

DESCRIPTION OF REFERENCE NUMERALS AND CHARACTERS

1: Droplet; 1a: Lower end; 1b: Upper end; 2: Plane; ($\theta_1$): Advancing angle; ($\theta_2$): Receding angle; ($\theta_3$): Sliding angle

DETAILED DESCRIPTION OF THE INVENTION

Resist Composition for Immersion Exposure

A resist composition for immersion exposure according to the present invention includes a fluorine-containing polymeric compound (F) (hereafter, frequently referred to as "component (F)") including a structural unit (f1) having a base dissociable group and a structural unit (f2) represented by general formula (f2-1), a base component (A) that exhibits changed solubility in an alkali developing solution under the action of acid (hereafter, frequently referred to as "component (A)"), and an acid generator component (B) (hereafter, frequently referred to as "component (B)") that generates acid upon exposure.

In the resist composition, when acid is generated from the component (B) upon exposure, the action of that acid causes a change in the solubility of the component (A) in an alkali developing solution. As a result, in the formation of a resist pattern, when a resist film obtained using the resist composition is subjected to selective exposure, the solubility in the alkali developing solution of the exposed portions of the resist film changes, whereas the solubility in the alkali developing solution of the unexposed portions remains unchanged, and hence, a resist pattern can be formed by alkali developing the resist film.

<Component (F)>

[Structural Unit (f1)]

In the structural unit (f1), the term "base dissociable group" refers to an organic group which can be dissociated from the structural unit (f1) by the action of a base. Examples of the base include alkali developing solutions generally used in the fields of lithography. That is, the "base dissociable group" refers to a group which is dissociated by the action of an alkali developing solution (for example, a 2.38% by weight aqueous solution of tetramethylammonium hydroxide (TMAH) at 23° C.).

A base dissociable group dissociates due to hydrolysis caused by the action of an alkali developing solution. Therefore, a hydrophilic group is formed when the base dissociable group dissociates and the hydrophilicity of the component (F) is enhanced, and hence, the compatibility of the component (F) with the alkali developing solution is improved.

The base dissociable group is not particularly limited as long as it is an organic group that satisfies the definition described above, and the base dissociable group may or may not contain a fluorine atom.

In the structural unit (f1), when no fluorine atom is contained in portions other than the base dissociable group, it is necessary that the base dissociable group contain a fluorine atom. On the other hand, when a fluorine atom is contained in a portion other than the base dissociable group in the structural unit (f1), the base dissociable group may or may not contain a fluorine atom.

A base dissociable group containing a fluorine atom refers to a base dissociable group in which part or all of the hydrogen atoms have been substituted with a fluorine atom.

In the structural unit (f1), it is preferable that the base dissociable group contains a fluorine atom, and it is particularly desirable that the fluorine atom contained in the structural unit (f1) is present only in the base dissociable group. If the base dissociable group contains a fluorine atom, since the fluorine atom contained in the base dissociable group is also dissociated from the structural unit (f1) when the base dissociable group is dissociated by the action of an alkali developing solution, the affinity for the alkali developing solution is enhanced.

Specific examples of base dissociable groups containing a fluorine atom include those represented by general formulas (II-1) to (II-4) shown below. In the present invention, the base dissociable group is preferably at least one base dissociable group selected from those represented by general formulas (II-1) to (II-4) shown below. In terms of the effects of the present invention and ease in synthesis, a group represented by general formula (II-1) or (II-4) shown below is particularly desirable.

[Chemical Formula 5]

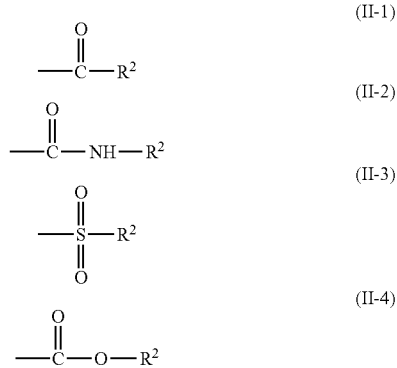

In the formulas, each $R^2$ independently represents an organic group having a fluorine atom.

In general formulas (II-1) to (II-4), each $R^2$ independently represents an organic group having a fluorine atom. An "organic group" is a group containing at least one carbon atom.

The structure of $R^2$ may be linear, branched or cyclic, and is preferably linear or branched.

In $R^2$, the organic group preferably has 1 to 20 carbon atoms, more preferably 1 to 15 carbon atoms, still more preferably 1 to 10 carbon atoms, and most preferably 1 to 5 carbon atoms.

The fluorination ratio within $R^2$ is preferably 25% or more, more preferably 50% or more, and most preferably 60% or more, as the hydrophobicity of the resist film during immersion exposure is enhanced. The term "fluorination ratio" refers to the ratio (%) of the number of fluorine atoms relative to the total number of hydrogen atoms and fluorine atoms contained within the organic group.

As a preferable example of $R^2$, a fluorinated hydrocarbon group which may or may not have a substituent can be given.

The hydrocarbon group may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^2$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom. The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be any of linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8 carbon atoms. Specific examples include a methyl group, an ethyl group, an n-propyl group, an n-butyl group, an n-pentyl group, an n-hexyl group, an n-heptyl group, an n-octyl group, an n-nonyl group and an n-decanyl group.

The unsubstituted branched alkyl group preferably has 3 to 10 carbon atoms, and more preferably 3 to 8 carbon atoms. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecanyl group and a tetracyclododecanyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include an alkyl group of 1 to 5 carbon atoms.

As the fluorinated alkyl group for $R^2$, a linear or branched fluorinated alkyl group is preferable. In particular, a group represented by general formula (III-1) or (III-2) shown below is desirable, and a group represented by general formula (III-1) is most preferable.

[Chemical Formula 6]

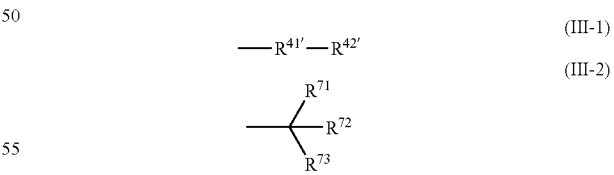

In general formula (III-1), $R^{41'}$ represents an unsubstituted alkylene group of 1 to 9 carbon atoms, and $R^{42'}$ represents a fluorinated alkyl group of 1 to 9 carbon atoms, with the provision that the total number of carbon atoms of $R^{41'}$ and $R^{42'}$ is no more than 10. In general formula (III-2), each of $R^{71}$ to $R^{73}$ independently represents a linear alkyl group of 1 to 5 carbon atoms, with the provision that at least one of $R^{71}$ to $R^{73}$ represents an alkyl group having a fluorine atom.

In general formula (III-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group and a tetrafluoroethyl group are preferable.

In general formula (III-2), as the alkyl group for $R^{71}$ to $R^{73}$, an ethyl group or a methyl group is preferable, and a methyl group is particularly desirable. At least one of the alkyl groups for $R^{71}$ to $R^{73}$ is a fluorinated alkyl group, and all of the alkyl groups for $R^{71}$ to $R^{73}$ may be fluorinated alkyl groups.

As a preferable example of the structural unit (f1), a structural unit represented by general formula (f1-1) or (f1-2) shown below can be given.

[Chemical Formula 7]

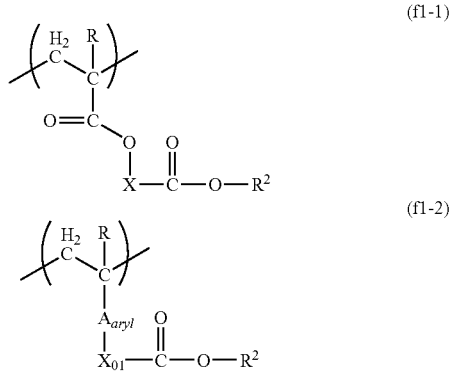

In the formulas, each R independently represents a hydrogen atom, a lower alkyl group or a halogenated lower alkyl group; X represents a divalent organic group; $A_{aryl}$ represents a divalent aromatic cyclic group which may have a substituent; $X_{01}$ represents a single bond or a divalent linking group; and each $R^2$ independently represents an organic group having a fluorine atom.

In formulas (f1-1) and (f1-2), $R^2$ is the same as defined above. In formulas (f1-1) and (f1-2), as $R^2$, a fluorinated hydrocarbon group is preferable, a fluorinated alkyl group is more preferable, a fluorinated alkyl group of 1 to 5 carbon atoms is still more preferable, and —$CH_2$—$CF_3$, —$CH_2$—$CF_2$—$CF_3$, —$CH(CF_3)_2$, —$CH_2$—$CF_2$—$CF_2$—$CF_3$ and —$CH_2$—$CH_2$—$CF_2$—$CF_2$—$CF_2$—$CF_3$ are most preferable.

As the lower alkyl group for R, a linear or branched lower alkyl group is preferable, and specific examples of lower alkyl groups include a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of halogen atoms include a fluorine atom, a chlorine atom, a bromine atom and an iodine atom, and a fluorine atom is particularly desirable.

In the present invention, as R, a hydrogen atom, a lower alkyl group or a fluorinated lower alkyl group is preferable, and a hydrogen atom or a methyl group is more preferable in terms of industrial availability.

In general formula (f1-1), X represents a divalent organic group. X may or may not have an acid dissociable portion. An "acid dissociable portion" refers to a portion within the organic group which is dissociated from the organic group by action of acid generated upon exposure. When X has an acid dissociable portion, it is preferable that the acid dissociable portion has a tertiary carbon atom.

Preferable examples of X include a hydrocarbon group which may have a substituent, and a group containing a hetero atom.

The hydrocarbon group "has a substituent" means that part or all of the hydrogen atoms of the hydrocarbon group are substituted with atoms or groups other than a hydrogen atom.

The hydrocarbon group may be either an aliphatic hydrocarbon group or an aromatic hydrocarbon group.

An aliphatic hydrocarbon group refers to a hydrocarbon group having no aromaticity.

The aliphatic hydrocarbon group may be either saturated or unsaturated, but in general, the aliphatic hydrocarbon group is preferably saturated.

More specific examples of the aliphatic hydrocarbon group include linear or branched aliphatic hydrocarbon groups, and aliphatic hydrocarbon groups that contain a ring within their structures.

The linear or branched aliphatic hydrocarbon group preferably has 1 to 10 carbon atoms, more preferably from 1 to 8, still more preferably from 1 to 5, and is most preferably 1 to 2.

As the linear aliphatic hydrocarbon group, linear alkylene groups are preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_3)_2$—$CH_2$; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. The alkyl groups within these alkylalkylene groups are preferably linear alkyl groups of 1 to 5 carbon atoms.

The linear aliphatic hydrocarbon groups may or may not have a substituent. Examples of the substituent include a fluorine atom, a fluorinated lower alkyl group of 1 to 5 carbon atoms which is substituted by a fluorine atom, and an oxygen atom (=O).

Examples of aliphatic hydrocarbon groups that contain a ring include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an abovementioned linear aliphatic hydrocarbon group or interposed within the linear aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon groups may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

A "hetero atom" within a divalent group containing a hetero atom refers to an atom other than a carbon atom or hydrogen atom, and examples thereof include an oxygen atom, a nitrogen atom, a sulfur atom and a halogen atom.

Specific examples of divalent groups containing a hetero atom include —O—, —C(=O)—, —C(=O)—O—, a carbonate bond (—O—C(=O)—O—), —NH—, —NR$^{04}$— (in the formula, R$^{04}$ represents an alkyl group), —NH—C(=O)—, =N—, and a combination of any of these "groups" with a divalent hydrocarbon group. As examples of the divalent hydrocarbon group, the same groups as those described above for the hydrocarbon group which may have a substituent can be given, and a linear or branched aliphatic hydrocarbon group is preferable.

In general formula (f1-2), $A_{aryl}$ represents a divalent aromatic cyclic group which may have a substituent. A specific example of $A_{aryl}$ includes an aromatic hydrocarbon ring (which may have a substituent) having 2 hydrogen atoms removed therefrom.

The ring skeleton of the aromatic cyclic group for $A_{aryl}$ preferably has 6 to 15 carbon atoms. Examples of ring skeletons include a benzene ring, a naphthalene ring, a phenanthrene ring and an anthracene ring. Among these, a benzene ring or a naphthalene ring is particularly desirable.

Examples of substituents which an aromatic cyclic group for $A_{aryl}$ may have include a halogen atom, an alkyl group, an alkoxy group, a halogenated lower alkyl group and an oxygen atom (=O). Examples of halogen atoms include a fluorine atom, a chlorine atom, an iodine atom and a bromine atom. As the substituent which an aromatic cyclic group for $A_{aryl}$ may have, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ is an aromatic cyclic group having a substituent, the number of the substituent may be either 1, 2 or more, preferably 1 or 2, and more preferably 1.

$X_{01}$ represents a single bond or a divalent linking group. Examples of divalent linking groups include an alkylene group of 1 to 10 carbon atoms, —O—, —C(=O)—, —C(=O)—O—, a carbonate bond (—O—C(=O)—O—), —NH—C(=O)—, and a combination of these groups, and a combination of —O— with an alkylene group of 1 to 10 carbon atoms is particularly desirable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by general formula (f1-1), structural units represented by general formulas (f1-11) to (f1-14) shown below are preferable.

Further, among structural units represented by general formula (f1-2), structural units represented by general formulas (f1-21) to (f1-24) are preferable.

[Chemical Formula 8]

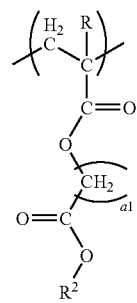

(f1-11)

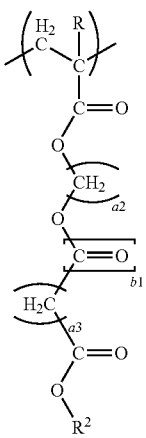

(f1-12)

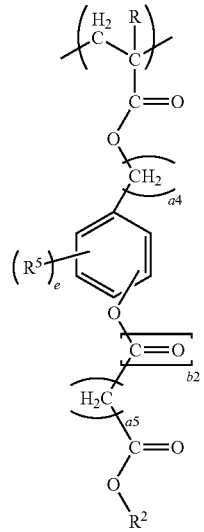

(f1-13)

(f1-14)
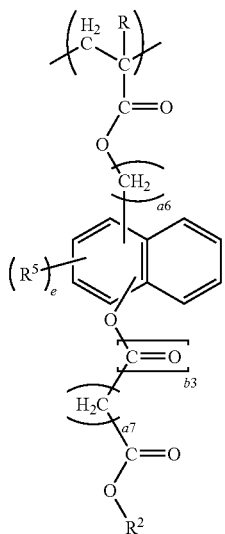
[Chemical Formula 9]
(f1-21)
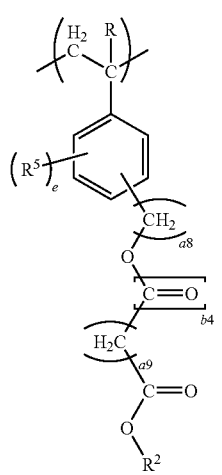
(f1-22)
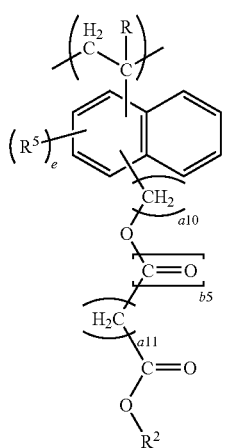
(f1-23)
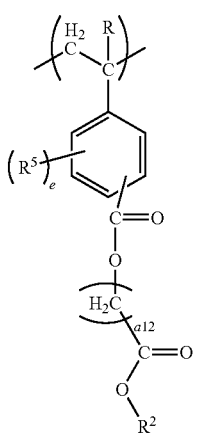
(f1-24)
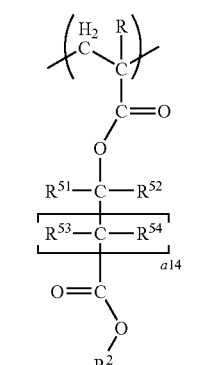
[Chemical Formula 10]
(f1-25)

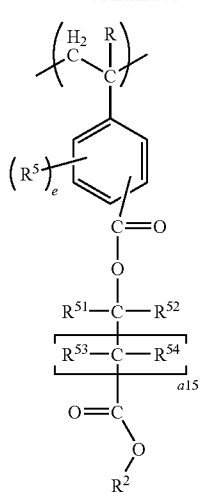

(f1-26)

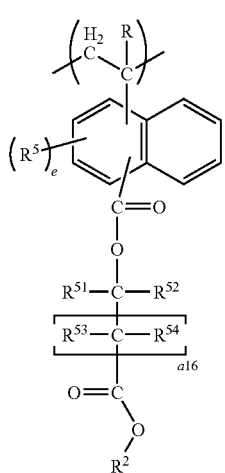

(f1-27)

In general formulas (f1-11) to (f1-14), (f1-21) to (f1-24) and (f1-25) to (f1-27), R and $R^2$ are the same as defined above; each of $R^{51}$ and $R^{52}$ independently represents an alkyl group of 1 to 10 carbon atoms; each of $R^{53}$ and $R^{54}$ independently represents a hydrogen atom or an alkyl group of 1 to 10 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 1 to 5; each of b1 to b5 independently represents 0 or 1; $R^5$ represents a substituent; and e represents an integer of 0 to 2.

In general formulas (f1-11) to (f1-14), (f1-21) to (f1-24) and (f1-25) to (f1-27), as R, a hydrogen atom or a methyl group is preferable.

In general formula (f1-11), a1 is preferably an integer of 1 to 3, more preferably 1 or 2.

In general formula (f1-12), it is preferable that each of a2 and a3 independently represent an integer of 1 to 3, more preferably 1 or 2.

In general formula (f1-13), a4 is preferably an integer of 0 to 3, more preferably an integer of 0 to 2, and most preferably 0 or 1.

a5 is preferably an integer of 1 to 3, and more preferably 1 or 2.

Examples of the substituent for $R^5$ include a halogen atom, a lower alkyl group, an alkoxy group of 1 to 5 carbon atoms, a halogenated lower alkyl group, or an oxygen atom (=O).

As the lower alkyl group, the same lower alkyl groups as those described above for R can be mentioned. Examples of halogen atoms include a fluorine atom, a chlorine atom, an iodine atom and a bromine atom. As the halogenated lower alkyl group, the same halogenated lower alkyl groups as those described above for R can be mentioned.

e is preferably 0 or 1, and most preferably 0 from an industrial viewpoint.

b2 is preferably 0.

In general formula (f1-14), a6 is preferably an integer of 0 to 3, more preferably an integer of 0 to 2, and most preferably 0 or 1.

a7 is preferably an integer of 1 to 3, and more preferably 1 or 2.

b3 is preferably 0.

$R^5$ and e are as defined above.

In general formula (f1-21), a8 is preferably an integer of 0 to 3, more preferably an integer of 0 to 2, and most preferably 0 or 1.

a9 is preferably an integer of 1 to 3, and more preferably 1 or 2.

b4 is preferably 0.

$R^5$ and e are as defined above.

In general formula (f1-22), a10 is preferably an integer of 0 to 3, more preferably an integer of 0 to 2, and most preferably 0 or 1.

a11 is preferably an integer of 1 to 3, and more preferably 1 or 2.

b5 is preferably 0.

$R^5$ and e are as defined above.

In general formula (f1-23), a12 is preferably an integer of 1 to 3, more preferably 1 or 2.

$R^5$ and e are as defined above.

In general formula (f1-24), a13 is preferably an integer of 1 to 3, more preferably 1 or 2.

$R^5$ and e are as defined above.

In general formulas (f1-25) to (f1-27), it is preferable that each of a14, a15 and a16 independently represent 0 to 3, more preferably 0 to 2, and most preferably 0 or 1.

It is preferable that each of $R^{51}$ and $R^{52}$ independently represent a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-amyl group, a cyclopentyl group, a cyclohexyl group, a cyclooctyl group, a norbornyl group, an isobornyl group, a tricyclodecanyl group, an adamantyl group and a tetracyclododecanyl group. Of these, an alkyl group of 1 to 6 carbon atoms is preferable, more preferably an alkyl group of 1 to 4 carbon atoms, and most preferably a methyl group or an ethyl group.

It is preferable that each of $R^{53}$ and $R^{54}$ independently represent a hydrogen atom or a linear, branched or cyclic alkyl group of 1 to 10 carbon atoms. For $R^{53}$ and $R^{54}$, the linear, branched or cyclic alkyl group of 1 to 10 carbon atoms is as defined above for $R^{51}$ and $R^{52}$.

In general formulas (f1-26) and (f1-27), $R^5$ and e are as defined above.

Specific examples of structural units represented by general formulas (f1-11) to (f1-14) and (f1-21) to (f1-27) are shown below.
[Chemical Formula 11]
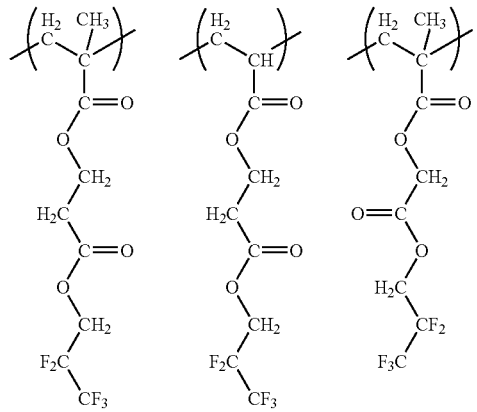
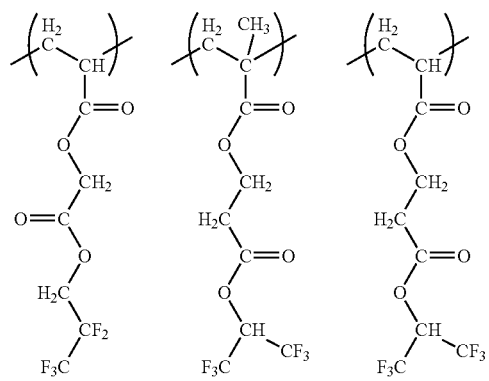
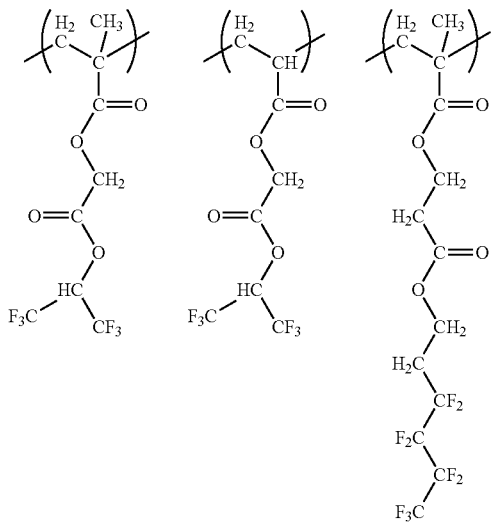
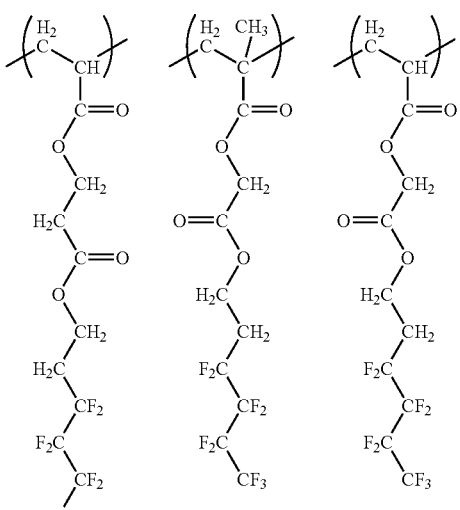
[Chemical Formula 12]
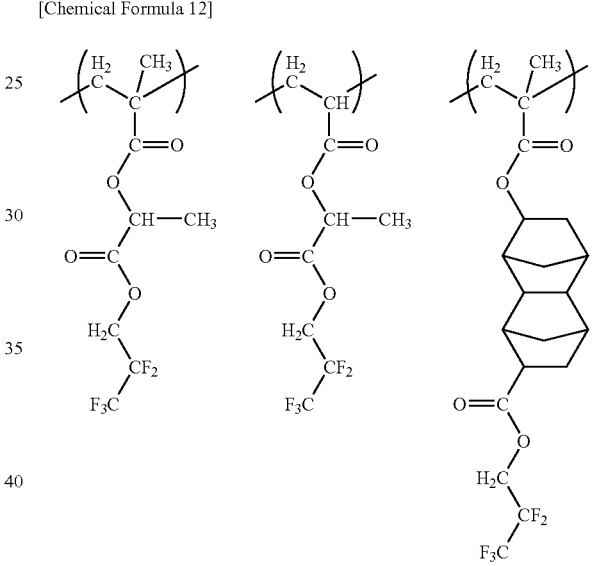

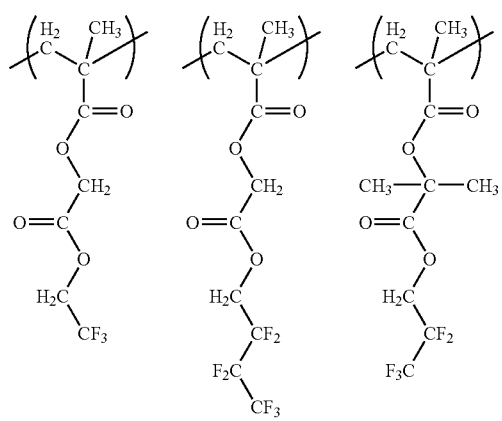
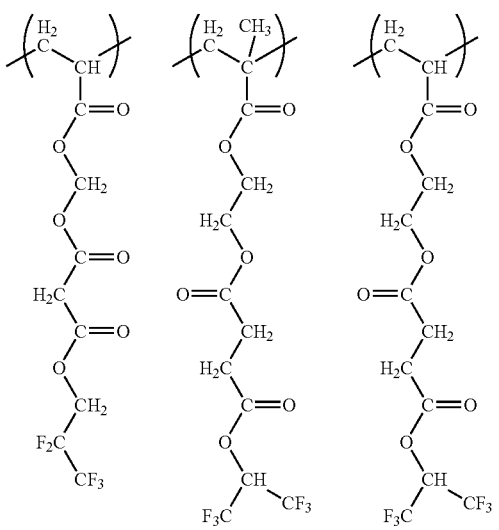
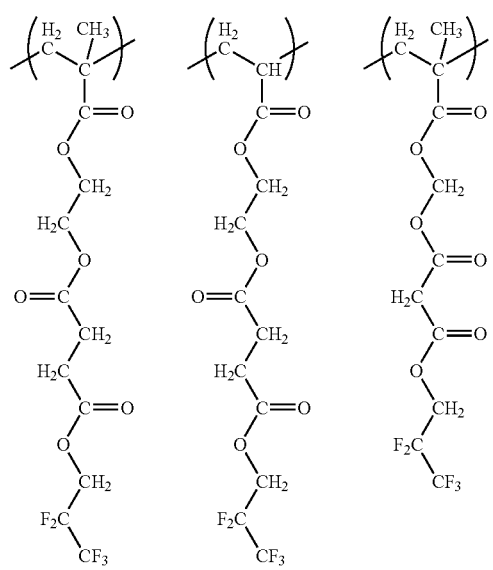
[Chemical Formula 13]

21
-continued
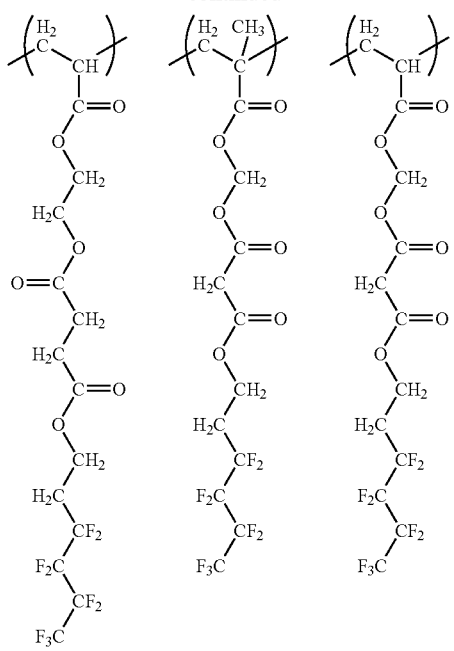
[Chemical Formula 14]
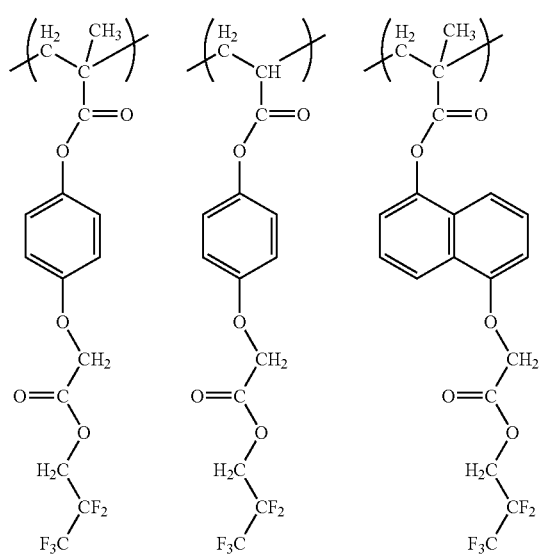
22
-continued
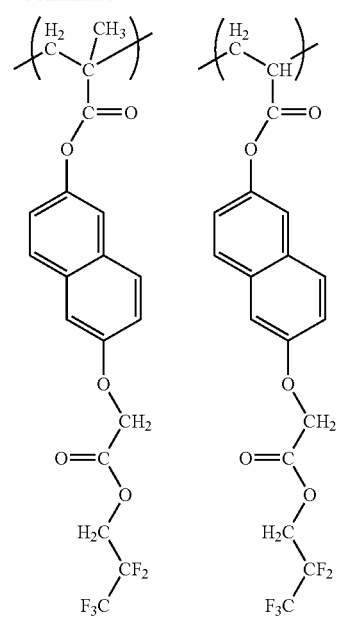

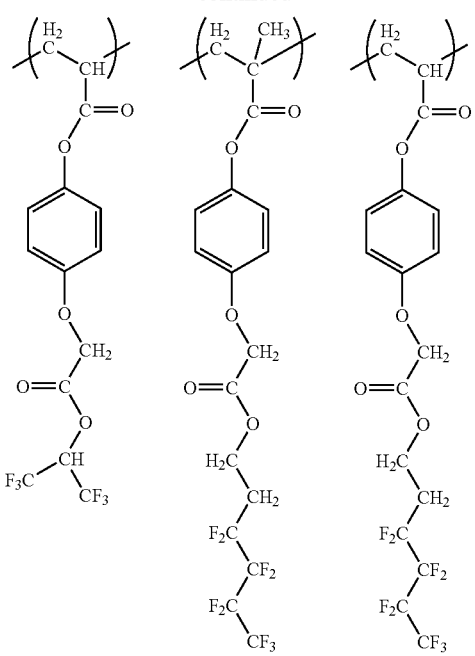
[Chemical Formula 15]
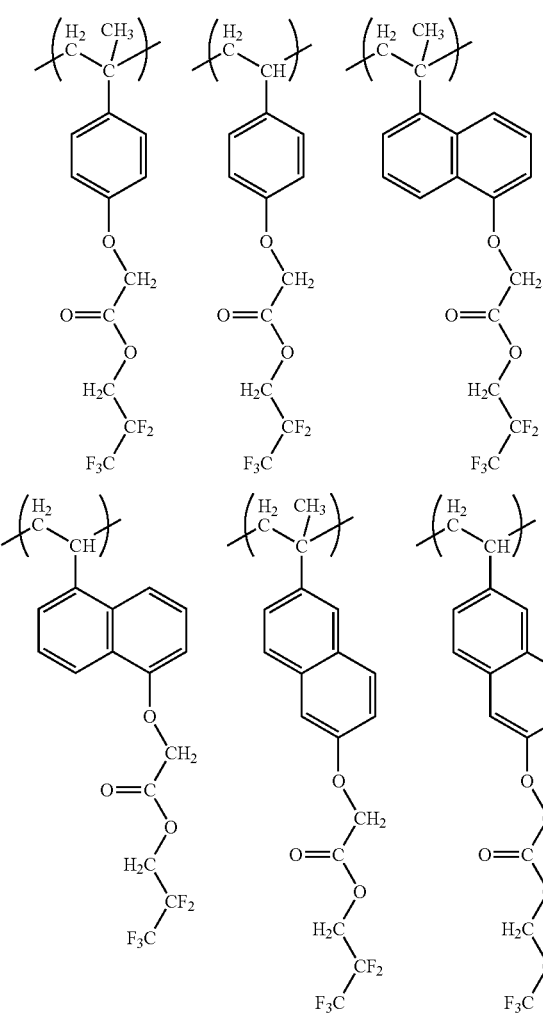
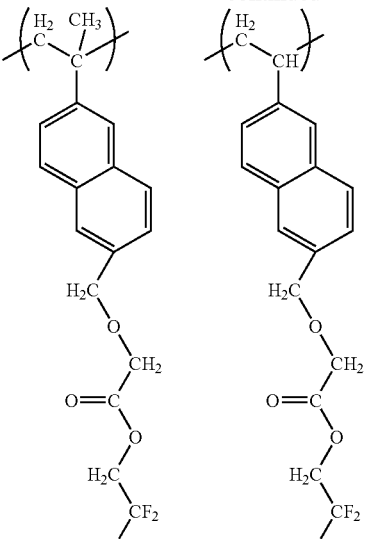
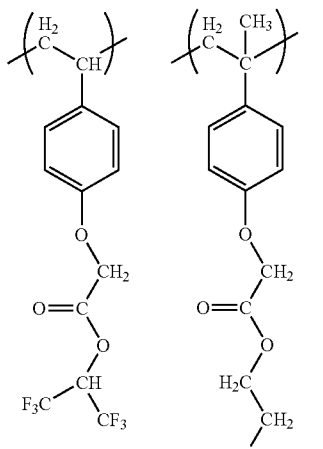
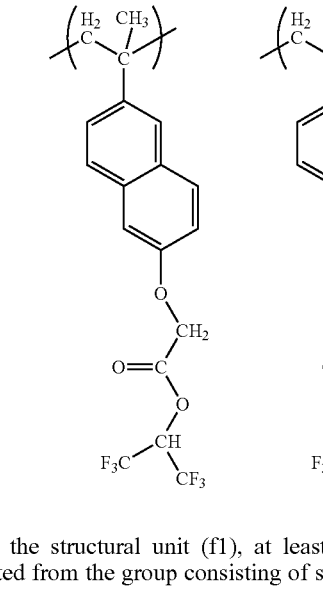
As the structural unit (f1), at least one structural unit selected from the group consisting of structural units represented by general formulas (f1-11) to (f1-14) and (f1-21) to (f1-24) is preferable, more preferably at least one structural unit selected from the group consisting of structural units represented by general formulas (f1-11) to (f1-13), (f1-21) and (f1-22), and most preferably at least one structural unit selected from the group consisting of structural units represented by general formulas (f1-11) and (f1-22).

In the component (F), as the structural unit (f1), one type of structural unit may be used, or two or more types may be used in combination.

In the component (F), the amount of the structural unit (f1) based on the combined total of all structural units constituting the component (F) is preferably 10 to 90 mol %, more preferably 20 to 80 mol %, still more preferably 30 to 80 mol %, and most preferably 40 to 80 mol %. When the amount of the structural unit (f1) is at least as large as the lower limit of the above-mentioned range, during resist pattern formation, the characteristic feature of exhibiting hydrophobicity during immersion exposure and becoming hydrophilic during alkali developing is improved, the occurrence of defects caused by the reattachment of alkali-insoluble materials within the resist film on the surface of a resist pattern can be reduced, and the water tracking ability during immersion exposure using a scanning-type immersion exposure apparatus can be improved. On the other hand, when the amount of the structural unit (f1) is no more than the upper limit of the above-mentioned range, a good balance can be achieved with the structural unit (f2), and the occurrence of defects due to immersion exposure using a scanning-type immersion exposure apparatus can be suppressed.

[Structural Unit (f2)]

The structural unit (f2) is represented by general formula (f2-1).

In general formula (f2-1), R represents a hydrogen atom, a lower alkyl group or a halogenated lower alkyl group. R in general formula (f2-1) is as defined above for R in general formula (f1-1) or (f1-2).

W is a group represented by any one of general formulas (w-1) to (w-4).

In general formula (w-1), $R^{21}$ represents an alkyl group of 2 or more carbon atoms, and $R^{22}$ and $R^{23}$ are bonded to each other to form an aliphatic monocyclic group of 7 or more carbon atoms.

The alkyl group for $R^{21}$ may be any of linear, branched or cyclic.

When the alkyl group is linear or branched, an alkyl group of 2 to 5 carbon atoms is preferable, and specific examples of alkyl groups include an ethyl group, a propyl group, an isopropyl group, an n-butyl group, an isobutyl group, a tert-butyl group, a pentyl group, an isopentyl group and a neopentyl group. Among these examples, an ethyl group or a propyl group is more preferable, and an ethyl group is the most preferable.

When the alkyl group is cyclic, an alkyl group of 4 to 15 carbon atoms is preferable, more preferably 4 to 12 carbon atoms, and most preferably 5 to 10 carbon atoms. Specific examples thereof include groups in which one hydrogen atom has been removed from a monocycloalkane; and groups in which one hydrogen atom has been removed from a polycycloalkane such as a bicycloalkane, a tricycloalkane, or a tetracycloalkane. Specific examples include groups in which one hydrogen atom has been removed from a monocycloalkane such as cyclopentane and cyclohexane; and groups in which one hydrogen atom has been removed from a polycycloalkane such as adamantane, norbornane, isobornane, tricyclodecane or tetracyclododecane.

$R^{21}$ is preferably a linear or branched alkyl group.

In general formula (w-1), $R^{22}$ and $R^{23}$ are bonded to each other and, together with the carbon atom to which $R^{22}$ and $R^{23}$ are bonded, form an aliphatic monocyclic group of 7 or more carbon atoms.

The number of carbon atoms within the aliphatic monocyclic group is preferably no less than 8. Further, the number of carbon atoms within the aliphatic monocyclic group is preferably no more than 12, more preferably no more than 10, and still more preferably no more than 9.

The aliphatic cyclic group may be either saturated or unsaturated, but is preferably saturated. The aliphatic cyclic group may also be a hydrocarbon group composed solely of carbon and hydrogen atoms, or may include other atoms (hetero atoms such as an oxygen atom, a nitrogen atom and a sulfur atom), but is preferably a hydrocarbon group.

The aliphatic cyclic group may have a substituent. Examples of the substituent include an alkyl group of 1 to 5 carbon atoms, a fluorine atom, a fluorinated alkyl group of 1 to 5 carbon atoms, and an oxygen atom (=O).

Specifically, as a preferable example of the group represented by general formula (w-1), groups shown below can be mentioned.

[Chemical Formula 16]

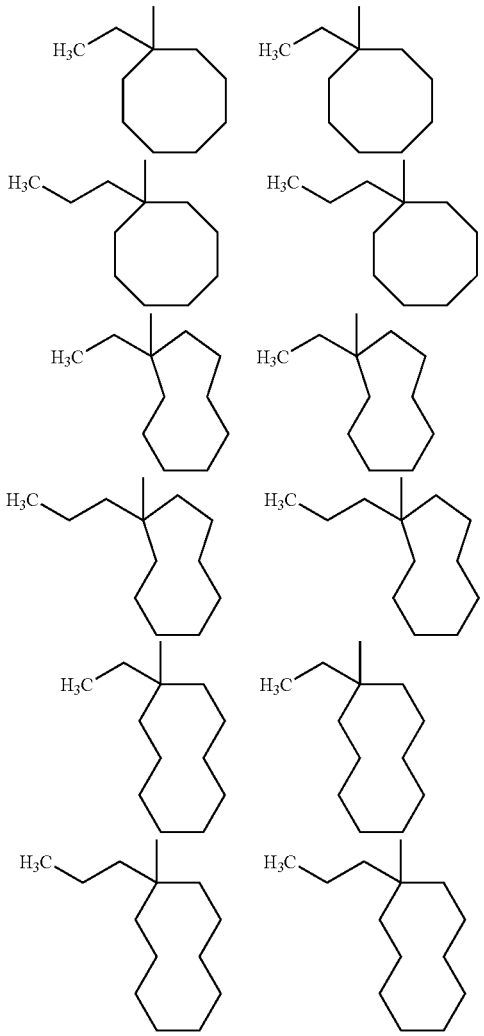

In general formula (w-2), $R^{24}$ represents a branched alkyl group of 3 or more carbon atoms, and $R^{25}$ and $R^{26}$ are bonded to each other to form an aliphatic cyclic group.

The alkyl group for $R^{24}$ preferably has 3 to 10 carbon atoms, and more preferably 3 to 5 carbon atoms. Specific examples of alkyl groups include an isopropyl group, an isobutyl group, a tert-butyl group, an isopentyl group and a neopentyl group, and an isopropyl group is particularly desirable.

In general formula (w-2), $R^{25}$ and $R^{26}$ are bonded to each other and, together with the carbon atom to which $R^{25}$ and $R^{26}$ are bonded, form an aliphatic cyclic group.

The aliphatic cyclic group may be either a monocyclic group or a polycyclic group.

The aliphatic cyclic group may be either saturated or unsaturated, but is preferably saturated. The aliphatic cyclic group may also be a hydrocarbon group composed solely of carbon and hydrogen atoms, or may include other atoms (hetero atoms such as an oxygen atom, a nitrogen atom and a sulfur atom), but is preferably a hydrocarbon group.

The number of carbon atoms within the aliphatic cyclic group is preferably within a range from 4 to 15, more preferably from 4 to 12, and most preferably from 5 to 10.

Specific examples of the aliphatic cyclic group include groups in which one hydrogen atom has been removed from a monocycloalkane; and groups in which one hydrogen atom has been removed from a polycycloalkane such as a bicycloalkane, a tricycloalkane, or a tetracycloalkane. Specific examples include groups in which one hydrogen atom has been removed from a monocycloalkane such as cyclopentane and cyclohexane; and groups in which one hydrogen atom has been removed from a polycycloalkane such as adamantane, norbornane, isobornane, tricyclodecane or tetracyclododecane.

The aliphatic cyclic group may have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

Specifically, as a preferable example of the group represented by general formula (w-2), groups shown below can be mentioned.

[Chemical Formula 17]

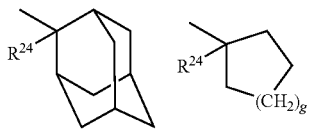

In the formula, $R^{24}$ is the same as defined above, and g is an integer of 0 to 3.

g is preferably an integer of 1 to 3, and more preferably 1 or 2.

In general formula (w-3), $R^{27}$ represents an acid dissociable, dissolution inhibiting group, and $R^{28}$ represents a divalent linking group.

When the component (F) is blended with the component (B) for a resist composition, the acid dissociable, dissolution inhibiting group for $R^{27}$ exhibits acid dissociability so as to be dissociated by action of acid generated from the component (B) upon exposure, and an alkali dissolution-inhibiting effect that renders the component (F) insoluble in an alkali developing solution prior to dissociation.

As the acid dissociable, dissolution inhibiting group for $R^{27}$, there is no particular limitation, and any of the groups that have been proposed as acid dissociable, dissolution inhibiting groups for the base resins of chemically amplified resists can be used. Specifically, as the acid dissociable, dissolution inhibiting group, the same as the acid dissociable, dissolution inhibiting group included in the structural unit (a1) in the component (A) described later can be mentioned.

As the divalent linking group for $R^{28}$, the same divalent linking group as those described above for X in general formula (f1-1) can be mentioned.

In the present invention, as the divalent linkage group for $R^{28}$, an alkylene group, a divalent aliphatic cyclic group, or a divalent linking group containing a hetero atom is preferable.

When $R^{28}$ represents an alkylene group, it preferably has 1 to 10 carbon atoms, more preferably 1 to 6 carbon atoms, still more preferably 1 to 4 carbon atoms, and most preferably 1 to 3 carbon atoms.

When $R^{28}$ represents a divalent aliphatic cyclic group, as the aliphatic cyclic group, the same as those mentioned above in connection with the explanation of "aliphatic cyclic group" in general formula (w-2) above can be used, except that two or more hydrogen atoms have been removed therefrom. It is particularly desirable that the aliphatic cyclic group be a group in which two or more hydrogen atoms have been removed from cyclopentane, cyclohexane, norbornane, isobornane, adamantane, tricyclodecane or tetracyclododecane.

When $R^{28}$ represents a divalent linking group containing a hetero atom, examples of the divalent linking groups containing a hetero atom include —O—, —C(=O)—O—, —C(=O)—, —O—C(=O)—O—, —C(=O)—NH—, —NH— (in the formula, the H may be replaced with a substituent such as an alkyl group or an acyl group), —S—, —S(=O)$_2$—, —S(=O)$_2$—O—, a group represented by formula -A-O-B-, and a group represented by formula -[A-C(=O)—O]$_m$-B-. Here, each of A and B independently represents a divalent hydrocarbon group which may have a substituent, and m represents an integer of 0 to 3.

When $R^{28}$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $R^{28}$ is a group represented by formula -A-O-B- or a group represented by formula -[A-C(=O)—O]$_m$-B-, each of A and B independently represents a divalent hydrocarbon group which may have a substituent.

m is an integer of 0 to 3, preferably an integer of 0 to 2, more preferably 0 or 1, and most preferably 1.

The hydrocarbon group represented by A may be either an aliphatic hydrocarbon group or an aromatic hydrocarbon group. An aliphatic hydrocarbon group refers to a hydrocarbon group having no aromaticity.

The aliphatic hydrocarbon group represented by A may be either saturated or unsaturated, but in general, the aliphatic hydrocarbon group is preferably saturated. More specific examples of the aliphatic hydrocarbon group represented by A include linear or branched aliphatic hydrocarbon groups, and aliphatic hydrocarbon groups that contain a ring within their structures.

In the "linear or branched aliphatic hydrocarbon group" represented by A, the number of carbon atoms is preferably within a range from 1 to 10, more preferably from 1 to 8, even more preferably from 1 to 5, and is most preferably 1 or 2.

As the linear aliphatic hydrocarbon group, linear alkylene groups are preferred, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. The alkyl groups within these alkylalkylene groups are preferably linear alkyl groups of 1 to 5 carbon atoms.

The linear aliphatic hydrocarbon groups may or may not have a substituent. Examples of the substituent include a fluorine atom, a fluorinated lower alkyl group of 1 to 5 carbon atoms which is substituted by a fluorine atom, and an oxygen atom (=O).

Examples of the "aliphatic hydrocarbon groups that contain a ring within their structures" represented by A include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an abovementioned linear aliphatic hydrocarbon group or interposed within the linear aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon groups may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

The group A is preferably a linear aliphatic hydrocarbon group, more preferably a linear alkylene group, still more preferably a linear alkylene group of 1 to 5 carbon atoms, still more preferably a methyl group or an ethyl group, and most preferably an ethyl group.

Examples of the hydrocarbon group represented by B include the same divalent hydrocarbon groups as those mentioned above in relation to the hydrocarbon group represented by A.

As the group B, a linear or branched aliphatic hydrocarbon group is preferred, and a methylene group, an ethylene group or an alkylmethylene group is particularly desirable.

The alkyl group within the alkylmethylene group is preferably a linear alkyl group of 1 to 5 carbon atoms, is more preferably a linear alkyl group of 1 to 3 carbon atoms, and is most preferably a methyl group.

Further, in the group represented by formula -[A-C(=O)—O]$_m$-B-, m is an integer of 0 to 3, preferably an integer of 0 to 2, more preferably 0 or 1, and most preferably 1.

In the present invention, as the divalent linking group for R$^{28}$, a divalent linking group containing a hetero atom is preferable, and a linear group having an oxygen atom as a hetero atom, for example, a group that includes an ester bond is particularly desirable.

Of these divalent linking groups, groups represented by the aforementioned formula -A-O-B- or formula -A-C(=O)—O-B- are preferable, and a group represented by formula —(CH$_2$)$_a$—C(=O)—O—(CH$_2$)$_b$— is particularly desirable.

a represents an integer of 1 to 5, is preferably 1 or 2, and is most preferably 2.

b represents an integer of 1 to 5, is preferably 1 or 2, and is most preferably 1.

In general formula (w-4), R$^{29}$ represents a linear or branched alkyl group or an aliphatic cyclic group.

When R$^{29}$ represents a linear or branched alkyl group, it is preferably an alkyl group of 1 to 15 carbon atoms, more preferably an alkyl group of 1 to 5 carbon atoms, still more preferably an ethyl group or a methyl group, and most preferably an ethyl group.

When R$^{29}$ represents an aliphatic cyclic group, as the aliphatic cyclic group, any of the aliphatic monocyclic/polycyclic groups which have been proposed for conventional ArF resists and the like can be appropriately selected for use. For example, the same groups described above in connection with the "aliphatic cyclic group" can be mentioned.

The aliphatic cyclic group for R$^{29}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (w-4), n is an integer of 0 to 3, preferably an integer of 0 to 2, more preferably 0 or 1, and most preferably 0.

R$^{30}$ and R$^{30'}$ each independently represent a linear or branched alkyl group or a hydrogen atom.

As the linear or branched alkyl group for R$^{30}$ and R$^{30'}$, a lower alkyl group is preferable. As the lower alkyl group, the same as the lower alkyl groups for R above can be mentioned, and a methyl group or ethyl group is preferable, and a methyl group is particularly desirable.

In the present invention, it is preferable that at least one of R$^{30}$ and R$^{30'}$ be a hydrogen atom.

Further, in general formula (w-4), R$^{29}$ and R$^{30}$ may be bonded to each other to form an aliphatic cyclic group.

In such a case, an aliphatic cyclic group is formed by R$^{29}$, R$^{30}$, —O—(CH$_2$)$_n$— and the carbon atom having R$^{30}$ bonded thereto. Such an aliphatic cyclic group is preferably a 4 to 7-membered ring, and more preferably a 4 to 6-membered ring. Specific examples of the aliphatic cyclic group include a tetrahydropyranyl group and a tetrahydrofuranyl group.

Specifically, as a preferable example of the group represented by general formula (w-4), groups represented by formulas (w-1) to (w-4-12) shown below can be mentioned.

[Chemical Formula 18]

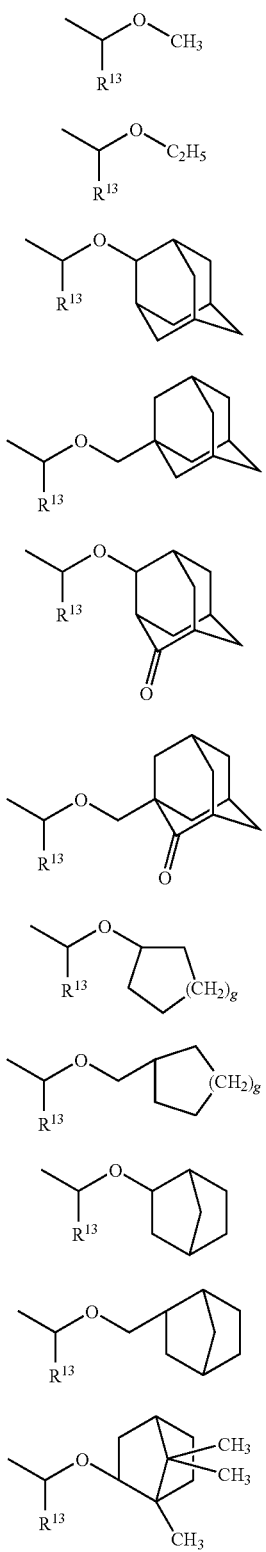

(w-4-1)
(w-4-2)
(w-4-3)
(w-4-4)
(w-4-5)
(w-4-6)
(w-4-7)
(w-4-8)
(w-4-9)
(w-4-10)
(w-4-11)

-continued

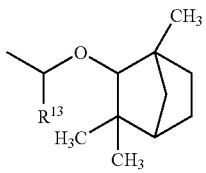

(w-4-12)

In the formulas, $R^{13}$ represents a hydrogen atom or a methyl group, and g is as defined above.

In the component (F), as the structural unit (f2), one type of structural unit may be used alone, or two or more types of structural units may be used in combination.

In the component (F), the amount of the structural unit (f2) based on the combined total of all structural units constituting the component (F) is preferably 5 to 80 mol %, more preferably 10 to 60 mol %, still more preferably 15 to 50 mol %, and most preferably 20 to 40 mol %. When the amount of the structural unit (f2) is at least as large as the lower limit of the above-mentioned range, the characteristic feature of exhibiting hydrophobicity during immersion exposure, but then exhibiting increased hydrophilicity during exposure and post exposure baking (PEB) is improved. Moreover, formation of bridge-type defects in a line and space pattern or formation of "Not Open" defects in which a portion of, or all of, a contact hole pattern is not open can be suppressed. Furthermore, the proportion of hydrocarbon groups within the component (F) increases and the water tracking ability during immersion exposure using a scanning-type immersion exposure apparatus is improved. On the other hand, when the amount of the structural unit (f2) is no more than the upper limit of the above-mentioned range, a good balance can be achieved with the structural unit (f1), and the effects of the present invention are improved.

[Other Structural Unit]

The component (F) may include a structural unit other than the structural unit (f1) and the structural unit (f2) (hereafter, frequently referred to as "structural unit (f3)"), as long as the effects of the present invention are not impaired.

There are no particular limitations on the structural unit (f3), provided the structural unit is derived from a compound that is copolymerizable with the compound that gives rise to the structural unit (f1) and the compound that gives rise to the structural unit (f2). Examples of such structural units include structural units which have been proposed for the base resin of a conventional chemically amplified resist (such as the structural units (a1) to (a4) described later).

In the present invention, the component (F) is preferably a copolymer including the structural unit (f1) as well as the structural unit (f2). Examples of such copolymers include a copolymer consisting of the structural unit (f1) and the structural unit (f2); and a copolymer consisting of the structural unit (f1), the structural unit (f2) and the structural unit (f3).

In the present invention, the component (F) is preferably a copolymer consisting of the structural unit (f1) and the structural unit (f2).

The weight average molecular weight (Mw) (the polystyrene equivalent value determined by gel permeation chromatography) of the component (F) is not particularly limited, but is preferably 2,000 to 50,000, more preferably 3,000 to 30,000, and most preferably 4,000 to 25,000. When the weight average molecular weight is no more than the upper limit of the above-mentioned range, the component (F) exhibits satisfactory solubility in a resist solvent when used for a resist. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Mn represents the number average molecular weight.

The component (F) can be produced, for example, by a conventional radical polymerization or the like of the monomers corresponding with each of the structural units that constitute the component (F), using a radical polymerization initiator such as azobisisobutyronitrile (AIBN) or dimethyl 2,2'-azobis(2-methylpropionate) (V-601).

Examples of the monomers that give rise to the structural unit (f2) include compounds represented by $CH_2=C(R)-C(=O)-O-W$ (in the formula, R and W are the same as defined above), and as such compounds, commercially available compounds can be used.

Examples of the monomers that give rise to the structural unit (f1) include compounds in which a base dissociable group and a polymerizable group are bonded via a divalent linking group.

A "polymerizable group" refers to a group that renders a compound having the group polymerizable by a radical polymerization or the like, and examples of the polymerizable groups include groups containing an ethylenic double bond. Examples of the groups containing an ethylenic double bond include a group represented by $CH_2=CR-$ (in the formula, R is the same as defined above).

Examples of the divalent linking groups include a group represented by the formula $-A_{aryl}-X_{01}-$ (in the formula, $A_{aryl}$ and $X_{01}$ are the same as defined above) and a group represented by the formula $-C(=O)-O-X-$ (in the formula, X is the same as defined above).

Examples of the monomers that give rise to a structural unit represented by general formula (f1-1) above include a fluorine-containing compound represented by general formula (f0-1) shown below, and examples of the monomers that give rise to a structural unit represented by general formula (f1-2) above include a fluorine-containing compound represented by general formula (f0-2) shown below.

[Chemical Formula 19]

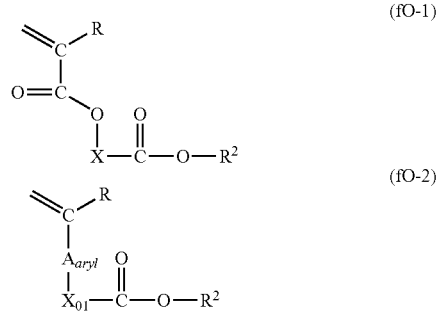

In general formulas (f0-1) and (f0-2), R, X, $A_{aryl}$, $X_{01}$ and $R^2$ are the same as defined above.

A fluorine-containing compound represented by general formula (f0-1) or (f0-2) (hereafter, frequently referred to as "fluorine-containing compound (F0)") can be produced, for example, by introducing the $R^2$ group ($R^2$ is as defined above) into the carboxy group of a compound represented by general formula (w-0) or (f0-2-0) shown below (hereafter, collectively referred to as "compound (V-1)") (i.e., substituting the hydrogen atom at the terminal of the caboxy group with the $R^2$ group).

The $R^2$ group can be introduced by a conventional method. For example, a compound (V-1) can be reacted with a compound (V-2) represented by general formula (V-2) shown below, to thereby obtain a fluorine-containing compound (F0).

[Chemical Formula 20]

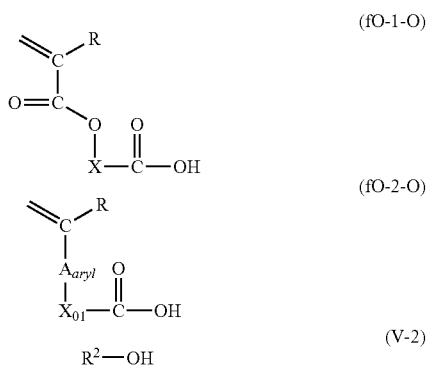

In the formulas, R, X, $A_{aryl}$, $X_{01}$ and $R^2$ are the same as defined above.

The method of reacting a compound (V-1) with a compound (V-2) is not particularly limited. For example, a method in which a compound (V-1) comes in contact with a compound (V-2) in a reaction solvent in the presence of a base can be used.

As a compound (V-1) and a compound (V-2), commercially available compounds can be used. Alternatively, a compound (V-1) and a compound (V-2) can be synthesized.

As a compound (V-1), for example, a low molecular weight compound derived from an acrylate ester such as a carboxyalkyl (meth)acrylate or a mono((meth)acryloyloxyalkyl) succinate, or a polymeric compound including a structural unit derived from an acrylate ester can be used.

As a compound (V-2), for example, a fluorinated alkylalcohol or the like can be used.

As the reaction solvent, any solvent capable of dissolving a compound (V-1) and a compound (V-2) (which are raw materials) can be used. Specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

Examples of condensing agents include carbodiimide reagents such as ethyldiisopropylaminocarbodiimide (EDCI) hydrochloride, dicyclohexylcarboxyimide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids may be used alone, or in a combination of two or more.

The amount added of the compound (V-2) relative to the compound (V-1) is preferably within a range from 1 to 3 equivalents, and more preferably from 1 to 2 equivalents.

The reaction temperature is preferably within a range from −20 to 40° C., and more preferably from 0 to 30° C.

The reaction time varies depending on factors such as the reactivity of the compound (V-1) and the compound (V-2) and the reaction temperature. However, in general, the reaction time is preferably within a range from 30 to 480 minutes, and more preferably from 60 to 360 minutes.

In the resist composition for immersion exposure according to the present invention, the amount of the component (F) relative to 100 parts by weight of the component (A) is preferably 0.1 to 50 parts by weight, more preferably 0.1 to 40 parts by weight, still more preferably 0.5 to 30 parts by weight, and most preferably 1 to 15 parts by weight. When the amount of the component (F) is at least as large as the lower limit of the above-mentioned range, the hydrophobicity of a resist film formed using the resist composition for immersion exposure is enhanced, which is preferable in immersion exposure. On the other hand, when the amount of the component (F) is no more than the upper limit of the above-mentioned range, the lithography properties are improved.

<Component (A)>

As the component (A), either a single organic compound typically used as a base component for a chemically amplified resist, or a mixture of two or more such organic compounds, may be used.

The term "base component" refers to an organic compound capable of forming a film, and preferably refers to an organic compound having a molecular weight of 500 or more. When the organic compound has a molecular weight of 500 or more, the film-forming ability is improved, and a nano level resist pattern can be readily formed. The organic compounds having a molecular weight of 500 or more that may be used as the base component are broadly classified into low molecular weight organic compounds having a molecular weight of 500 to less than 2,000 (namely, "low molecular weight materials") and high molecular weight organic compounds having a molecular weight of 2,000 or more (namely, "polymeric materials"). Generally, a non-polymer is used as the low molecular weight material. A resin (a polymer or copolymer) is used as the polymeric material. The "molecular weight" of the resin refers to the polystyrene equivalent weight average molecular weight determined by GPC (gel permeation chromatography). Hereafter, the simplified term "resin" refers to a resin having a molecular weight of 2,000 or more.

The component (A) may be a resin that exhibits changed alkali solubility under the action of acid, a low molecular weight material that exhibits changed alkali solubility under the action of acid, or a combination of these materials.

In those cases where the resist composition for immersion exposure according to the present invention is a negative resist composition, a base component that is soluble in an alkali developing solution is used as the component (A), and a cross-linker is blended into the negative resist composition.

In the negative resist composition, when acid is generated from the component (B) upon exposure, the action of this acid causes cross-linking between the base component and the cross-linker, rendering the composition substantially insoluble in an alkali developing solution. As a result, during resist pattern formation, when a resist film obtained by applying the negative resist composition to a substrate is selectively exposed, the exposed portions of the resist become insoluble in an alkali developing solution, whereas the unexposed portions remain soluble in the alkali developing solution, meaning a resist pattern can be formed by alkali developing.

In those cases where the resist composition for immersion exposure according to the present invention is a negative resist composition, as the component (A), a resin that is soluble in an alkali developing solution (hereafter frequently referred to as an "alkali-soluble resin") is usually used.

As the alkali-soluble resin, it is preferable to use a resin having structural units derived from at least one of an α-(hydroxyalkyl)acrylic acid and a lower alkyl ester of an α-(hydroxyalkyl)acrylic acid, as such resins enable the formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linker, typically, an amino-based cross-linker such as a glycoluril having a methylol group or alkoxymethyl group is preferable, as it enables the formation of a resist pattern with minimal swelling. The amount of the cross-linker added is preferably within a range from 1 to 50 parts by weight, relative to 100 parts by weight of the alkali-soluble resin.

When the resist composition for immersion exposure according to the present invention is a positive resist composition, as the component (A), a base component that exhibits increased solubility in an alkali developing solution under the action of acid is used. More specifically, the component (A) is substantially insoluble in an alkali developing solution prior to exposure, but when acid is generated from the component (B) upon exposure, the action of this acid causes an increase in the solubility of the base component in an alkali developing solution. Accordingly, during resist pattern formation, when a resist film formed by applying the positive resist composition to a substrate is selectively exposed, the exposed portions change from being substantially insoluble in an alkali developing solution to being alkali-soluble, whereas the unexposed portions remain alkali-insoluble, meaning a resist pattern can be formed by alkali developing.

The resist composition of the present invention is preferably a positive resist composition. Namely, in the resist composition of the present invention, the component (A) is preferably a base component that exhibits increased solubility in an alkali developing solution under the action of acid.

The component (A) may be a resin component (A1) that exhibits increased solubility in an alkali developing solution under the action of acid (hereafter, frequently referred to as "component (A1)"), a low molecular weight material (A2) that exhibits increased solubility in an alkali developing solution under the action of acid (hereafter, frequently referred to as "component (A2)"), or a mixture thereof. In the present invention, the component (A1) is particularly desirable.

[Component (A1)]

As the component (A1), either a single resin component (base resin) typically used as a base component for a chemically amplified resist, or a mixture of two or more such resin components, may be used.

In the present invention, as the component (A1), a resin containing a structural unit derived from an acrylate ester is preferred.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

In the acrylate ester, specific examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group and neopentyl group.

Further, specific examples of the halogenated lower alkyl group include groups in which part or all of the hydrogen atoms of the aforementioned "lower alkyl group for the substituent at the α-position" are substituted with halogen atoms. Examples of the halogen atom include a fluorine atom, a chlorine atom, a bromine atom and an iodine atom, and a fluorine atom is particularly desirable.

In the present invention, it is preferable that a hydrogen atom, a lower alkyl group or a halogenated lower alkyl group, and more preferably a hydrogen atom, a lower alkyl group or a fluorinated lower alkyl group, is bonded to the α-position of the acrylate ester. In terms of industrial availability, a hydrogen atom or a methyl group is the most desirable.

The component (A1) preferably has a structural unit (a1) derived from an acrylate ester containing an acid dissociable, dissolution inhibiting group.

Further, in addition to this structural unit (a1), the component (A1) preferably also has a structural unit (a2) derived from an acrylate ester that contains a lactone-containing cyclic group.

Moreover, in addition to the structural unit (a1), or in addition to the combination of the structural units (a1) and (a2), the component (A1) preferably also has a structural unit (a3) derived from an acrylate ester that contains a polar group-containing aliphatic hydrocarbon group.

The component (A1) may also include a structural unit (a4) which is other than the above-mentioned structural units (a1) to (a3).

—Structural Unit (a1):

The structural unit (a1) is a structural unit derived from an acrylate ester containing an acid dissociable, dissolution inhibiting group.

The acid dissociable, dissolution inhibiting group within the structural unit (a1) has an alkali dissolution inhibiting effect that renders the entire component (A1) insoluble in an alkali developing solution prior to dissociation, and then following dissociation under action of acid, increases the solubility of the entire component (A1) in the alkali developing solution. As the acid dissociable, dissolution inhibiting group within the structural unit (a1), any of the groups that have been proposed as acid dissociable, dissolution inhibiting groups for the base resins of chemically amplified resists can be used. Generally, groups that form either a cyclic or chain-like tertiary alkyl ester with the carboxyl group of (meth) acrylic acid or the like, and acetal-type acid dissociable, dissolution inhibiting groups such as alkoxyalkyl groups are widely known. Here, the term "(meth)acrylic acid" is a generic term that includes either or both of acrylic acid having a hydrogen atom bonded to the α-position and methacrylic acid having a methyl group bonded to the α-position.

A "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom. The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of these tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched acid dissociable, dissolution inhibiting group" is not limited to structures constituted of only carbon atoms and hydrogen atoms (not limited to hydrocarbon groups), but is preferably a hydrocarbon group. Further, the "hydrocarbon group" may be either saturated or unsaturated, but in general, the hydrocarbon group is preferably saturated.

Examples of the aliphatic branched acid dissociable, dissolution inhibiting group include groups represented by a formula —C($R^{71}$)($R^{72}$)($R^{73}$). In this formula, $R^{71}$ to $R^{73}$ each independently represent a linear alkyl group of 1 to 5 carbon atoms. The group represented by —C($R^{71}$)($R^{72}$)($R^{73}$) preferably contains from 4 to 8 carbon atoms, and specific examples include a tert-butyl group, a 2-methyl-2-butyl group, a 2-methyl-2-pentyl group and a 3-methyl-3-pentyl group, and a tert-butyl group is particularly desirable.

The term "aliphatic cyclic group" refers to a monocyclic group or polycyclic group that has no aromaticity.

In the "aliphatic cyclic group-containing acid dissociable, dissolution inhibiting group", the "aliphatic cyclic group" may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

The aliphatic cyclic group may be a hydrocarbon group formed solely from carbon and hydrogen (alicyclic group), or a heterocyclic group in which a portion of the carbon atoms that constitute the ring structure of an alicyclic group have been substituted with a hetero atom such as an oxygen atom, nitrogen atom, or sulfur atom. The aliphatic cyclic group is preferably an alicyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Examples of the aliphatic monocyclic groups include groups in which one or more hydrogen atoms have been removed from a cycloalkane. Specific examples include groups in which one or more hydrogen atoms have been removed from cyclopentane or cyclohexane, and a group in which two hydrogen atoms have been removed from cyclohexane is preferable.

Examples of the aliphatic polycyclic groups include groups in which one or more hydrogen atoms have been removed from a bicycloalkane, tricycloalkane, tetracycloalkane or the like. Specific examples include groups in which one or more hydrogen atoms have been removed from a polycycloalkane such as adamantane, norbornane, isobornane, tricyclodecane or tetracyclododecane. Of these, groups in which two hydrogen atoms have been removed from adamantane, norbornane or tetracyclododecane are preferable in terms of industry. Of these monocyclic and polycyclic groups, a group in which two hydrogen atoms have been removed from adamantane or norbornane is particularly desirable.

Examples of aliphatic cyclic group-containing acid dissociable, dissolution inhibiting groups include (i) groups having a tertiary carbon atom within the ring structure of an aliphatic cyclic group; and (ii) groups having an aliphatic cyclic group, and a branched alkylene group containing a tertiary carbon atom bonded to the aliphatic cyclic group.

Specific examples of the groups (i) include groups represented by general formulas (1-1) to (1-9) shown below.

Specific examples of the groups (ii) include groups represented by general formulas (2-1) to (2-6) shown below.

[Chemical Formula 21]

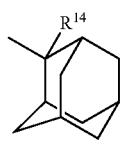
(1-1)

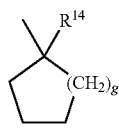
(1-2)

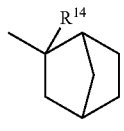
(1-3)

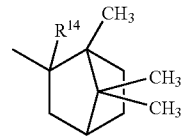
(1-4)

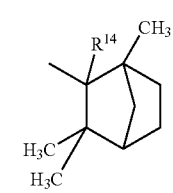
(1-5)

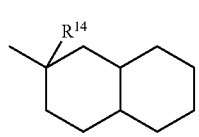
(1-6)

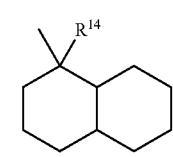
(1-7)

-continued

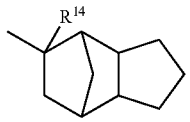
(1-8)

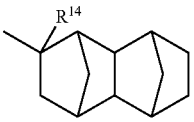
(1-9)

In the formulas, $R^{14}$ represents an alkyl group, and g represents an integer of 0 to 8.

[Chemical Formula 22]

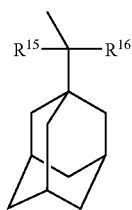
(2-1)

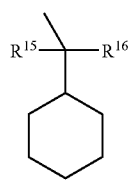
(2-2)

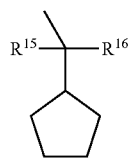
(2-3)

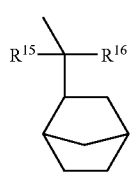
(2-4)

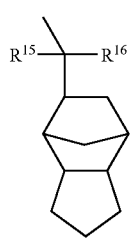
(2-5)

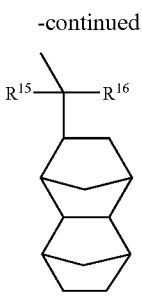

(2-6)

In the formulas, $R^{15}$ and $R^{16}$ each independently represent an alkyl group.

As the alkyl groups of $R^{14}$ to $R^{16}$, lower alkyl groups are preferable, and linear or branched alkyl groups are particularly desirable. Specific examples include a methyl group, an ethyl group, a propyl group, an isopropyl group, an n-butyl group, an isobutyl group, a tert-butyl group, a pentyl group, an isopentyl group and a neopentyl group. Of these, a methyl group, an ethyl group or an n-butyl group is preferable, and a methyl group or an ethyl group is particularly desirable.

In general formula (1-2), g is preferably an integer of 0 to 5, more preferably an integer of 1 to 3, and most preferably 1 or 2.

Specific examples of the acid dissociable, dissolution inhibiting group represented by formula (1-2) include a 1-methyl-1-cyclobutyl group, a 1-ethyl-1-cyclobutyl group, a 1-isopropyl-1-cyclobutyl group, a 1-methyl-1-cyclopentyl group, a 1-ethyl-1-cyclopentyl group, a 1-isopropyl-1-cyclopentyl group, a 1-methyl-1-cyclohexyl group, a 1-ethyl-1-cyclohexyl group, a 1-isopropyl-1-cyclohexyl group, a 1-methyl-1-cycloheptyl group, a 1-ethyl-1-cycloheptyl group, a 1-isopropyl-1-cycloheptyl group, a 1-methyl-1-cyclooctyl group and a 1-ethyl-1-cyclooctyl group.

An "acetal-type acid dissociable, dissolution inhibiting group" generally substitutes a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 23]

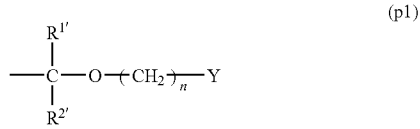

(p1)

In general formula (p1), Y represents a linear or branched alkyl group or an aliphatic cyclic group; n represents an integer of 0 to 3; $R^{1'}$ and $R^{2'}$ each independently represent a linear or branched alkyl group or a hydrogen atom; and Y and $R^{1'}$ may be bonded to each other to form an aliphatic cyclic group.

In general formula (p1) above, Y, n, $R^{1'}$ and $R^{2'}$ are respectively the same as defined for $R^{29}$, n, $R^{30}$ and $R^{30'}$ in general formula (w-4) above.

As the lower alkyl group for $R^{1'}$ and $R^{2'}$, a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) be a group represented by general formula (p1-1) shown below.

[Chemical Formula 24]

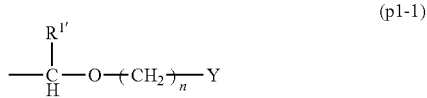

(p1-1)

In general formula (p1-1) $R^{1'}$, n and Y are respectively the same as defined above.

As the structural unit (a1), it is preferable to use at least one member selected from the group consisting of structural units represented by formula (a1-0-1) shown below and structural units represented by formula (a1-0-2) shown below.

[Chemical Formula 25]

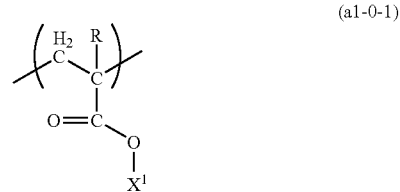

(a1-0-1)

In the formula, R represents a hydrogen atom, a lower alkyl group or a halogenated lower alkyl group; and $X^1$ represents an acid dissociable, dissolution inhibiting group.

[Chemical Formula 26]

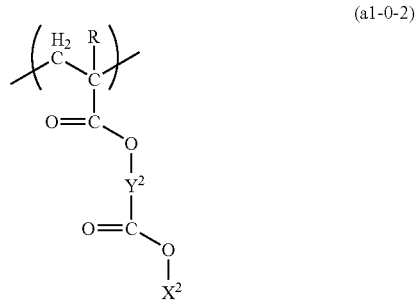

(a1-0-2)

In the formula, R represents a hydrogen atom, a lower alkyl group or a halogenated lower alkyl group; $X^2$ represents an acid dissociable, dissolution inhibiting group; and $Y^2$ represents a divalent linking group.

In general formula (a1-0-1) shown above, the lower alkyl group and halogenated lower alkyl group for R are the same as the lower alkyl group and halogenated lower alkyl group which may be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

Examples of the divalent linking group represented by $Y^2$ include the same groups as those mentioned above in relation to the divalent linking group represented by $R^{28}$ in formula (w-3) for the structural unit (f2) in the abovementioned component (F).

Specific examples of the structural unit (a1) include structural units represented by general formulas (a1-1) to (a1-4) shown below.

[Chemical Formula 27]

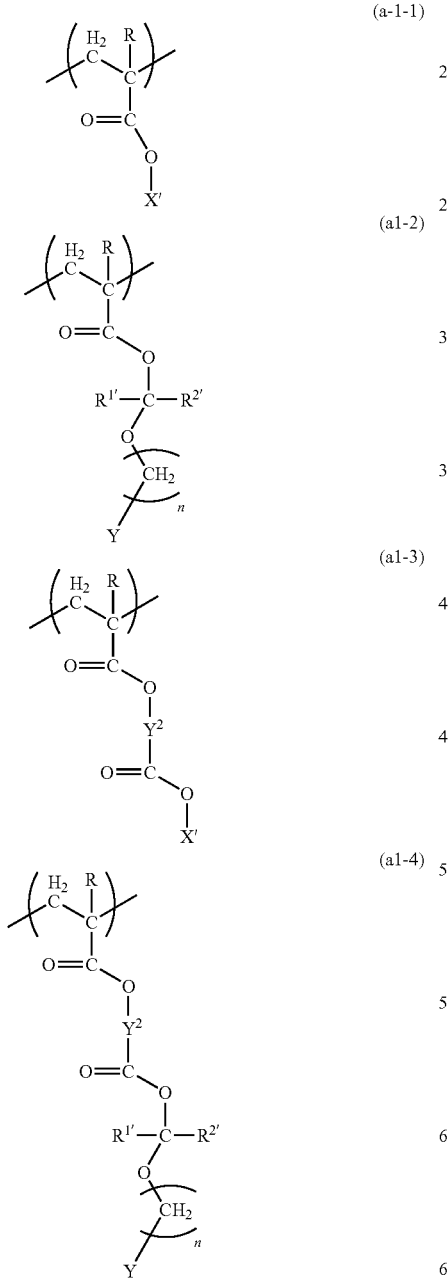

In the formulas, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group, a divalent aliphatic cyclic group, or a group represented by formula "A-O-B" (wherein A and B are respectively the same as defined above); R is the same as defined above; and each of $R^{1'}$ and $R^{2'}$ independently represents a hydrogen atom or a lower alkyl group of 1 to 5 carbon atoms.

Examples of the tertiary alkyl ester-type acid dissociable, dissolution inhibiting group for X' in the formula above are the same as the above-mentioned tertiary alkyl ester-type acid dissociable, dissolution inhibiting groups for $X^1$.

As $R^{1'}$, $R^{2'}$, n and Y, the same as $R^{1'}$, $R^{2'}$, n and Y defined for general formula (p1) described above in connection with the "acetal-type acid dissociable, dissolution inhibiting group" may be mentioned.

As $Y^2$, the same as $Y^2$ defined for general formula (a1-0-2) above may be mentioned.

Specific examples of structural units represented by general formulas (a1-1) to (a1-4) above are shown below.

[Chemical Formula 28]

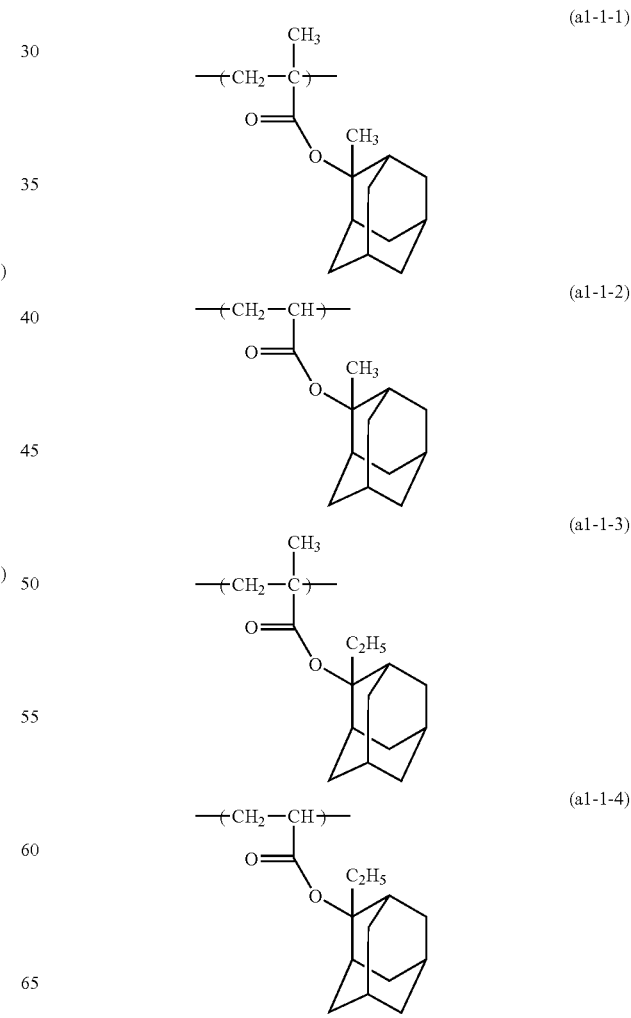

-continued
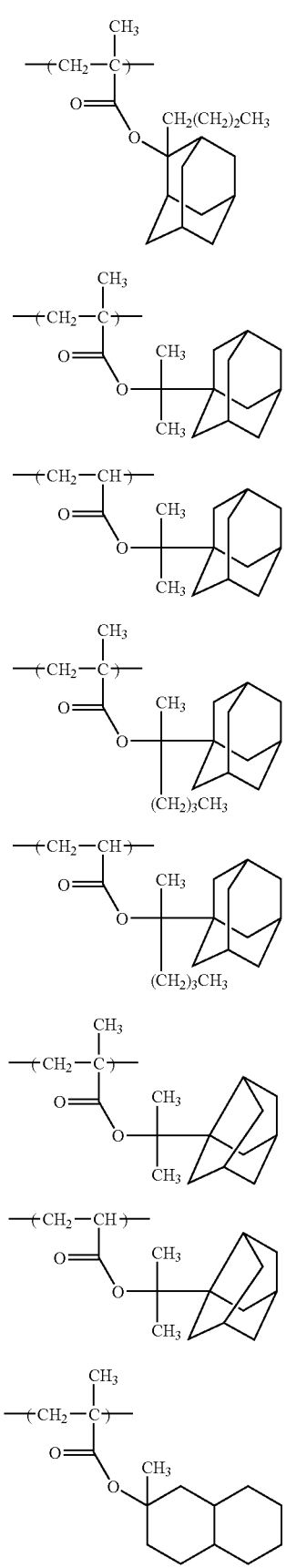
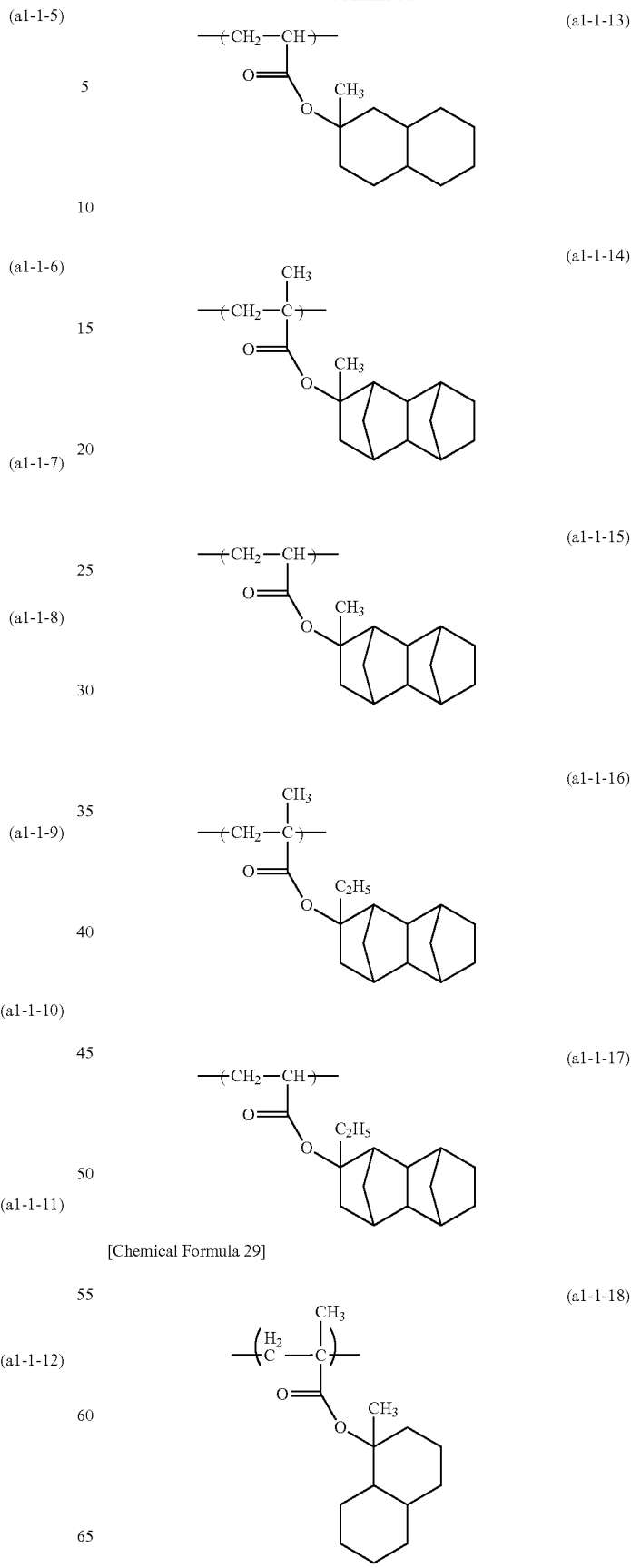
[Chemical Formula 29]

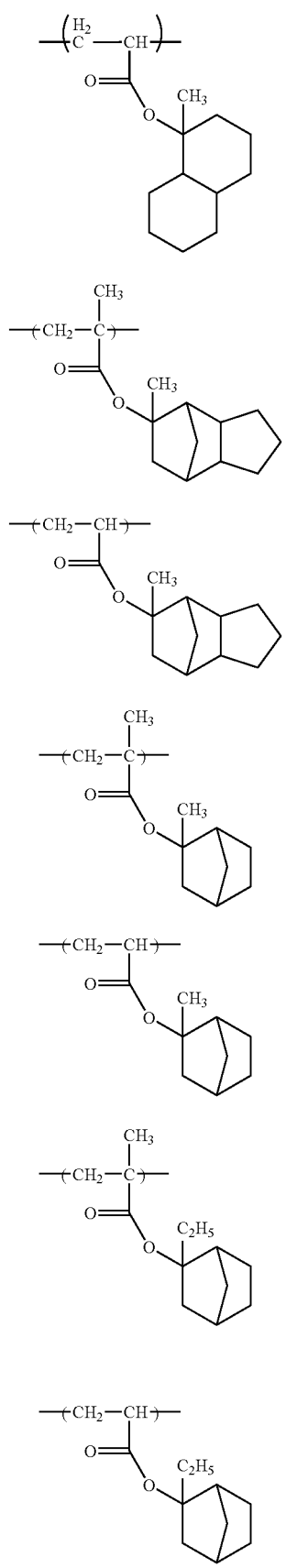 (a1-1-19) (a1-1-20) (a1-1-21) (a1-1-22) (a1-1-23) (a1-1-24) (a1-1-25)
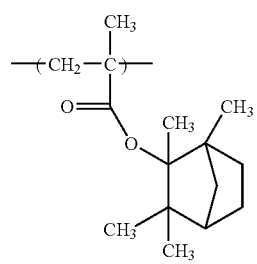 (a1-1-26)
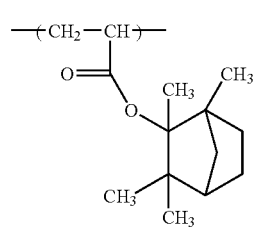 (a1-1-27)
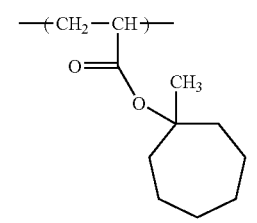 (a1-1-28)
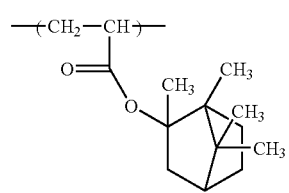 (a1-1-29)
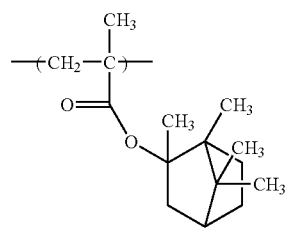 (a1-1-30)
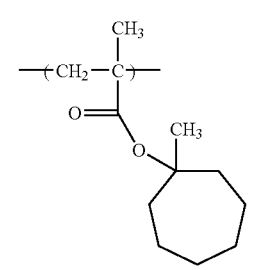 (a1-1-31)
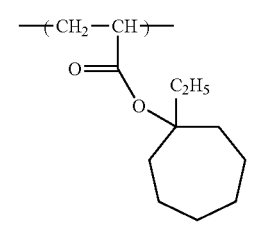 (a1-1-32)

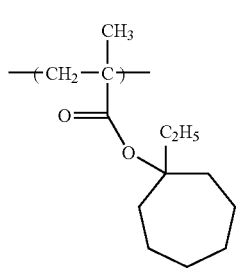
(a1-1-33)
[Chemical Formula 30]
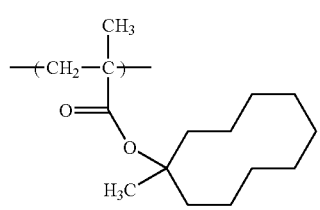
(a1-1-34)
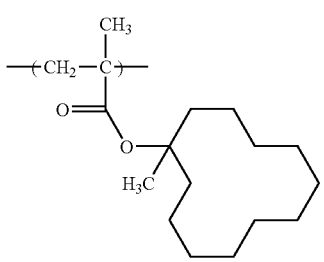
(a1-1-35)
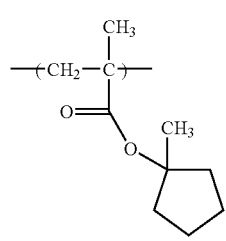
(a1-1-36)
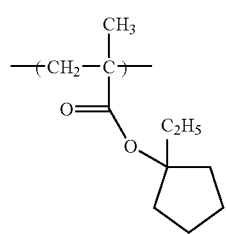
(a1-1-37)
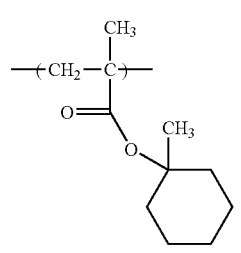
(a1-1-38)
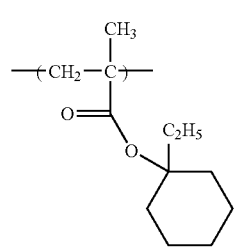
(a1-1-39)
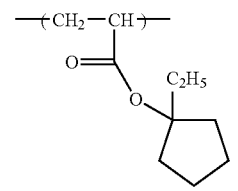
(a1-1-40)
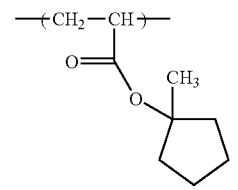
(a1-1-41)
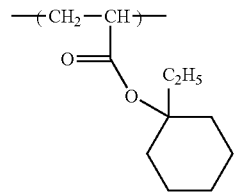
(a1-1-42)
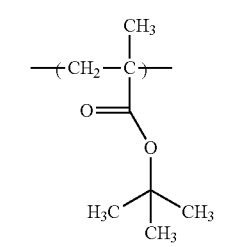
(a1-1-43)
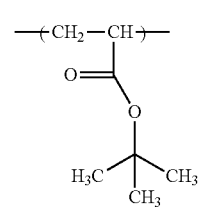
(a1-1-44)
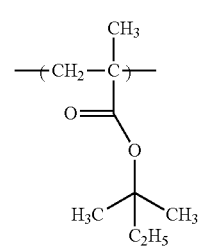
(a1-1-45)

(a1-1-46) 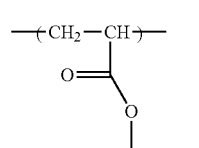
(a1-1-47) 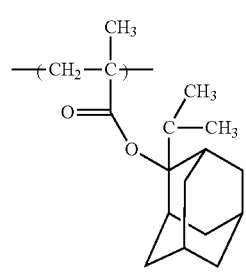
(a1-1-48) 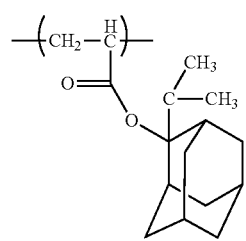
[Chemical Formula 31]
(a1-2-1) 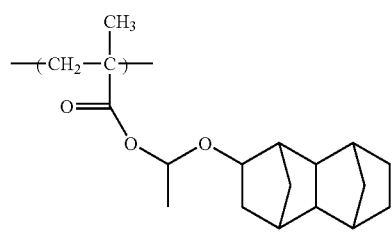
(a1-2-2) 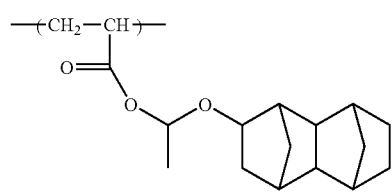
(a1-2-3) 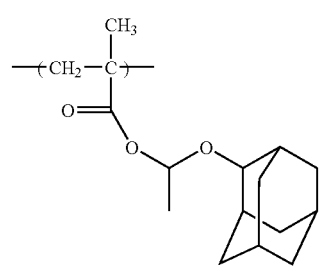
(a1-2-4) 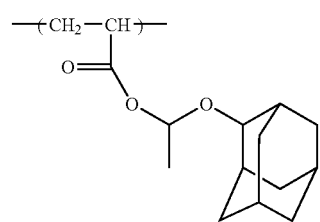
(a1-2-5) 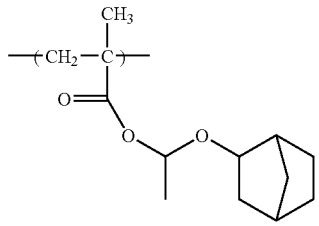
(a1-2-6) 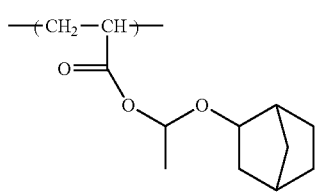
[Chemical Formula 32]
(a1-2-7) 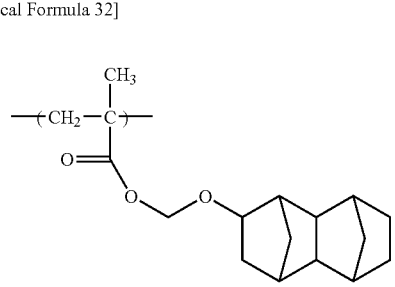
(a1-2-8) 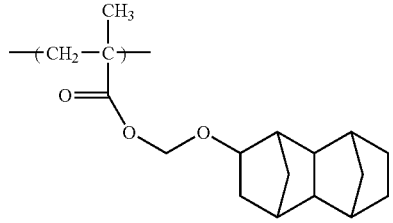
(a1-2-9) 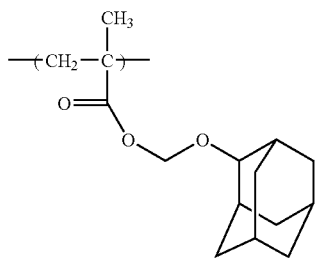
(a1-2-10) 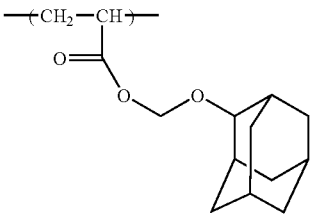
(a1-2-11) 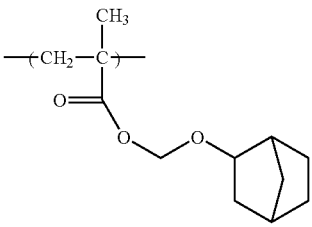

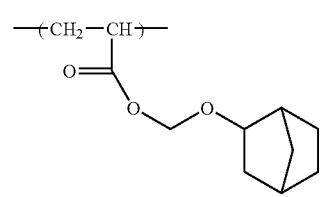
(a1-2-12)
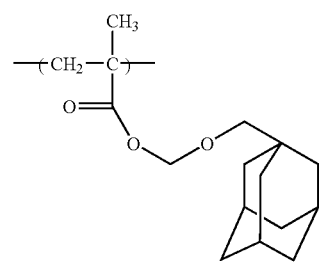
(a1-2-13)
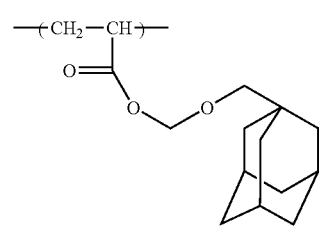
(a1-2-14)
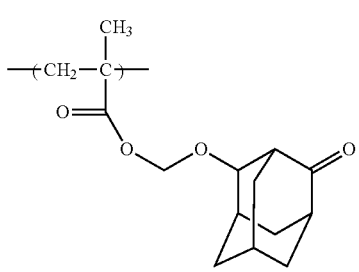
(a1-2-15)
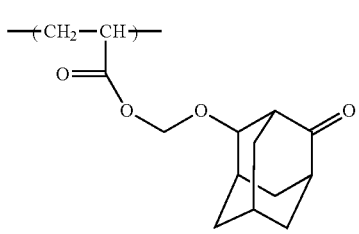
(a1-2-16)
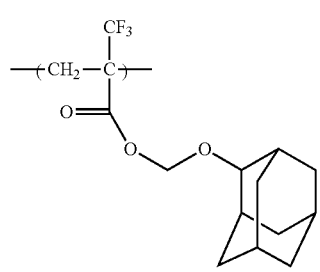
(a1-2-17)
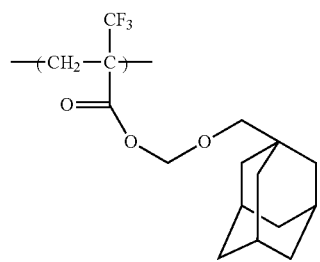
(a1-2-18)
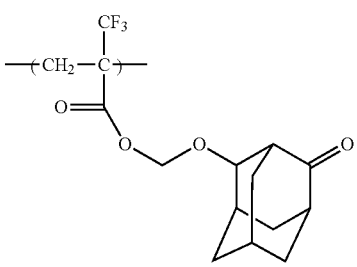
(a1-2-19)
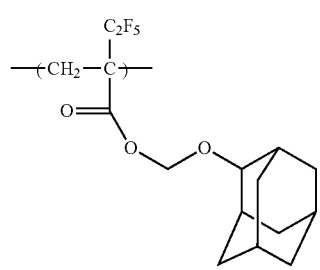
(a1-2-20)
[Chemical Formula 33]
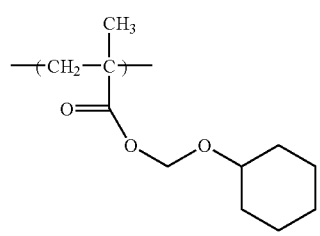
(a1-2-21)
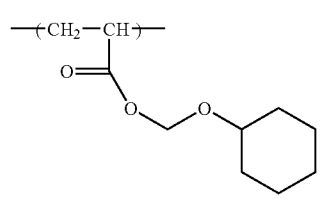
(a1-2-22)
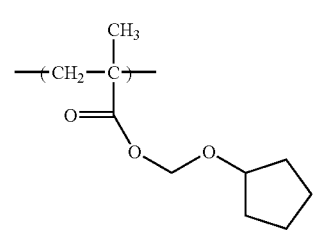
(a1-2-23)

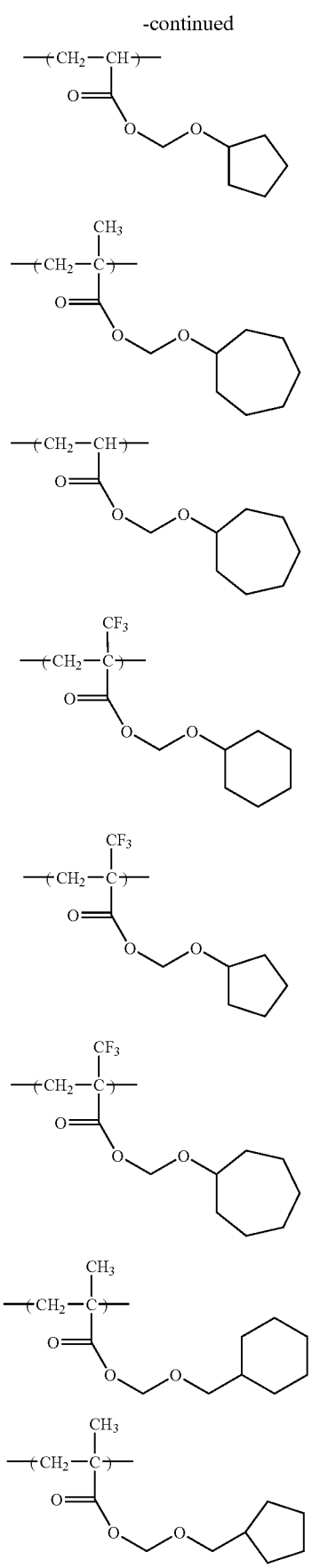
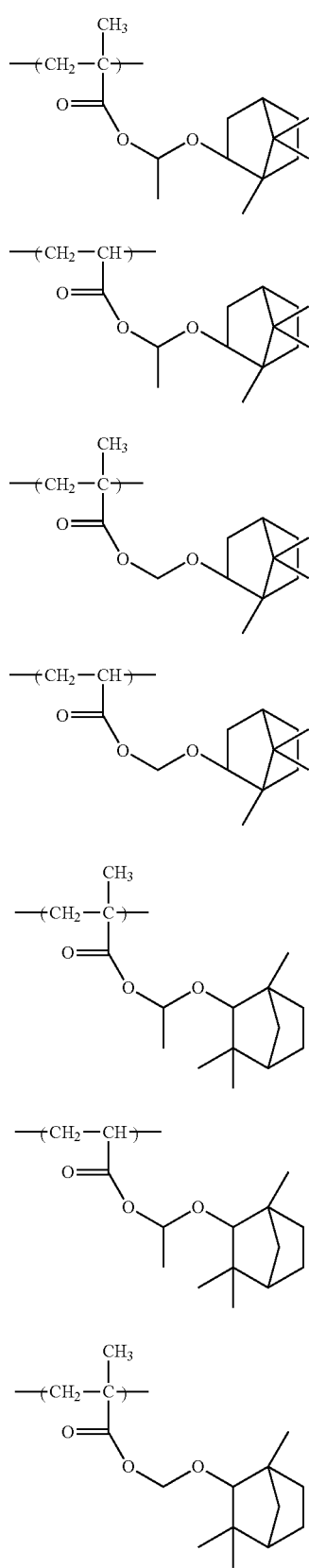

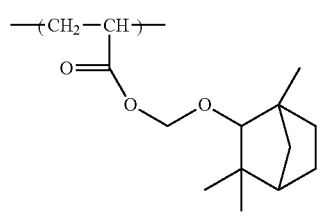 (a1-2-39)
[Chemical Formula 35]
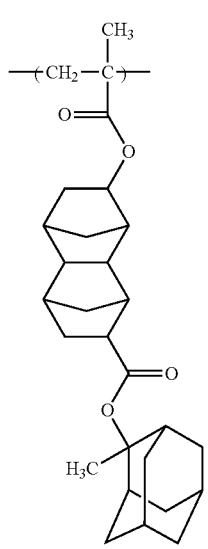 (a1-3-1)
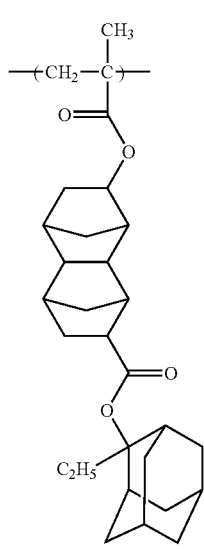 (a1-3-2)
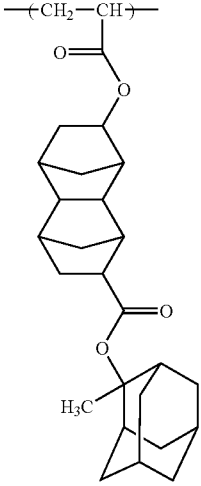 (a1-3-3)
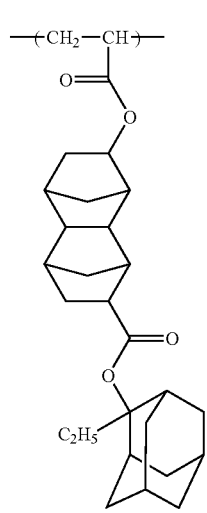 (a1-3-4)
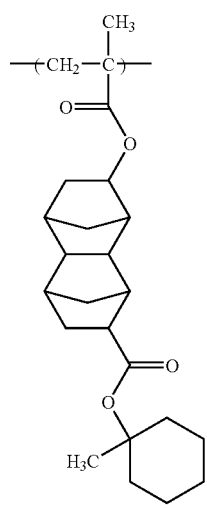 (a1-3-5)

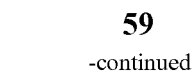 (a1-3-6)
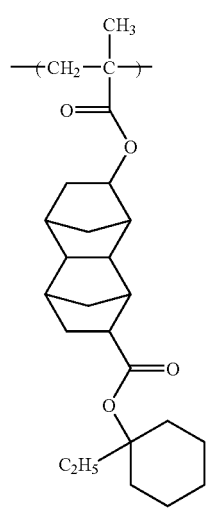
(a1-3-7)
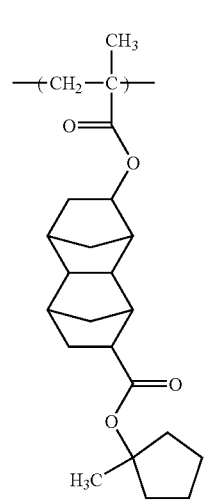
(a1-3-8)
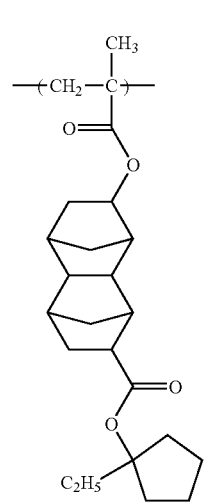
 (a1-3-9)
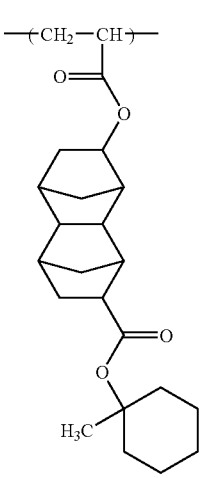
(a1-3-10)
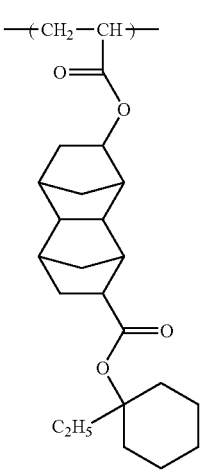
(a1-3-11)
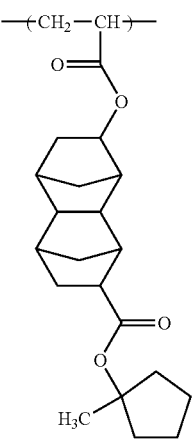

-continued
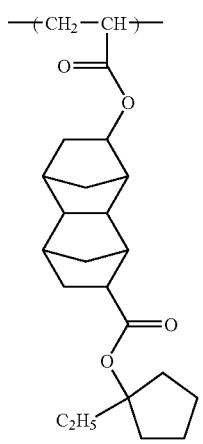
(a1-3-12)
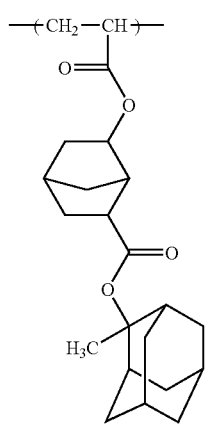
(a1-3-15)
(a1-3-13)
(a1-3-16)
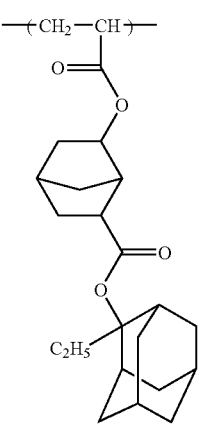
(a1-3-14)
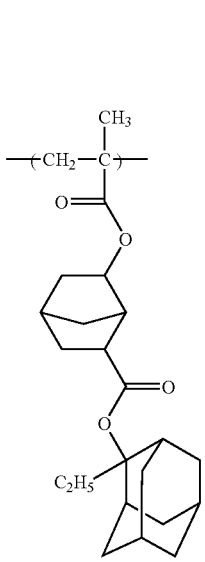
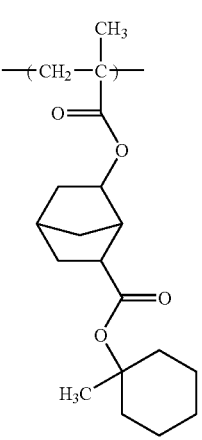
(a1-3-17)

[Chemical Formula 36]
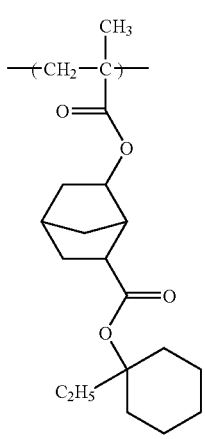 (a1-3-18)
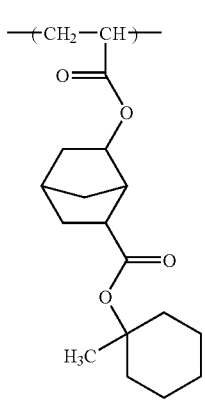 (a1-3-19)
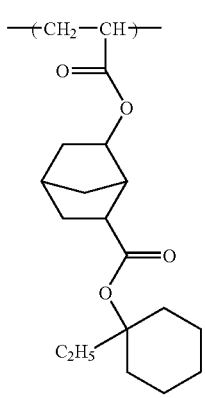 (a1-3-20)
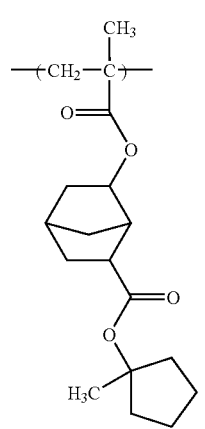 (a1-3-21)
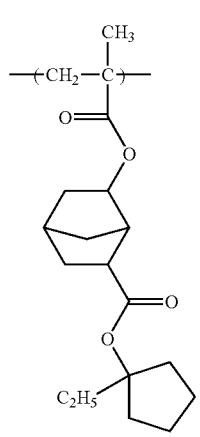 (a1-3-22)
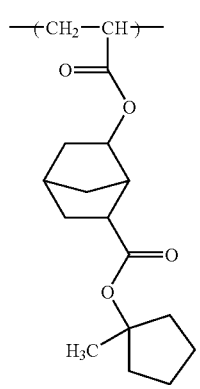 (a1-3-23)
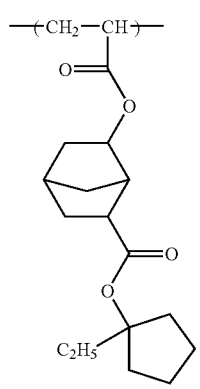 (a1-3-24)
[Chemical Formula 37]
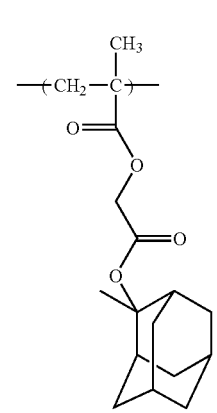 (a1-3-25)

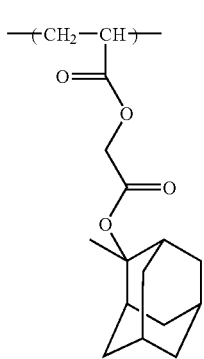 (a1-3-26)
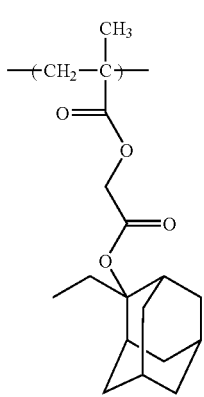 (a1-3-27)
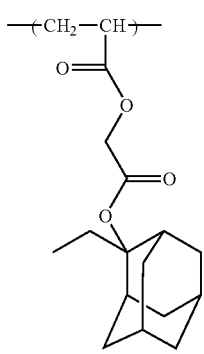 (a1-3-28)
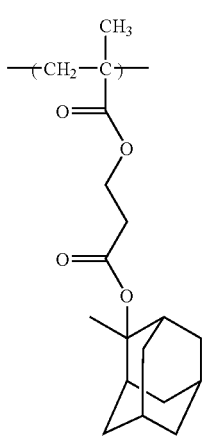 (a1-3-29)
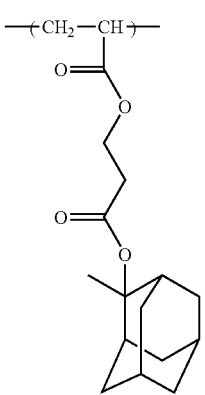 (a1-3-30)
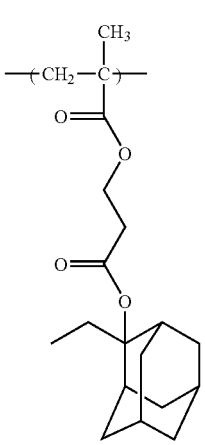 (a1-3-31)
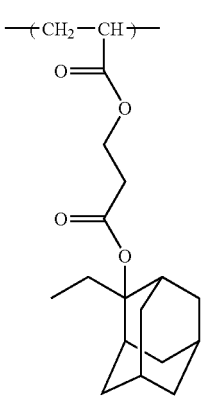 (a1-3-32)
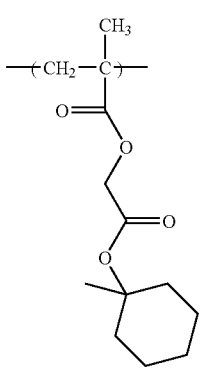 (a1-3-33)

-continued
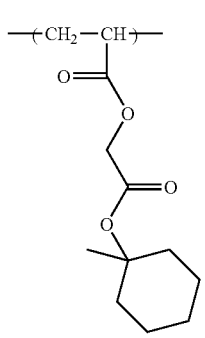
(a1-3-34)
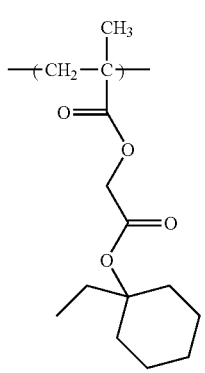
(a1-3-35)
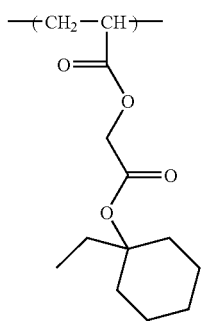
(a1-3-36)
[Chemical Formula 38]
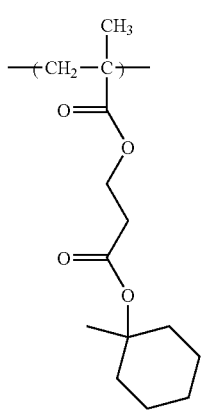
(a1-3-37)
-continued
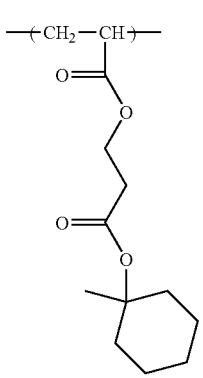
(a1-3-38)
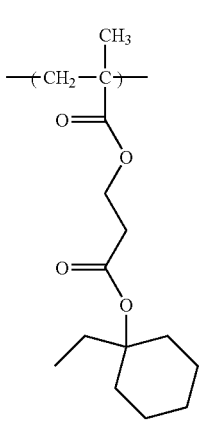
(a1-3-39)
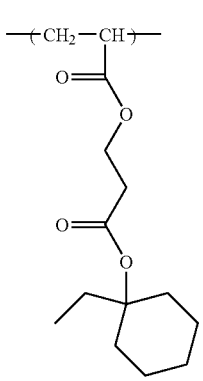
(a1-3-40)
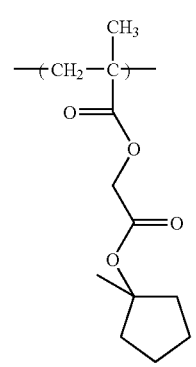
(a1-3-41)

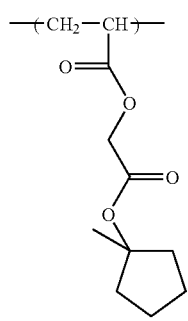 (a1-3-42)
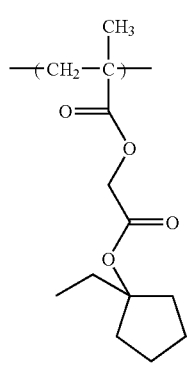 (a1-3-43)
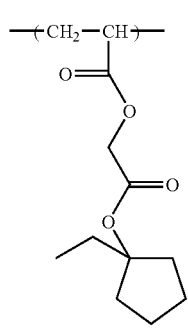 (a1-3-44)
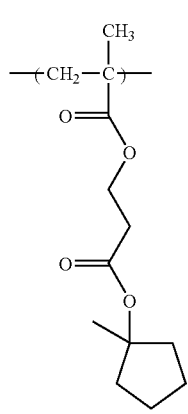 (a1-3-45)
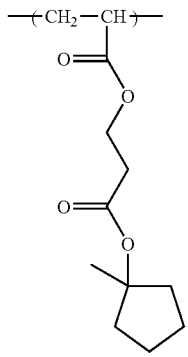 (a1-3-46)
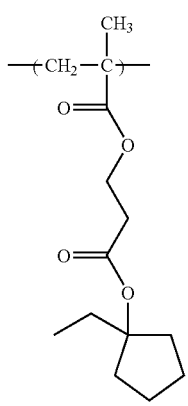 (a1-3-47)
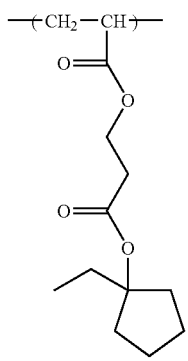 (a1-3-48)
[Chemical Formula 39]
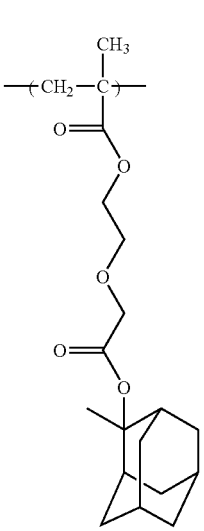 (a1-3-49)

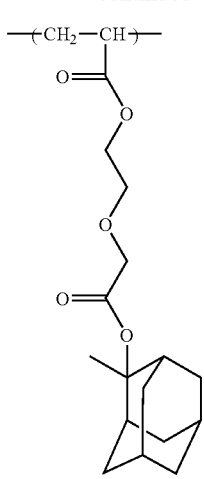
(a1-3-50)
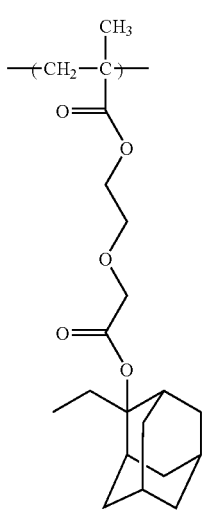
(a1-3-51)
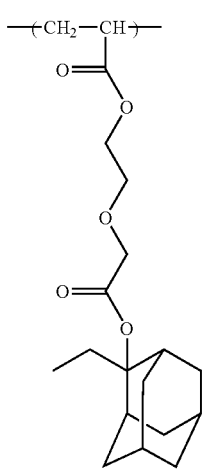
(a1-3-52)
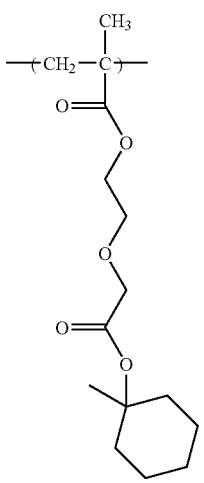
(a1-3-53)
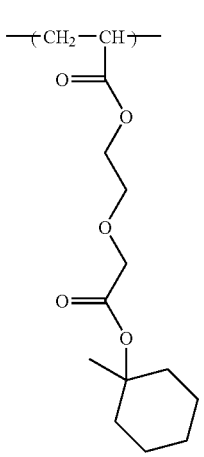
(a1-3-54)
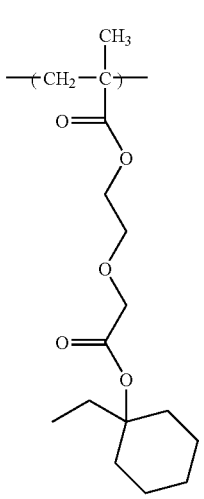
(a1-3-55)

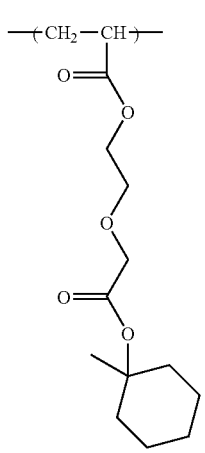 (a1-3-56)
[Chemical Formula 40]
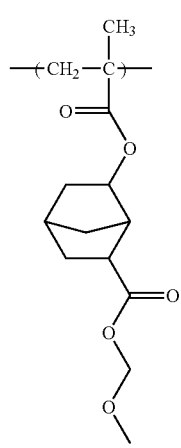 (a1-4-1)
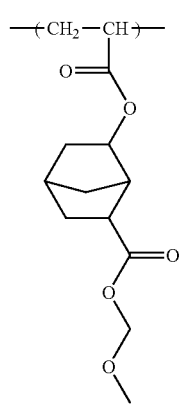 (a1-4-2)
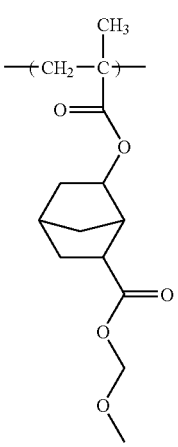 (a1-4-3)
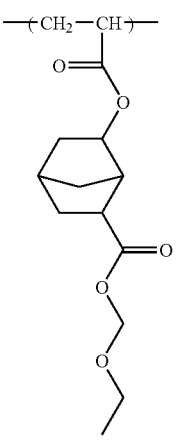 (a1-4-4)
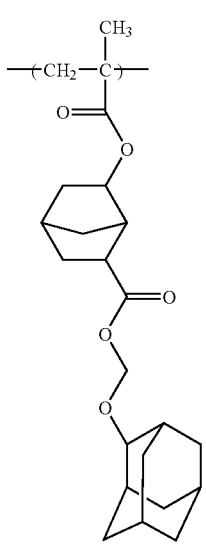 (a1-4-5)

-continued
(a1-4-6)
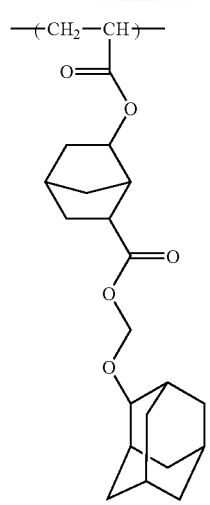
(a1-4-7)
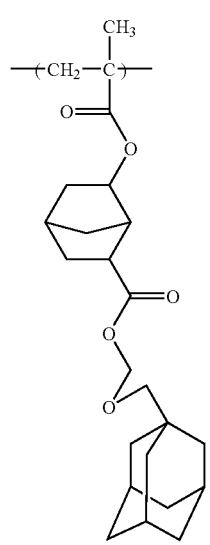
(a1-4-8)
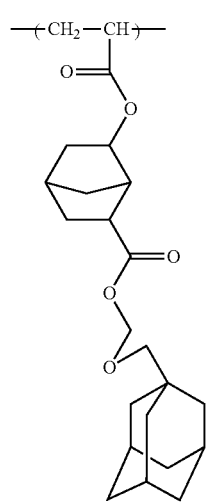
-continued
(a1-4-9)
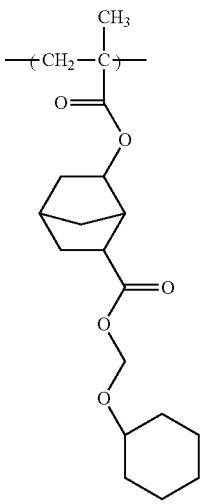
(a1-4-10)
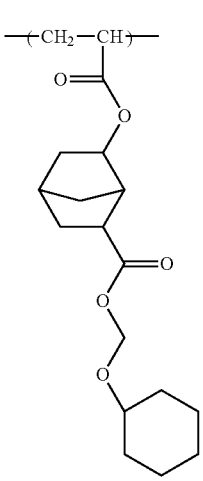
(a1-4-11)
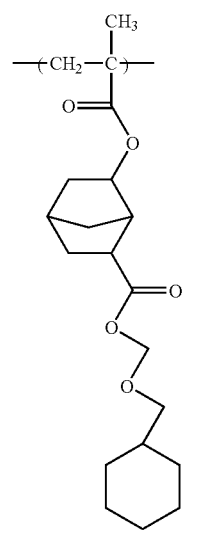

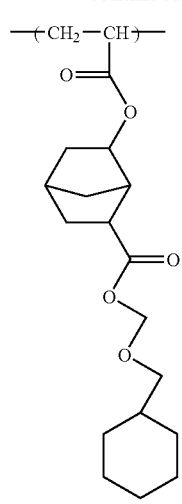
(a1-4-12)
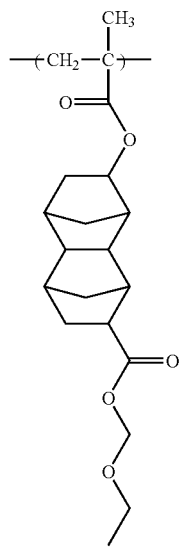
(a1-4-15)
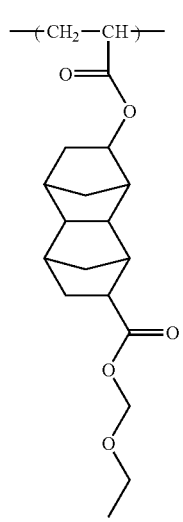
(a1-4-16)
(a1-4-13)
(a1-4-17)
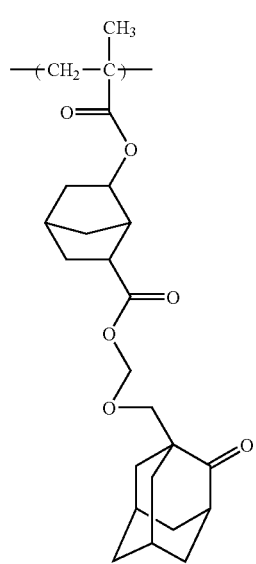
(a1-4-14)

[Chemical Formula 41]
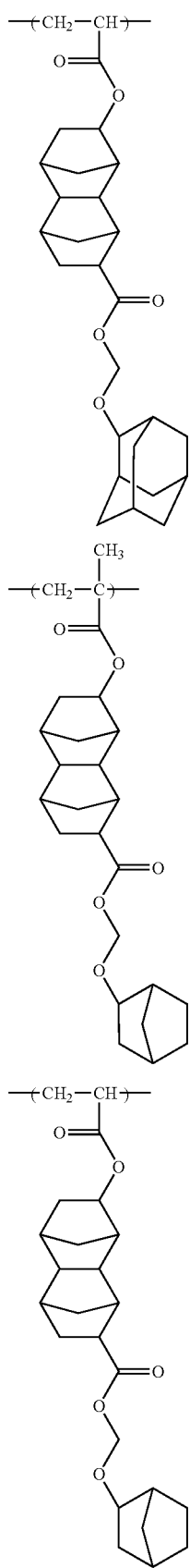
(a1-4-18)
(a1-4-19)
(a1-4-20)
-continued
(a1-4-21)
(a1-4-22)

(a1-4-23)
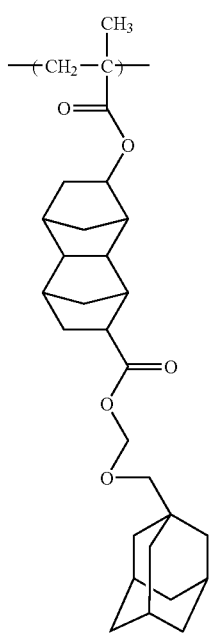
(a1-4-24)
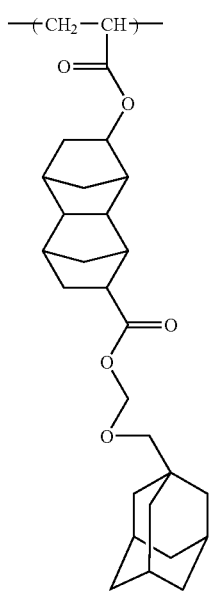
(a1-4-25)
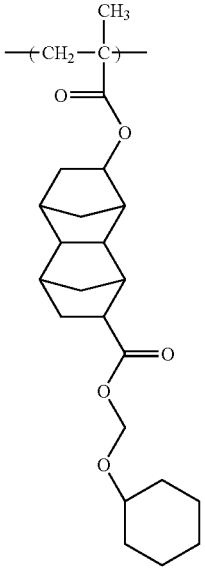
(a1-4-26)
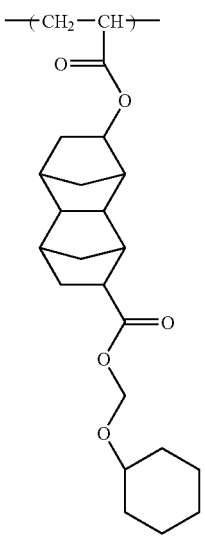
(a1-4-27)
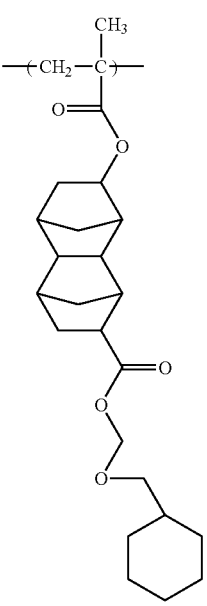

As the structural unit (a1), one type of structural unit may be used alone, or two or more types of structural units may be used in combination.

Among these, structural units represented by general formula (a1-1) or (a1-3) are preferable. More specifically, at least one structural unit selected from the group consisting of structural units represented by formulas (a1-1-1) to (a-1-1-7), (a1-1-36) to (a1-1-42) and (a1-3-49) to (a1-3-56) is more preferable.

Further, as the structural unit (a1), structural units represented by general formula (a1-1-01) shown below which includes the structural units represented by formulas (a1-1-1) to (a1-1-5), structural units represented by general formula (a1-1-02) shown below which includes the structural units represented by formulas (a1-1-36) to (a1-1-42), structural units represented by general formula (a1-3-01) shown below which include the structural units represented by formulas (a1-3-49) to (a1-3-52), and structural units represented by general formula (a1-3-02) shown below which include the structural units represented by formulas (a1-1-53) to (a1-3-56) are also preferable.

[Chemical Formula 42]

In the formula, R represents a hydrogen atom, a lower alkyl group or a halogenated lower alkyl group; and $R^{11}$ represents a lower alkyl group.

[Chemical Formula 43]

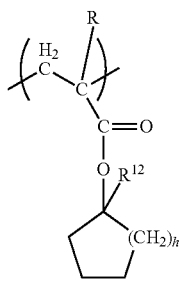

(a1-1-02)

In the formula, R represents a hydrogen atom, a lower alkyl group or a halogenated lower alkyl group; $R^{12}$ represents a lower alkyl group; and h represents an integer of 1 to 3.

In general formula (a1-1-01), R is the same as defined above. The lower alkyl group for $R^{11}$ is the same as the lower alkyl group for R above, and is preferably a methyl group or an ethyl group.

In general formula (a1-1-02), R is the same as defined above. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

[Chemical Formula 44]

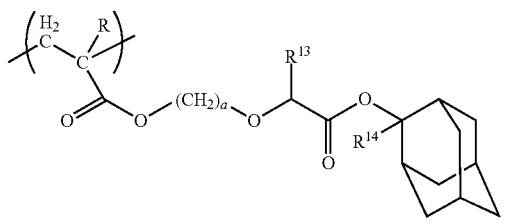

(a1-3-01)

In the formula, R represents a hydrogen atom, a lower alkyl group or a halogenated lower alkyl group; $R^{14}$ represents a lower alkyl group; $R^{13}$ represents a hydrogen atom or a methyl group; and a represents an integer of 1 to 10.

[Chemical Formula 45]

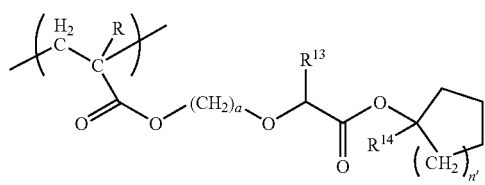

(a1-3-02)

In the formula, R represents a hydrogen atom, a lower alkyl group or a halogenated lower alkyl group; $R^{14}$ represents a lower alkyl group; $R^{13}$ represents a hydrogen atom or a methyl group; a represents an integer of 1 to 10; and n' represents an integer of 0 to 3.

In general formulas (a1-3-01) and (a1-3-02), R is the same as defined above.

$R^{13}$ is preferably a hydrogen atom.

The lower alkyl group for $R^{14}$ is the same as the lower alkyl group for R, and is preferably a methyl group or an ethyl group.

a is preferably an integer of 1 to 8, more preferably an integer of 2 to 5, and most preferably 2.

In the component (A1), the amount of the structural unit (a1) based on the combined total of all structural units constituting the component (A1) is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

Structural Unit (a2):

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 46]

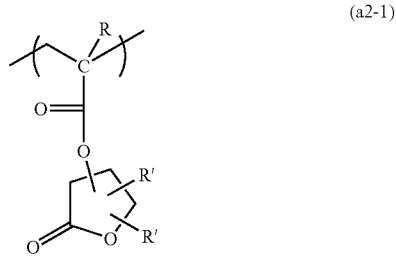

(a2-1)

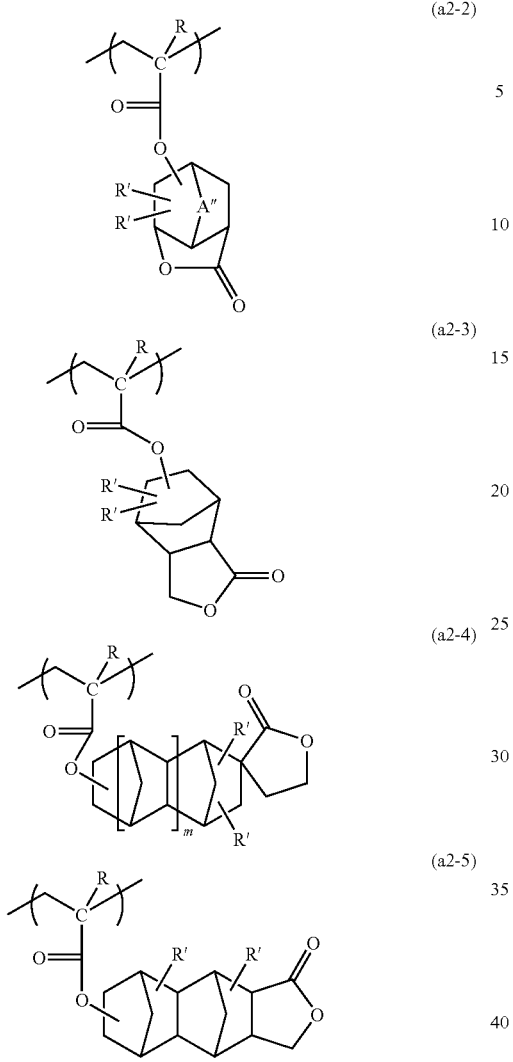

been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms which may contain an oxygen atom or a sulfur atom for A" include a methylene group, ethylene group, n-propylene group, isopropylene group, —O—$CH_2$—, —$CH_2$—O—$CH_2$—, —S—$CH_2$— and —$CH_2$—S—$CH_2$—.

Specific examples of structural units represented by general formulas (a2-1) to (a2-5) above are shown below.

[Chemical Formula 47]

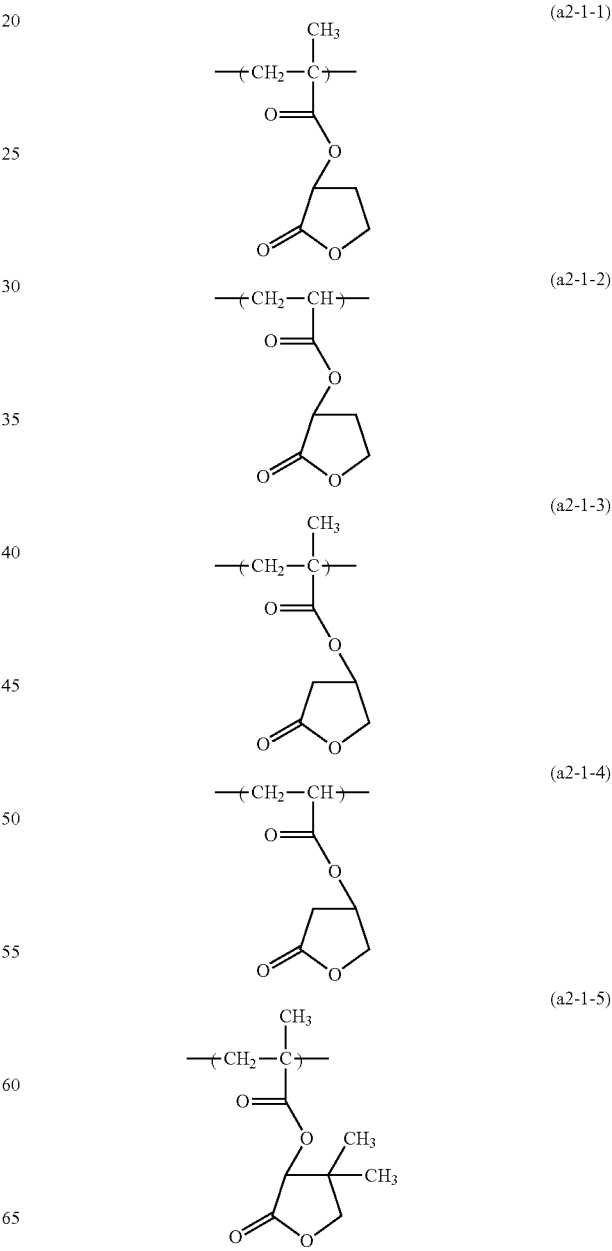

In the formulas, R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents an integer of 0 or 1; and A" represents an alkylene group of 1 to 5 carbon atoms which may contain an oxygen atom or a sulfur atom.

In general formulas (a2-1) to (a2-5), R is the same as defined for R in the structural unit (a1) above.

The lower alkyl group for R' is the same as the lower alkyl group for R in the structural unit (a1) above.

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group. Specific examples include groups in which one or more hydrogen atoms have (a2-1-6)
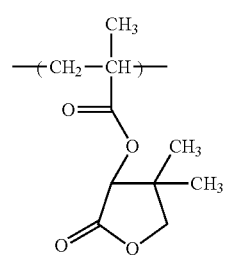
[Chemical Formula 48]
(a2-2-1)
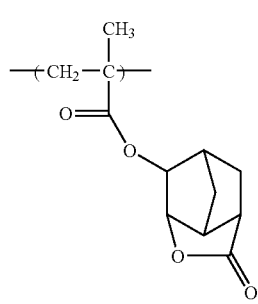
(a2-2-2)
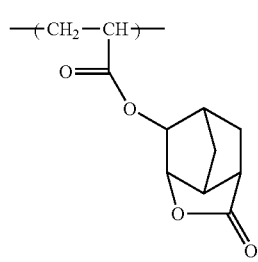
(a2-2-3)
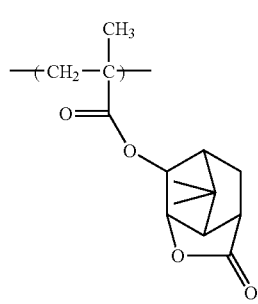
(a2-2-4)
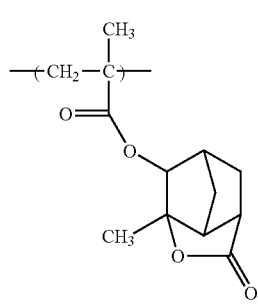
(a2-2-5)
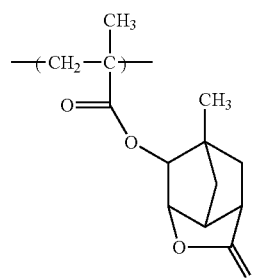
(a2-2-6)
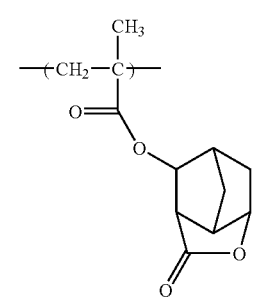
(a2-2-7)
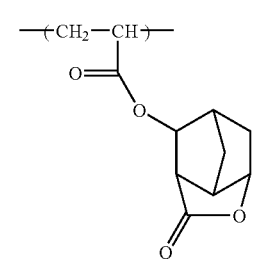
(a2-2-8)
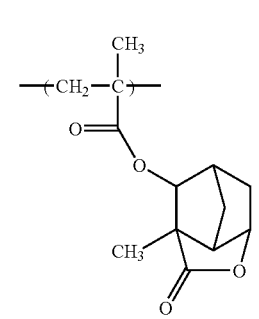
(a2-2-9)
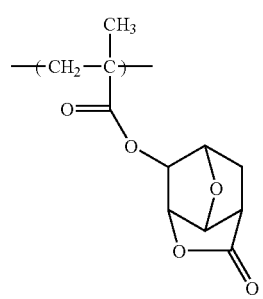

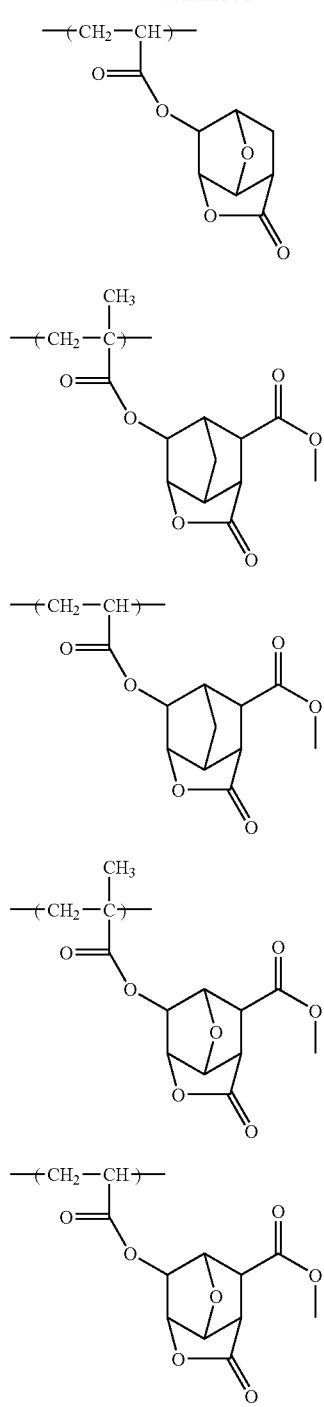
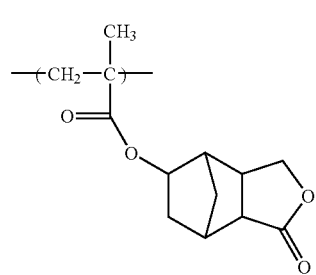
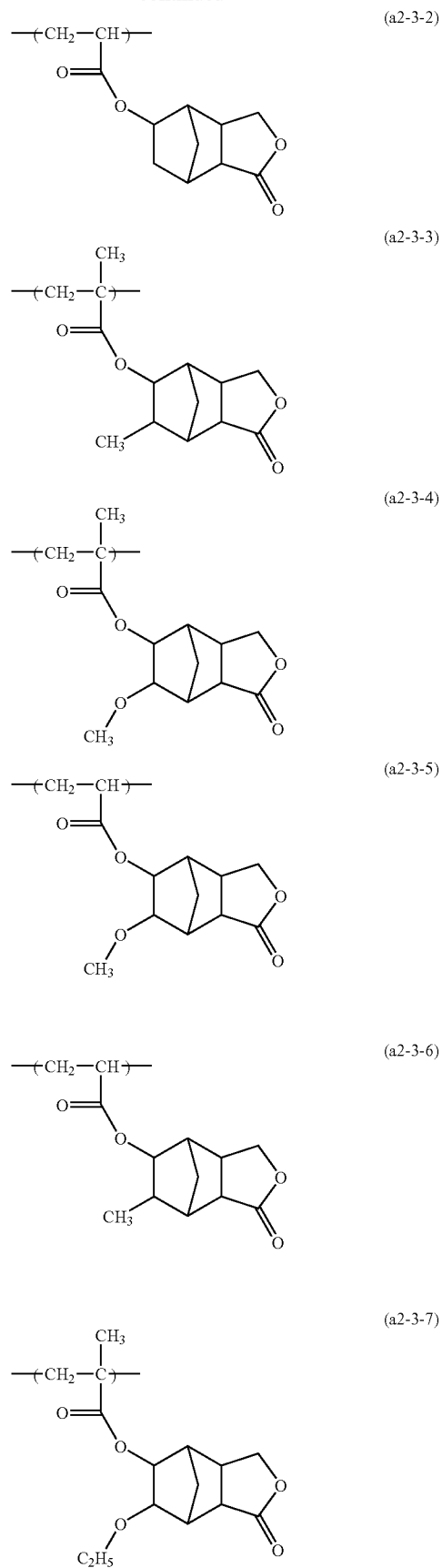

-continued
(a2-3-8)
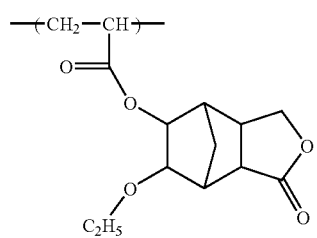
(a2-3-9)
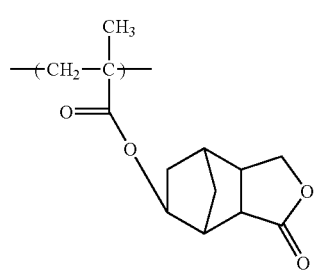
(a2-3-10)
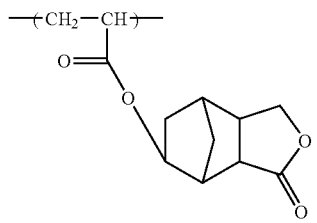
[Chemical Formula 50]
(a2-4-1)
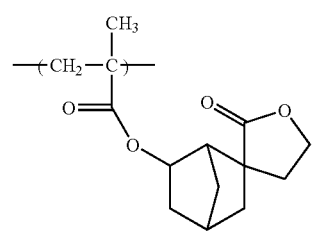
(a2-4-2)
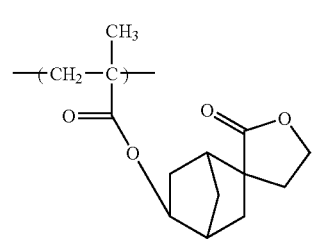
(a2-4-3)
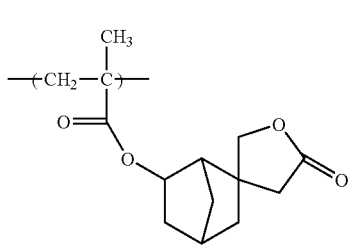
-continued
(a2-4-4)
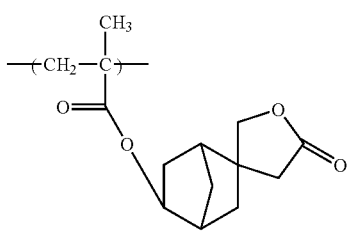
(a2-4-5)
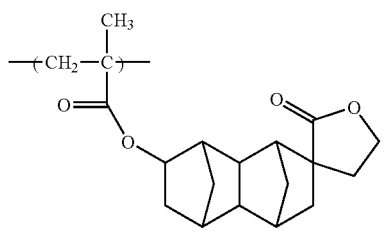
(a2-4-6)
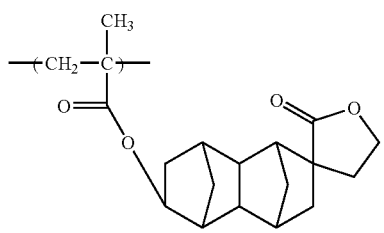
(a2-4-7)
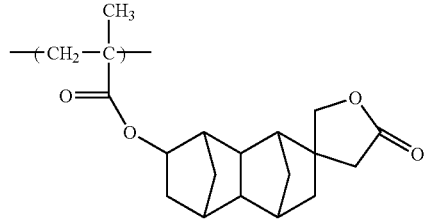
(a2-4-8)
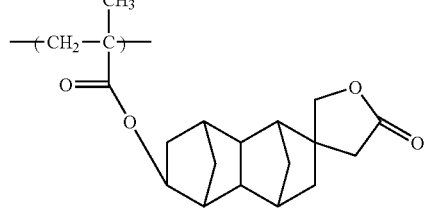
(a2-4-9)
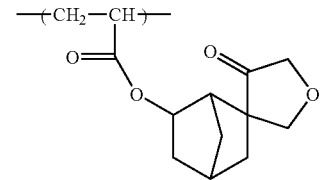
(a2-4-10)
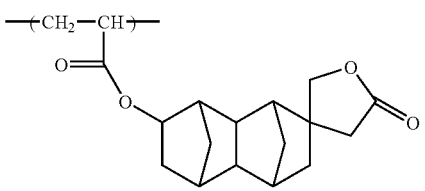

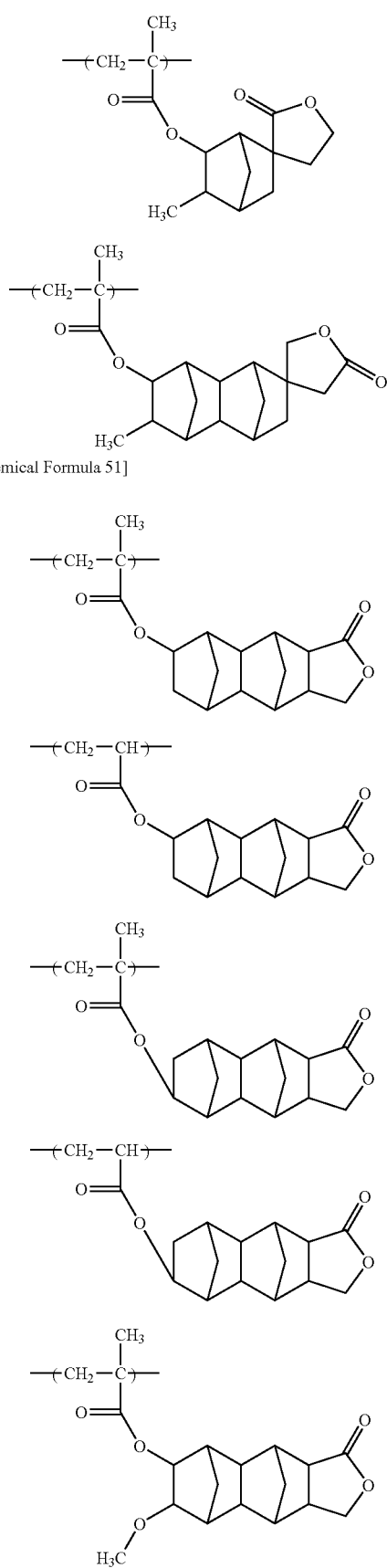

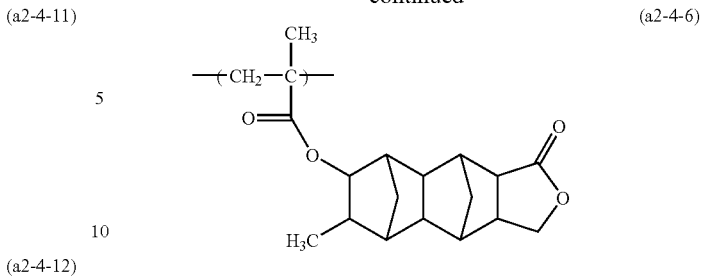

In the component (A1), as the structural unit (a2), one type of structural unit may be used, or two or more types of structural units may be used in combination.

As the structural unit (a2), at least one structural unit selected from the group consisting of structural units represented by general formulas (a2-1) to (a2-5) is preferable, and at least one structural unit selected from the group consisting of structural units represented by general formulas (a2-1) to (a2-3) is more preferable. Of these, it is preferable to use at least one structural unit selected from the group consisting of structural units represented by formulas (a2-1-1), (a2-1-2), (a2-2-1), (a2-2-2), (a2-2-9), (a2-2-10), (a2-3-1), (a2-3-2), (a2-3-9) and (a2-3-10).

In the component (A1), the amount of the structural unit (a2) based on the combined total of all structural units constituting the component (A1) is preferably 5 to 60 mol %, more preferably 10 to 50 mol %, and still more preferably 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) no more than the upper limit of the above-mentioned range, a good balance can be achieved with the other structural units.

Structural Unit (a3):

The structural unit (a3) is a structural unit derived from an acrylate ester containing a polar group-containing aliphatic hydrocarbon group.

When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, a cyano group, a carboxyl group or a hydroxyalkyl group in which some of the hydrogen atoms of the alkyl group have been substituted with fluorine atoms are particularly desirable. Examples of the polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 52]

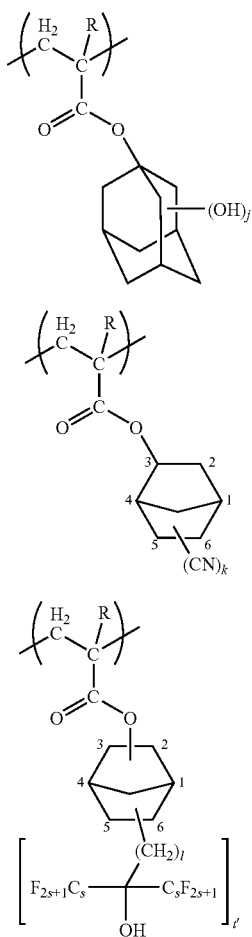

In the formula, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl group be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group. In formula (a3-2), k is preferably 1. The cyano group is preferably bonded to the 5th or 6th position of the norbonyl group.

In formula (a3-3), t' is preferably 1, l is preferably 1 and s is preferably 1. Further, it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

As the structural unit (a3), one type of structural unit may be used alone, or two or more types of structural units may be used in combination.

In the component (A1), the amount of the structural unit (a3) based on the combined total of all structural units constituting the component (A1) is preferably 5 to 50 mol %, more preferably 5 to 40 mol %, and still more preferably 5 to 25 mol %.

Structural Unit (a4):

The component (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable.

Examples of this aliphatic polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used. In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (w-1) to (a4-5) shown below.

[Chemical Formula 53]

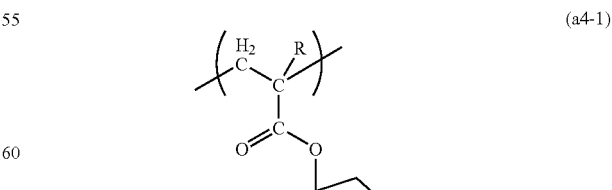

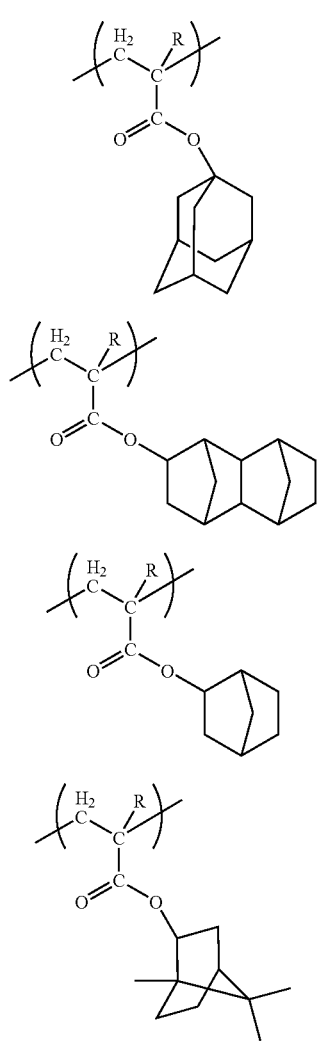

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The component (A1) is preferably a copolymer having the structural units (a1), (a2) and (a3). Examples of such a copolymer include a copolymer consisting of the structural units (a1) and (a2) and (a3), and a copolymer consisting of the structural units (a1), (a2), (a3) and (a4).

In the component (A), as the component (A1), one type may be used alone, or two or more types may be used in combination.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. When the weight average molecular weight no more than the upper limit of the above-mentioned range, the component (A1) exhibits satisfactory solubility in a resist solvent when used as a resist. On the other hand, when the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), it is preferable to use a low molecular compound that has a molecular weight of at least 500 and less than 2,000, contains a hydrophilic group, and also contains an acid dissociable, dissolution inhibiting group X or X' mentioned above in connection with the component (A1).

Specific examples include compounds containing a plurality of phenol skeletons in which part of the hydrogen atoms within hydroxyl groups have each been substituted with the aforementioned acid dissociable, dissolution inhibiting group X or X'.

Preferable examples of the component (A2) include low molecular weight phenolic compounds that are known, for example, as sensitizers or heat resistance improvers for use in non-chemically amplified g-line or i-line resists, wherein part of the hydrogen atoms within hydroxyl group of these compounds have been substituted with the acid dissociable, dissolution inhibiting groups mentioned above, and any of these compounds may be used.

Specific examples of these low molecular weight phenolic compounds include the following:

bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenolic compound is not limited to these examples.

Also, there are no particular limitations on the acid dissociable, dissolution inhibiting group, and suitable examples include the groups described above.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 54]

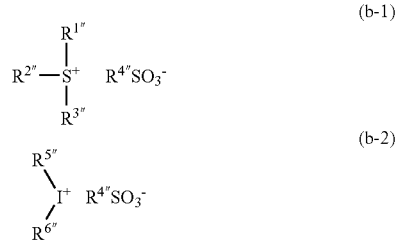

In the formulas, $R^{1''}$ to $R^{3''}$, $R^{5''}$ and $R^{6''}$ each independently represent an aryl group or alkyl group, wherein two of $R^{1''}$ to $R^{3''}$ in formula (b-1) may be bonded to each other to form a ring with the sulfur atom; and $R^{4''}$ represents a linear, branched or cyclic alkyl group or a fluorinated alkyl group, with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represent an aryl group or an alkyl group. In formula (b-1), two of $R^{1''}$ to $R^{3''}$ may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group. The alkoxy group, with which hydrogen atoms of the aryl group may be substituted, is preferably an alkoxy group having 1 to 5 carbon atoms, and most preferably a methoxy group, an ethoxy group, an n-propoxy group, an iso-propoxy group, an n-butoxy group or a tert-butoxy group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it contributes to achieving excellent resolution and can be synthesized at a low cost.

It is particularly desirable that each of $R^{1''}$ to $R^{3''}$ is a phenyl group or a naphthyl group.

When two of $R^{1''}$ to $R^{3''}$ in formula (b-1) are bonded to each other to form a ring with the sulfur atom, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom, the remaining one of $R^{1''}$ to $R^{3''}$ is preferably an aryl group. As examples of the aryl group, the same aryl groups as those described above for $R^{1''}$ to $R^{3''}$ can be mentioned.

$R^{4''}$ represents a linear, branched or cyclic alkyl group or a fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1''}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms (namely, the fluorinated alkyl group is a perfluoroalkyl group) because the acid strength increases. $R^{4''}$ is most preferably a linear or cyclic alkyl group or a fluorinated alkyl group.

In formula (b-2), $R^{5''}$ and $R^{6''}$ each independently represent an aryl group or an alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same aryl groups as those described above for $R^{1''}$ to $R^{3''}$ can be used.

As the alkyl group for $R^{5''}$ and $R^{6''}$, the same alkyl groups as those described above for $R^{1''}$ to $R^{3''}$ can be used.

It is particularly desirable that both of $R^{5''}$ and $R^{6''}$ represent a phenyl group. As $R^{4''}$ in formula (b-2), the same groups as those mentioned above for $R^{4''}$ in formula (b-1) can be mentioned.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced with methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 55]

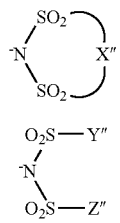

In the formulas, X" represents an alkylene group of 2 to 6 carbon atoms in which at least one hydrogen atom has been substituted with a fluorine atom; and Y" and Z" each independently represent an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represent a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms within the alkylene group of X" or within the alkyl group of Y" and Z" within the above ranges for the number of carbon atoms, the better the solubility of the component (B) in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Furthermore, as the onium salt-based acid generator, a sulfonium salt having a cation moiety represented by general formula (b-5) or (b-6) shown below may also be used.

[Chemical Formula 56]

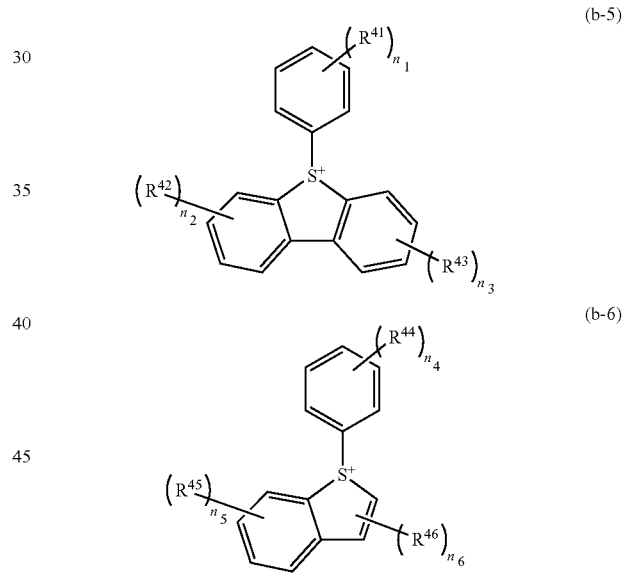

In the formulas, $R^{41}$ to $R^{46}$ each independently represent an alkyl group, an acetyl group, an alkoxy group, a carboxyl group, a hydroxyl group or a hydroxyalkyl group; n1 to n5 each independently represent an integer of 0 to 3; and n6 represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably an aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of n1 to n6, then the two or more of the individual $R^{41}$ to $R^{46}$ group may be the same or different from each other.

n1 is preferably 0 to 2, more preferably 0 or 1, and still more preferably 0.

It is preferable that n2 and n3 each independently represent 0 or 1, and more preferably 0.

n4 is preferably 0 to 2, and more preferably 0 or 1.

n5 is preferably 0 or 1, and more preferably 0.

n6 is preferably 0 or 1, and more preferably 1.

The anion moiety of the sulfonium salt having a cation moiety represented by general formula (b-5) or (b-6) is not particularly limited, and the same anion moieties as those used within previously proposed onium salt-based acid generators may be used. Examples of such anion moieties include fluorinated alkylsulfonate ions such as anion moieties ($R^{4"}SO_3^-$) for onium salt-based acid generators represented by general formula (b-1) or (b-2) shown above; and anion moieties represented by general formula (b-3) or (b-4) shown above. Among these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propylsulfonate ion and a nonafluoro-n-butylsulfonate ion.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be selected as appropriate.

[Chemical Formula 57]

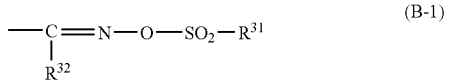

(B-1)

In the formula, $R^{31}$ and $R^{32}$ each independently represent an organic group.

The organic group for $R^{31}$ and $R^{32}$ refers to a group containing a carbon atom, and may include atoms other than carbon atoms (such as a hydrogen atom, an oxygen atom, a nitrogen atom, a sulfur atom, or a halogen atom (such as a fluorine atom and a chlorine atom) and the like).

As the organic group for $R^{31}$, a linear, branched, or cyclic alkyl group or an aryl group is preferable. The alkyl group or the aryl group may have a substituent. The substituent is not particularly limited, and examples thereof include a fluorine atom and a linear, branched or cyclic alkyl group having 1 to 6 carbon atoms. The expression "have a substituent" means that part or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 58]

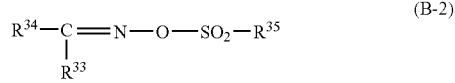

(B-2)

In the formulas, $R^{33}$ represents a cyano group, an alkyl group having no substituent, or a halogenated alkyl group; $R^{34}$ represents an aryl group; and $R^{35}$ represents an alkyl group having no substituent, or a halogenated alkyl group.

[Chemical Formula 59]

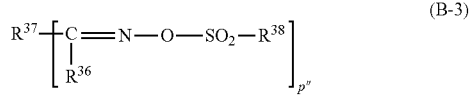

(B-3)

In the formulas, $R^{36}$ represents a cyano group, an alkyl group having no substituent, or a halogenated alkyl group; $R^{37}$ represents a divalent or trivalent aromatic hydrocarbon group; $R^{38}$ represents an alkyl group having no substituent, or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group and a phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same alkyl groups having no substituent or the halogenated alkyl groups mentioned above for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may be preferably used.

Furthermore, as preferred examples, the following can be mentioned.

[Chemical Formula 60]

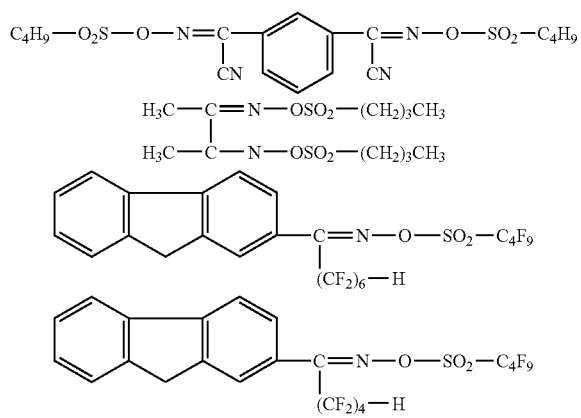

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety. The amount of the component (B) within the resist composition according to the present invention is preferably from 0.5 to 30 parts by weight, and more preferably from 1 to 15 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

In order to improve factors such as the resist pattern shape and the post exposure stability of the latent image formed by the pattern-wise exposure of the resist layer, it is preferable that the resist composition for immersion exposure according to the present invention further includes a nitrogen-containing organic compound (D) (hereafter referred to as "component (D)") as an optional component.

A multitude of these components (D) have already been proposed, and any of these known compounds may be used, although an aliphatic amine, and particularly a secondary aliphatic amine or tertiary aliphatic amine is preferable. An "aliphatic amine" is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (that is, alkylamines or alkyl alcohol amines), and cyclic amines.

Specific examples of the alkylamines or alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyl diethanolamine and lauryl diethanolamine. Among these, trialkylamines and/or alkyl alcohol amines are preferable.

Examples of the cyclic amines include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A).

Furthermore, in the resist composition for immersion exposure according to the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids, and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids and derivatives thereof include phosphoric acid, phosphonic acid and phosphinic acid, and among these, phosphonic acid is particularly desirable.

Examples of phosphorus oxo acid derivatives include esters in which a hydrogen atom within an above-mentioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of component may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent>

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and dimethyl sulfoxide (DMSO).

These solvents can be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA or PGME with a polar solvent is preferable. The mixing ratio (weight ratio) of the mixed solvent can be appropriately determined, taking into consideration the compatibility of the PGMEA or PGME with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Further, a mixed solvent of PGME with dimethyl sulfoxide is also preferable. In this case, the mixing ratio (former:latter) of such a mixed solvent is preferably from 9:1 to 1:9, more preferably from 8:2 to 2:8, and most preferably from 7:3 to 5:5.

The amount of the component (S) is not particularly limited, and is adjusted appropriately to a concentration that enables application of a coating solution to a substrate in accordance with the thickness of the coating film. In general, the component (S) is used in an amount that yields a solid content for the resist composition that is within a range from 2 to 20% by weight, and preferably from 3 to 15% by weight.

Dissolving of the materials for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

The resist composition for immersion exposure according to the present invention has the properties required of a resist composition used in immersion lithography, namely, favorable lithography properties and favorable properties (particularly hydrophobicity/hydrophilicity) for use within an immersion exposure process, and can therefore be used very favorably for immersion exposure.

By including the component (F), a resist film formed using the resist composition for immersion exposure according to the present invention has a characteristic feature of exhibiting hydrophobicity during immersion exposure, but then exhibiting increased hydrophilicity due to various treatments (such as post exposure baking (PEB) treatment and alkali developing).

That is, a resist film formed using the resist composition for immersion exposure according to the present invention includes the fluorine atom-containing component (F), and therefore has a higher level of hydrophobicity prior to exposure than a resist film that does not include the component (F). Such a resist film formed using the resist composition for immersion exposure according to the present invention exhibits an extremely favorable water tracking ability, which is required when the immersion exposure is performed using a scanning-type immersion exposure apparatus such as that disclosed in Non-Patent Document 1.

When this resist film is subjected to a PEB treatment following immersion exposure, acid is generated from the component (B) in the exposed portions of the resist film, and the action of that acid causes a change in the solubility of the component (A), and eventually that of the resist film, in alkali developing solutions. During this process, the action of this acid causes an increase in the hydrophilicity of the component (F). That is, in the structural unit (f2), the group represented by formula (w-1), the group represented by formula (w-2), the $R^{27}$ group within formula (w-3), and the group represented by formula (w-4) are acid dissociable, dissolution inhibiting groups that dissociate under the action of the acid generated from the component (B) (acid dissociability) but also exhibit an alkali dissolution inhibiting effect that suppresses the solubility of the component (F) in an alkali developing solution. Since all of these acid dissociable, dissolution inhibiting groups are bonded to the oxygen atom (—O—) within the carbonyloxy group, these acid dissociable, dissolution inhibiting groups dissociate under the action of the acid generated from the component (B) when exposure and PEB treatments are conducted, thereby forming a carboxy group and eventually increasing the solubility in an alkali developing solution and the hydrophilicity of the component (F).

Further, when alkali developing is conducted, the exposed portions are removed in the case of the positive composition, and the unexposed portions are removed in the case of the negative composition, in either case leading to the formation of a resist pattern. During this process, the component (F) exhibits increased hydrophilicity when it comes in contact with the alkali developing solution, thereby increasing the hydrophilicity of the surface of the formed resist pattern (i.e., unexposed portions in the case of a positive composition and the exposed portions in the case of a negative composition). In other words, in the component (F), the base dissociable group within the structural unit (f1) dissociates due to hydrolysis caused by the action of an alkali developing solution. Therefore, a hydrophilic group is formed when the base dissociable group dissociates, thereby increasing the hydrophilicity. For example, in the case of a structural unit represented by general formula (f1-1) or (f1-2) described above, the ester bond [—C(=O)—O—] within the structure thereof is decomposed (hydrolyzed) by action of an alkali developing solution, thereby forming a hydrophilic group [—C(=O)—OH]. Especially when the base dissociable group includes a fluorine atom, because the base dissociable group containing a fluorine atom (i.e., portion exhibiting high hydrophobicity) is dissociated, the effects for increasing the hydrophilicity are enhanced.

Conventionally, with the conventional techniques, when a resist film exhibits high hydrophobicity, defects (for example, water mark defects caused by the immersion medium such as water or an alkali developing solution and other defects including bridge-type defects and "Not Open" defects in which portion of, or all of, a hole pattern is not open) are likely to be formed on the surface of resist patterns following developing. However, because a resist film formed using the resist composition for immersion exposure according to the present invention exhibits increased hydrophilicity after immersion exposure, it is possible to reduce the occurrence of these defects. Since the above problems are conspicuous in the positive resist compositions where the unexposed portions of a resist film remain without being removed, the present invention is particularly effective in the case of the positive resist compositions.

The hydrophobicity of a resist film can be evaluated by measuring the contact angle thereof against water, for example, the static contact angle (the contact angle between the surface of a water droplet on the resist film in a horizontal state and the resist film surface), the dynamic contact angle (the contact angle at which a water droplet starts to slide when the resist film is inclined (sliding angle), the contact angle at the front-end point of the water droplet in the sliding direction (advancing angle) and the contact angle at the rear-end point of the water droplet in the sliding direction (receding angle)). For example, the higher the hydrophobicity of a resist film, the larger the static angle, the advancing angle and the receding angle, and the smaller the sliding angle.

As shown in FIG. 1, when a flat surface 2 with a liquid droplet 1 placed thereon is gradually inclined, the advancing angle describes the angle $\theta_1$ between the surface of the liquid droplet at the bottom edge 1a of the liquid droplet 1 and the flat surface 2 when the liquid droplet 1 starts to move (slide) down the flat surface 2. Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the inclination angle $\theta_3$ of the flat surface 2 is the sliding angle.

In the present description, the advancing angle, the receding angle, and the sliding angle are measured in the following manner.

First, a resist composition solution is spin-coated onto a silicon substrate, and is then heated at a temperature of 110° C. for 60 seconds to form a resist film. Subsequently, the contact angles for the resist film can be measured using a commercially available measurement apparatus such as a DROP MASTER-700 (product name, manufactured by Kyowa Interface Science Co. Ltd.), AUTO SLIDING ANGLE: SA-30DM (product name, manufactured by Kyowa Interface Science Co. Ltd.), or AUTO DISPENSER: AD-31 (product name, manufactured by Kyowa Interface Science Co. Ltd.).

For a resist film obtained using the resist composition for immersion exposure according to the present invention, the static contact angle measured prior to immersion exposure and developing is preferably 70 degrees or more, more preferably from 70 to 100 degrees, and most preferably from 75 to 100 degrees. When the static contact angle is at least as large as the lower limit of the above-mentioned range, the suppression effect on substance elution during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other hand, when the static contact angle is no higher than the upper limit of the above-mentioned range, the lithography properties become satisfactory.

For similar reasons, for a resist film obtained using the resist composition for immersion exposure according to the present invention, the receding angle measured prior to immersion exposure and developing is preferably 50 degrees or more, more preferably from 50 to 150 degrees, still more preferably 50 to 130 degrees, and most preferably from 53 to 100 degrees.

Furthermore, for a resist film obtained using the resist composition for immersion exposure according to the present invention, the sliding angle measured prior to immersion exposure and developing is preferably no more than 30 degrees, more preferably from 5 to 30 degrees, still more preferably from 5 to 25 degrees, and most preferably from 5 to 23 degrees. When the sliding angle is no more than the upper limit of the above-mentioned range, the suppression effect on substance elution during the immersion exposure is enhanced. On the other hand, when the sliding angle is at least as large as the lower limit of the above-mentioned range, the lithography properties become satisfactory.

The level of the various angles described above (the dynamic contact angles (advancing angle, receding angle, and sliding angle) and the static contact angle) can be adjusted by the formulation for the resist composition for immersion exposure, for example by varying the type or amount of the component (F) and varying the type of the component (A). For example, the larger the amount of the component (F), the higher the hydrophobicity of the obtained resist composition, and hence, the larger the advancing angle, the receding angle and the static contact angle, and the smaller the sliding angle.

Further, by using the resist composition for immersion exposure according to the present invention, elution of a substance from the resist film during immersion exposure can be suppressed.

That is, as described later in detail, immersion exposure is a method in which exposure (immersion exposure) is conducted in a state where the region between the lens and the resist layer formed on a wafer (which is conventionally filled with air or an inert gas such as nitrogen) is filled with a solvent (an immersion medium) that has a larger refractive index than the refractive index of air. In immersion exposure, when the resist film comes into contact with the immersion medium, elution of substances within the resist film (component (B), component (D), and the like) into the immersion medium (substance elution) occurs. This substance elution causes phenomena such as degeneration of the resist film and change in the refractive index of the immersion medium, thereby adversely affecting the lithography properties. The amount of this substance elution is affected by the properties of the resist film surface (such as the hydrophilicity or hydrophobicity). For example, by enhancing the hydrophobicity of the resist film surface, it is presumed that this substance elution can be reduced.

As a resist film formed using the resist composition for immersion exposure according to the present invention includes the fluorine atom-containing component (F), the resist film exhibits a higher level of hydrophobicity prior to conducting exposure and developing than a resist film that does not include the component (F). Therefore, it is presumed that the resist composition for immersion exposure according to the present invention can suppress substance elution during immersion exposure.

Since substance elution can be suppressed, by using the resist composition for immersion exposure according to the present invention, phenomena such as degeneration of the resist film and change in the refractive index of the immersion medium, which occur during immersion exposure, can be suppressed. Further, since variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

In addition, a resist film formed using the resist composition for immersion exposure according to the present invention swells very little when exposed to water. Therefore, a very fine resist pattern can be formed with a high level of precision.

Also, the resist composition for immersion exposure according to the present invention exhibits excellent lithography properties with respect to sensitivity, resolution, etching resistance and the like, and is capable of forming a resist pattern without any practical problems when used as a resist for immersion exposure. For example, by using the resist composition for immersion exposure according to the present invention, a very fine resist pattern with a size of, for example, 120 nm or smaller can be formed.

The lithography properties are improved particularly when the resist composition for immersion exposure according to the present invention is a positive resist composition. The reason for this observation has not been elucidated yet, but it is presumed due to the following. The acid dissociable, dissolution inhibiting groups (the group represented by formula (w-1), the group represented by formula (w-2), the $R^{27}$ group within formula (w-3), and the group represented by formula (w-4)) in the structural unit (f2) described above are groups that dissociate relatively easily. More specifically, when exposure of a resist film is conducted which is formed using the resist composition for immersion exposure according to the present invention, in the exposed portions, the component (F) also exhibits increased solubility in an alkali developing solution as the component (A), thereby contributing to the increase of the difference in the solubility within the alkali developing solution of the unexposed portions and the exposed portions (i.e., the dissolution contrast). The acid dissociable, dissolution inhibiting groups within the structural unit (f2) dissociate relatively easily, when compared to the acid dissociable, dissolution inhibiting groups typically used as a base component for a conventional chemically amplified positive resist (for example, a branched tertiary alkyl group, an ethylcyclohexyl group, a 2-methyl-2-adamantyl group, a 2-ethyl-2-adamantyl group, or the like). Therefore, the exposed portions exhibit satisfactorily increased solubility in an alkali developing solution even when the post exposure baking (PEB) is conducted at a temperature (for example, 70 to 90° C.) that is lower than that used in conventional cases. Further, it is also presumed that by conducting a PEB treatment at a lower temperature than that used in conventional cases, the diffusion of acid generated in exposed regions to unexposed regions can be suppressed, and as a result, the difference in the solubility within the alkali developing solution of the unexposed portions and the exposed portions (dissolution contrast) is improved.

<<Method of Forming a Resist Pattern>>

The method of forming a resist pattern according to the present invention includes: forming a resist film on a substrate using the resist composition for immersion exposure according to the first aspect of the present invention, subjecting the resist film to immersion exposure, and subjecting the resist film to alkali developing to form a resist pattern.

A preferred example of the method of forming a resist pattern according to the present invention is described below.

Firstly, a resist composition for immersion exposure according to the present invention is applied onto a substrate using a spinner or the like, and a prebake (post applied bake (PAB)) is conducted to form a resist film.

The substrate is not specifically limited and a conventionally known substrate can be used. For example, substrates for electronic components, and such substrates having wiring patterns formed thereon can be mentioned. Specific examples of substrates include a silicon wafer, a copper substrate, a chromium substrate, an iron substrate, an aluminum substrate and a glass substrate. Suitable materials for the wiring pattern include copper, aluminum, nickel, and gold. Further, as the substrate, any one of the above-mentioned substrates provided with an inorganic and/or organic film on the surface thereof may also be used. As the inorganic film, an inorganic antireflection film (inorganic BARC) can be mentioned. As the organic film, an organic antireflection film (organic BARC) and an organic film such as a lower-layer organic film used in a multilayer resist method can be mentioned.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed. The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed.

After formation of a resist film, an organic antireflection film may be provided on the resist film, thereby forming a triple layer laminate consisting of the substrate, the resist film and the antireflection film. The antireflection film provided on top of the resist film is preferably soluble in an alkali developing solution.

The steps up until this point can be conducted by using conventional techniques. The operating conditions and the like are preferably selected appropriately in accordance with the formulation and the characteristics of the resist composition for immersion exposure being used.

Subsequently, the obtained resist film is subjected to selective immersion exposure (Liquid Immersion Lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ laser or the like can be used. The resist composition according to the present invention is effective for KrF and ArF excimer lasers, and is particularly effective for an ArF excimer laser.

The immersion medium preferably exhibits a refractive index larger than the refractive index of air but smaller than the refractive index of the resist film formed from the resist composition for immersion exposure according to the present invention. The refractive index of the immersion medium is not particularly limited as long as it satisfies the above-mentioned requirements.

Examples of this immersion medium that exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and an example of a suitable perfluoroalkylamine compound is perfluorotributylamine (boiling point: 174° C.).

A resist composition for immersion exposure according to the present invention is particularly resistant to any adverse effects caused by water, and because the resulting lithography properties such as the sensitivity and shape of the resist pattern profile are excellent, water is preferably used as the immersion medium in the present invention. Furthermore, water is also preferred in terms of cost, safety, environmental friendliness, and versatility.

Subsequently, following completion of the immersion exposure step, post exposure baking (PEB) is conducted. A PEB treatment is typically conducted at a temperature of 80 to 150° C. for 40 to 120 seconds, preferably 60 to 90 seconds.

Subsequently, developing is conducted using an alkali developing solution composed of an aqueous alkali solution such as a 0.1 to 10% by weight aqueous solution of tetramethylammonium hydroxide (TMAH).

Thereafter, a water rinse is preferably conducted with pure water. This water rinse can be conducted, for example, by dripping or spraying water onto the surface of the substrate while rotating the substrate, and washes away the developing solution and those portions of the resist composition for immersion exposure that have been dissolved by the developing solution.

By subsequently drying the resist, a resist pattern is obtained in which the resist film (the coating of the resist composition for immersion exposure) has been patterned into a shape faithful to the mask pattern.

<<Fluorine-Containing Polymeric Compound>>

The fluorine-containing polymeric compound according to the present invention is a fluorine-containing polymeric compound including the structural unit (f1) having a base dissociable group and the structural unit (f2) represented by general formula (f2-1) shown below, and is the same as the component (F) described above in relation to the resist composition for immersion exposure according to the first aspect of the present invention.

[Chemical Formula 61]

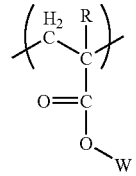

(f2-1)

wherein R represents a hydrogen atom, a lower alkyl group or a halogenated lower alkyl group; and W is a group represented by any one of general formulas (w-1) to (w-4).

[Chemical Formula 62]

$$\begin{array}{c} \diagdown \\ \diagup C \diagdown R^{23} \\ R^{21} \quad R^{22} \end{array} \quad (w\text{-}1)$$

$$\begin{array}{c} \diagdown \\ \diagup C \diagdown R^{26} \\ R^{24} \quad R^{25} \end{array} \quad (w\text{-}2)$$

$$\diagdown R^{28}-\underset{\underset{O}{\|}}{C}-O-R^{27} \quad (w\text{-}3)$$

$$-\underset{\underset{R^{30'}}{|}}{\overset{\overset{R^{30}}{|}}{C}}-O-(CH_2)_n-R^{29} \quad (w\text{-}4)$$

In general formula (w-1), $R^{21}$ represents an alkyl group of 2 or more carbon atoms, and $R^{22}$ and $R^{23}$ are bonded to each other to form an aliphatic monocyclic group of 7 or more carbon atoms. In general formula (w-2), $R^{24}$ represents a branched alkyl group of 3 or more carbon atoms, and $R^{25}$ and $R^{26}$ are bonded to each other to form an aliphatic cyclic group. In general formula (w-3), $R^{27}$ represents an acid dissociable, dissolution inhibiting group, and $R^{28}$ represents a divalent linking group. In general formula (w-4), $R^{29}$ represents a linear or branched alkyl group or an aliphatic cyclic group; n represents an integer of 0 to 3; $R^{30}$ and $R^{30'}$ each independently represent a linear or branched alkyl group or a hydrogen atom; and $R^{29}$ and $R^{30}$ may be bonded to each other to form an aliphatic cyclic group.

The fluorine-containing compound described above is a novel compound that was essentially unknown in the art.

Further, the fluorine-containing compound can be used favorably as an additive for a resist composition, and a resist composition containing the added fluorine-containing compound is useful as a resist composition for immersion exposure.

There are no particular limitations on the resist composition containing the added fluorine-containing compound, provided the composition can be used for immersion exposure, although a chemically amplified resist composition including a base component that exhibits changed solubility in an alkali developing solution under the action of acid, and an acid generator component that generates acid upon irradiation is ideal.

The fluorine-containing compound of the present invention is particularly ideal for use as an additive within the resist composition for immersion exposure.

EXAMPLES

As follows is a more detailed description of the present invention based on a series of examples, although the scope of the present invention is in no way limited by these examples.

Synthesis Example 1

Synthesis of Compound (5)

61 g (600 mmol) of triethylamine and 64 g (418 mmol) of methyl bromoacetate were added to 300 ml of a THF solution containing 30 g (348 mmol) of methacrylic acid in a nitrogen atmosphere at 0° C., and the temperature was elevated to room temperature, followed by stirring for 3 hours. After conducting thin-layer chromatography (TLC) to confirm that the raw materials had been consumed, the reaction solution was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent, thereby obtaining 47 g of a compound (5-1) in the form of a colorless liquid (yield: 85%).

Subsequently, 700 ml of a THF solution containing 30 g (190 mmol) of the compound (5-1) was prepared, and 700 ml of a 2.38% by weight aqueous solution of TMAH was added thereto, followed by stirring at room temperature for 3 hours. After conducting thin-layer chromatography (TLC) to confirm that the raw materials had been consumed, THF was distilled off under reduced pressure. Then, the resulting aqueous reaction solution was cooled to 0° C., and 50 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 26 g of a compound (5-2) in the form of a colorless liquid (yield: 95%).

Subsequently, 17 g (118 mmol) of the compound (5-2) was added to 100 ml of a THF solution containing 27 g (177 mmol) of 2,2,3,3,3-pentafluoro-1-propanol, 37 g (195 mmol) of ethyldiisopropylaminocarbodiimide (EDCI) hydrochloride and 0.6 g (5 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 19 g of a compound (5) in the form of a colorless liquid (yield: 58%).

[Chemical Formula 63]

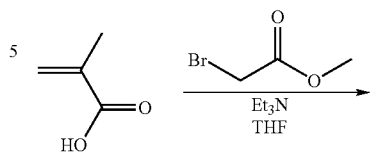

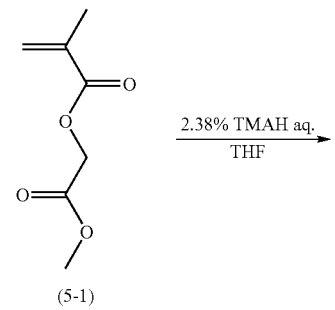

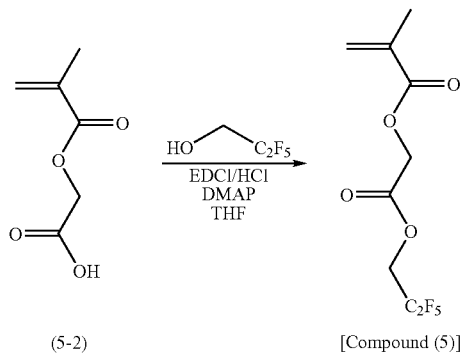

Synthesis Example 2

Synthesis of Compound (4)

40 g (277.5 mmol) of the compound (5-2) was added to 350 ml of a THF solution containing 95.0 g (360.8 mmol) of 3,3,4,4,5,5,6,6,6-nonafluorohexanol, 79.8 g (416.0 mmol) of ethyldiisopropylaminocarbodiimide (EDCI) hydrochloride and 1.7 g (13.8 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 99.6 g of a compound (4) in the form of a colorless liquid.

[Chemical Formula 64]

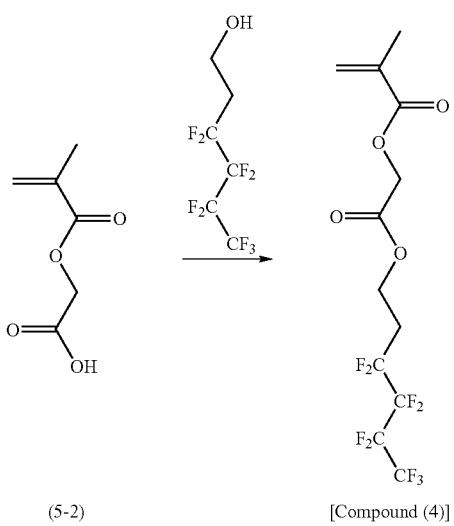

The obtained compound (4) was analyzed by $^1$H-NMR. The results are shown below.

$^1$H-NMR (CDCl$_3$) [ppm]: 6.22 (s, 1H, Hb), 5.69 (s, 1H, Hb), 4.70 (s, 2H, Hc), 4.50 (t, 2H, Hd), 2.56-2.44 (m, 2H, He), 2.00 (s, 3H, Ha).

[Chemical Formula 65]

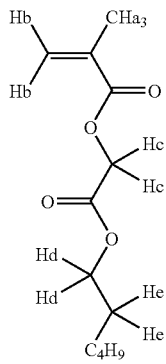

Synthesis Example 3

Synthesis of Compound (7)

45 g (333 mmol) of potassium carbonate and 45 g (296 mmol) of methyl bromoacetate were added to 450 ml of an acetone solution containing 46 g (269 mmol) of 2-vinylnaphthol in a nitrogen atmosphere at 0° C., and then the temperature was elevated to room temperature, followed by stirring for 3 hours. After conducting thin-layer chromatography (TLC) to confirm that the raw materials had been consumed, the reaction mixture was subjected to filtration, and the obtained filtrate was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent. The resulting crude product was purified by recrystallization (using an n-heptane/ethyl acetate mixture), thereby obtaining 54 g of a compound (7-1) in the form of a colorless solid (yield: 83%).

Subsequently, 450 ml of a THF solution containing 54 g (222 mmol) of the compound (7-1) was prepared, and 200 ml of a 25% by weight aqueous solution of TMAH was added thereto, followed by stirring at room temperature for 3 hours. After conducting thin-layer chromatography (TLC) to confirm that the raw materials had been consumed, THF was distilled off under reduced pressure. Then, the resulting aqueous reaction solution was cooled to 0° C., and 55 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 50 g of a compound (7-2) in the form of a colorless solid (yield: 98%).

Subsequently, 50 g (222 mmol) of the compound (7-2) was added to 400 ml of a THF solution containing 33 g (222 mmol) of 2,2,3,3,3-pentafluoro-1-propanol, 51 g (266 mmol) of ethyldiisopropylaminocarbodiimide (EDCI) hydrochloride and 1 g (11 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by recrystallization (using an n-heptane/ethyl acetate mixture), thereby obtaining 59 g of a compound (7) in the form of a colorless solid (yield: 74%).

[Chemical Formula 66]

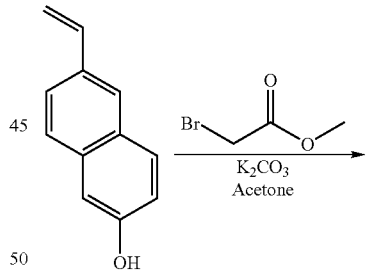

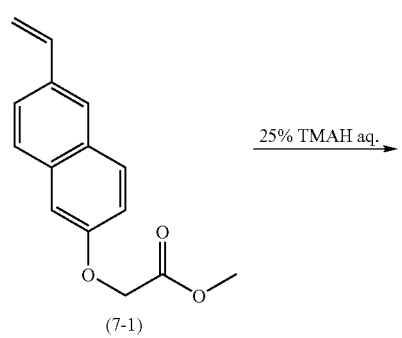

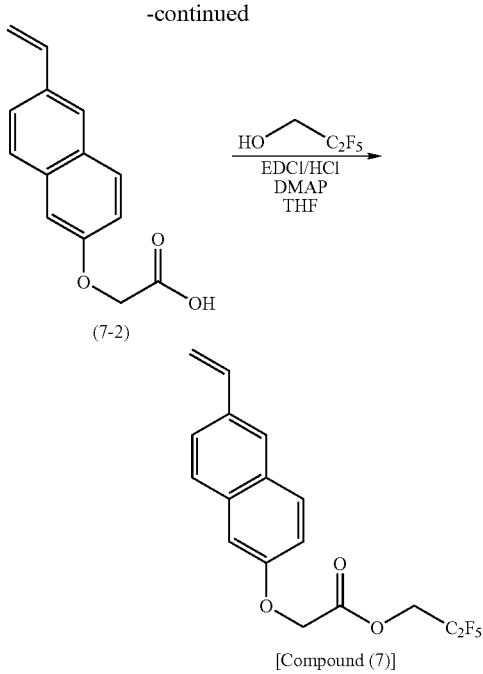

[Compound (7)]

Synthesis Example 4

Synthesis of Compound (8)

20 g (139 mmol) of the compound (5-2) was added to 200 ml of a THF solution containing 33.3 g (167 mmol) of 2,2,3,3,4,4,4-heptafluorobutanol, 38.3 g (200 mmol) of ethyldiisopropylaminocarbodiimide (EDCI) hydrochloride and 0.85 g of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 23 g of a compound (8) in the form of a colorless liquid.

[Chemical Formula 67]

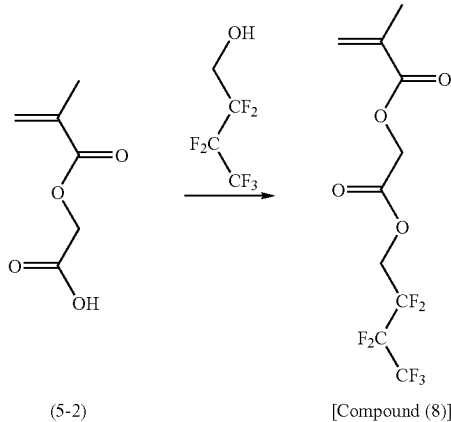

The obtained compound (8) was analyzed by $^1$H-NMR. The results are shown below.

$^1$H-NMR (CDCl$_3$) [ppm]: 6.24 (s, 1H, Hb), 5.70 (s, 1H, Hb), 4.79 (s, 2H, Hc), 4.60-4.66 (t, 2H, Hd), 1.99 (s, 3H, Ha).

[Chemical Formula 68]

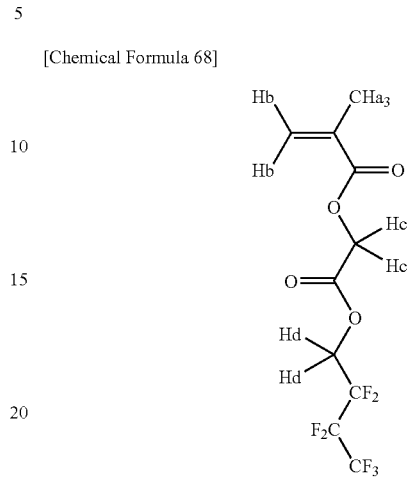

Synthesis Example 5

Synthesis of Compound (9)

26 g (180.39 mmol) of the compound (5-2) was added to 200 ml of a THF solution containing 23.48 g (234.5 mmol) of 2,2,2-trifluoroethanol, 51.9 g (270.6 mmol) of ethyldiisopropylaminocarbodiimide (EDCI) hydrochloride and 0.11 g (0.9 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a compound (9) in the form of a colorless liquid.

[Chemical Formula 69]

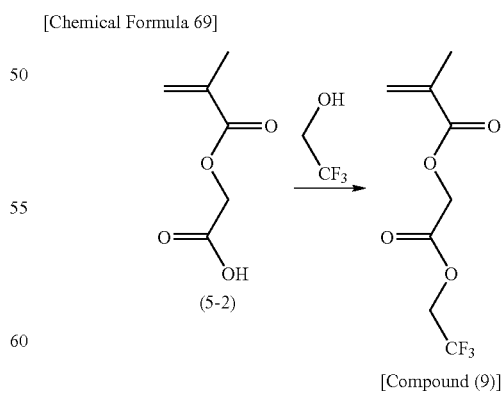

The obtained compound (9) was analyzed by $^1$H-NMR. The results are shown below.

$^1$H-NMR (CDCl$_3$) [ppm]: 6.24 (s, 1H, Hb), 5.70 (s, 1H, Hb), 4.80 (s, 2H, Hc), 4.60-4.51 (m, 2H, Hd), 1.99 (s, 3H, Ha).

[Chemical Formula 70]

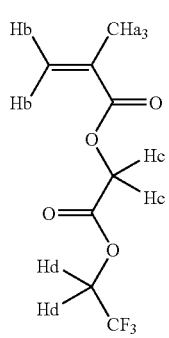

[Chemical Formula 72]

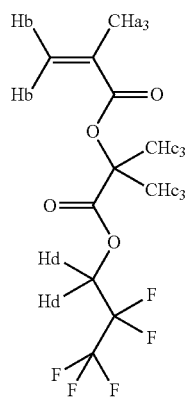

Synthesis Example 6

Synthesis of Compound (10)

25 g (145.2 mmol) of the compound (10-1) was added to 200 ml of a THF solution containing 30.1 g (200 mmol) of 2,2,3,3,3-pentafluoropropanol, 47.9 g (250 mmol) of ethyldiisopropylaminocarbodiimide (EDCI) hydrochloride and 1.0 g of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 22 g of a compound (10) in the form of a colorless liquid.

Synthesis Example 7

Synthesis of Compound (11)

25 g (145.2 mmol) of the compound (10-1) was added to 230 ml of a THF solution containing 36.0 g (215.0 mmol) of 1,1,1,3,3,3-hexafluoro-2-propanol, 47.4 g (250.0 mmol) of ethyldiisopropylaminocarbodiimide (EDCI) hydrochloride and 0.10 g (0.8 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 10 g of a compound (11) in the form of a colorless liquid.

[Chemical Formula 71]

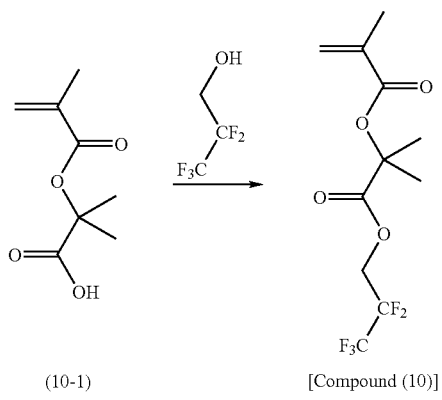

[Chemical Formula 73]

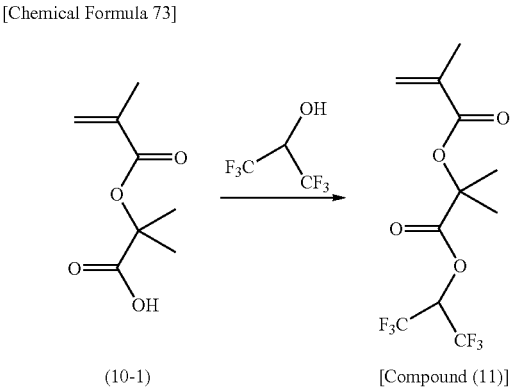

The obtained compound (10) was analyzed by $^1$H-NMR. The results are shown below.

$^1$H-NMR (CDCl$_3$) [ppm]: 6.16 (s, 1H, Hb), 5.50 (s, 1H, Hb), 4.57 (t, 2H, Hd), 1.92 (s, 3H, Ha), 1.65 (s, 6H, Hc).

The obtained compound (11) was analyzed by $^1$H-NMR. The results are shown below.

$^1$H-NMR (CDCl$_3$) [ppm]: 6.16 (s, 1H, Hb), 5.78-5.71 (m, 1H, Hd), 5.65 (s, 1H, Hb), 1.97 (s, 3H, Ha), 1.69 (s, 6H, Hc).

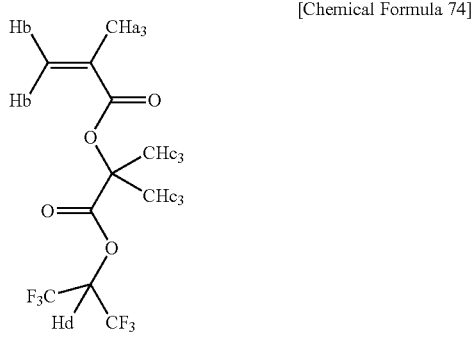

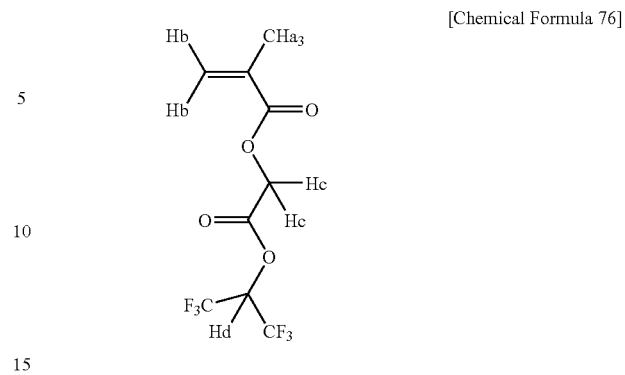

Synthesis Example 9

Synthesis of Polymeric Compound 1

71.80 g (259.99 mmol) of the compound (5) and 19.41 g (86.66 mmol) of the compound (6) were added to a three-necked flask equipped with a thermometer and a reflux tube and were dissolved by adding 136.82 g of tetrahydrofuran thereto. Then, 20.80 mmol of dimethyl 2,2'-azobis(isobutyrate) (product name: V-601) as a polymerization initiator was added and dissolved in the resulting solution. The resulting solution was added dropwise to 76.00 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 32 g of a polymeric compound 1 as an objective compound.

With respect to the polymeric compound 1, the weight average molecular weight (Mw) and the dispersity (Mw/Mn) were determined by the polystyrene equivalent value as measured by gel permeation chromatography (GPC). As a result, it was found that the weight average molecular weight was 25,500, and the dispersity was 1.56. Further, the polymeric compound 1 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=77.3/22.7.

Synthesis Example 8

Synthesis of Compound (12)

20 g (138.8 mmol) of the compound (5-2) was added to 200 ml of a THF solution containing 30.3 g (180.4 mmol) of 1,1,1,3,3,3-hexafluoro-2-propanol, 39.9 g (208.1 mmol) of ethyldiisopropylaminocarbodiimide (EDCI) hydrochloride and 0.08 g (0.7 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a compound (12) in the form of a colorless liquid.

[Chemical Formula 75]

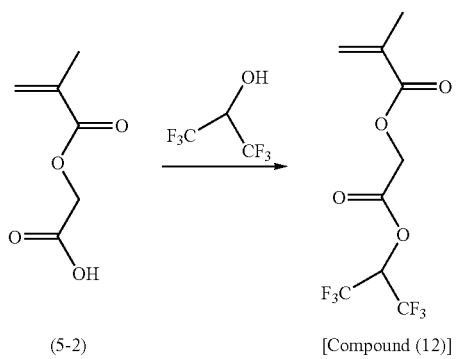

[Chemical Formula 77]

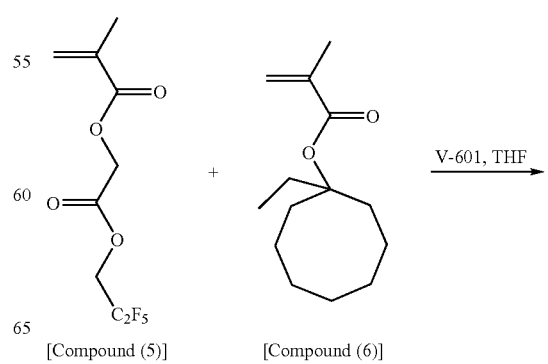

The obtained compound (12) was analyzed by $^1$H-NMR. The results are shown below.

$^1$H-NMR (CDCl$_3$) [ppm]: 6.21 (s, 1H, Hb), 5.83-5.76 (m, 1H, Hd), 5.70 (s, 1H, Hb), 4.89 (s, 2H, Hc), 2.00 (s, 3H, Ha).

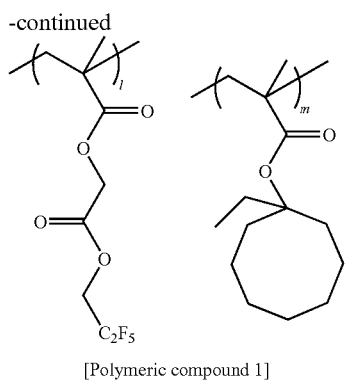

[Polymeric compound 1]

Synthesis Example 10

Synthesis of Polymeric Compound 2

70.00 g (253.48 mmol) of the compound (5) and 22.08 g (98.58 mmol) of the compound (6) were added to a three-necked flask equipped with a thermometer and a reflux tube and were dissolved by adding 38.12 g of tetrahydrofuran thereto. Then, 70.41 mmol of dimethyl 2,2'-azobis(isobutyrate) (product name: V-601) as a polymerization initiator was added and dissolved in the resulting solution. The resulting solution was added dropwise to 76.73 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 53 g of a polymeric compound 2 as an objective compound.

With respect to the polymeric compound 2, the weight average molecular weight (Mw) and the dispersity (Mw/Mn) were determined by the polystyrene equivalent value as measured by gel permeation chromatography (GPC). As a result, it was found that the weight average molecular weight was 13,100, and the dispersity was 1.31. Further, the structure of the polymeric compound 2 was similar to that of the polymeric compound 1 except the composition of the copolymer (ratio (molar ratio) of the respective structural units within the structural formula). It was found that the composition of the copolymer of the polymeric compound 2, as determined by carbon 13 nuclear magnetic resonance spectroscopy (600 MHz, $^{13}$C-NMR), was l/m=76.6/23.4.

Synthesis Example 11

Synthesis of Polymeric Compound 3

20.00 g (72.42 mmol) of the compound (5) and 24.33 g (108.63 mmol) of the compound (6) were added to a three-necked flask equipped with a thermometer and a reflux tube and were dissolved by adding 66.50 g of tetrahydrofuran thereto. Then, 36.21 mmol of dimethyl 2,2'-azobis(isobutyrate) (product name: V-601) as a polymerization initiator was added and dissolved in the resulting solution. The resulting solution was added dropwise to 36.94 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 22 g of a polymeric compound 3 as an objective compound.

With respect to the polymeric compound 3, the weight average molecular weight (Mw) and the dispersity (Mw/Mn) were determined by the polystyrene equivalent value as measured by gel permeation chromatography (GPC). As a result, it was found that the weight average molecular weight was 11,900, and the dispersity was 1.44. Further, the structure of the polymeric compound 3 was similar to that of the polymeric compound 1 except the composition of the copolymer (ratio (molar ratio) of the respective structural units within the structural formula). It was found that the composition of the copolymer of the polymeric compound 3, as determined by carbon 13 nuclear magnetic resonance spectroscopy (600 MHz, $^{13}$C-NMR), was l/m=41.3/58.7.

Synthesis Example 12

Synthesis of Polymeric Compound 4

15.00 g (54.32 mmol) of the compound (5) and 4.06 g (18.11 mmol) of the compound (6) were added to a three-necked flask equipped with a thermometer and a reflux tube and were dissolved by adding 28.59 g of tetrahydrofuran thereto. Then, 1.09 mmol of dimethyl 2,2'-azobis(isobutyrate) (product name: V-601) as a polymerization initiator was added and dissolved in the resulting solution. The resulting solution was added dropwise to 15.88 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 3 g of a polymeric compound 4 as an objective compound.

With respect to the polymeric compound 4, the weight average molecular weight (Mw) and the dispersity (Mw/Mn) were determined by the polystyrene equivalent value as measured by gel permeation chromatography (GPC). As a result, it was found that the weight average molecular weight was 87,100, and the dispersity was 1.62. Further, the structure of the polymeric compound 4 was similar to that of the polymeric compound 1 except the composition of the copolymer (ratio (molar ratio) of the respective structural units within the structural formula). It was found that the composition of the copolymer of the polymeric compound 4, as determined by carbon 13 nuclear magnetic resonance spectroscopy (600 MHz, $^{13}$C-NMR), was l/m=76.3/23.7.

Synthesis Example 13

Synthesis of Polymeric Compound 5

12.35 g (44.72 mmol) of the compound (5) and 6.68 g (29.81 mmol) of the compound (6) were added to a three-necked flask equipped with a thermometer and a reflux tube and were dissolved by adding 28.55 g of tetrahydrofuran thereto. Then, 5.22 mmol of dimethyl 2,2'-azobis(isobutyrate) (product name: V-601) as a polymerization initiator was added and dissolved in the resulting solution. The resulting solution was added dropwise to 15.85 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 6 g of a polymeric compound 5 as an objective compound.

With respect to the polymeric compound 5, the weight average molecular weight (Mw) and the dispersity (Mw/Mn) were determined by the polystyrene equivalent value as measured by gel permeation chromatography (GPC). As a result, it was found that the weight average molecular weight was 28,300, and the dispersity was 1.41. Further, the structure of the polymeric compound 5 was similar to that of the polymeric compound 1 except the composition of the copolymer (ratio (molar ratio) of the respective structural units within the structural formula). It was found that the composition of the copolymer of the polymeric compound 5, as determined by carbon 13 nuclear magnetic resonance spectroscopy (600 MHz, $^{13}$C-NMR), was l/m=59.5/40.5.

Synthesis Example 14

Synthesis of Polymeric Compound 6

15.00 g (54.32 mmol) of the compound (5) and 5.21 g (23.28 mmol) of the compound (6) were added to a three-necked flask equipped with a thermometer and a reflux tube and were dissolved by adding 114.52 g of tetrahydrofuran thereto. Then, 4.66 mmol of dimethyl 2,2'-azobis(isobutyrate) (product name: V-601) as a polymerization initiator was added and dissolved in the resulting solution. The solution was stirred while being heated at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 5.57 g of a polymeric compound 6 as an objective compound.

With respect to the polymeric compound 6, the weight average molecular weight (Mw) and the dispersity (Mw/Mn) were determined by the polystyrene equivalent value as measured by gel permeation chromatography (GPC). As a result, it was found that the weight average molecular weight was 15,000, and the dispersity was 1.37. Further, the structure of the polymeric compound 6 was similar to that of the polymeric compound 1 except the composition of the copolymer (ratio (molar ratio) of the respective structural units within the structural formula). It was found that the composition of the copolymer of the polymeric compound 6, as determined by carbon 13 nuclear magnetic resonance spectroscopy (600 MHz, $^{13}$C-NMR), was l/m=74.5/25.5.

Synthesis Example 15

Synthesis of Polymeric Compound 7

15.00 g (38.44 mmol) of the compound (4) and 3.69 g (16.47 mmol) of the compound (6) were added to a three-necked flask equipped with a thermometer and a reflux tube and were dissolved by adding 105.91 g of tetrahydrofuran thereto. Then, 3.30 mmol of dimethyl 2,2'-azobis(isobutyrate) (product name: V-601) as a polymerization initiator was added and dissolved in the resulting solution. The solution was stirred while being heated at 80° C. for 6 hours in a nitrogen atmosphere, and was then cooled to room temperature. The resulting polymer solution was concentrated under reduced pressure, and dropwise added to an excess amount of n-heptane or a mixed solution of n-heptane and isopropanol to thereby precipitate a polymer. Then, the precipitated polymer was separated by filtration, followed by washing and drying, thereby obtaining 4.26 g of a polymeric compound 7 as an objective compound.

With respect to the polymeric compound 7, the weight average molecular weight (Mw) and the dispersity (Mw/Mn) were determined by the polystyrene equivalent value as measured by gel permeation chromatography (GPC). As a result, it was found that the weight average molecular weight was 16,000, and the dispersity was 1.38. Further, the polymeric compound 7 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=77.2/22.8.

[Chemical Formula 78]

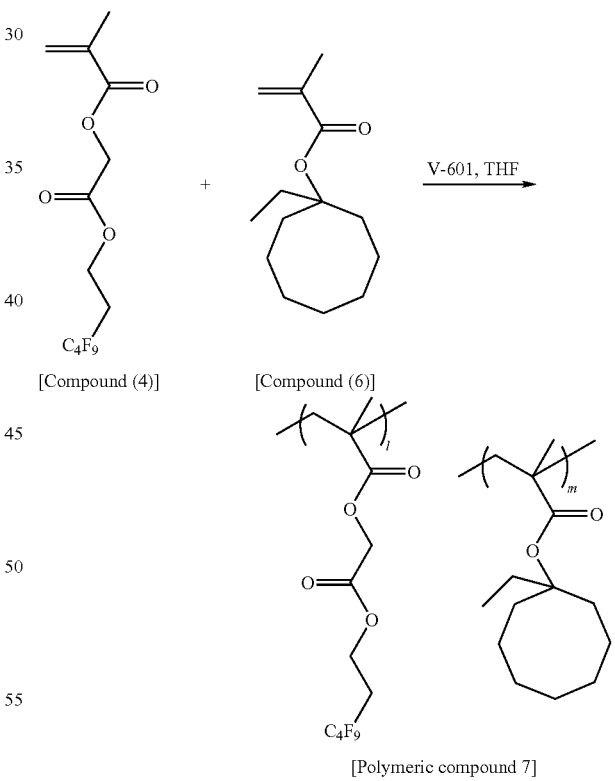

[Compound (4)]   [Compound (6)]

[Polymeric compound 7]

Synthesis Example 16

Synthesis of Polymeric Compound 8

14.82 g (41.13 mmol) of the compound (7) and 4.96 g (22.15 mmol) of the compound (6) were added to a three-necked flask equipped with a thermometer and a reflux tube and were dissolved by adding 112.69 g of tetrahydrofuran thereto. Then, 3.16 mmol of dimethyl 2,2'-azobis(isobutyrate) (product name: V-601) as a polymerization initiator was added and dissolved in the resulting solution. The solution was stirred while being heated at 80° C. for 6 hours in a nitrogen atmosphere, and was then cooled to room temperature. The resulting polymer solution was concentrated under reduced pressure, and dropwise added to an excess amount of n-heptane or a mixed solution of n-heptane and isopropanol to thereby precipitate a polymer. Then, the precipitated polymer was separated by filtration, followed by washing and drying, thereby obtaining 3.75 g of a polymeric compound 8 as an objective compound.

With respect to the polymeric compound 8, the weight average molecular weight (Mw) and the dispersity (Mw/Mn) were determined by the polystyrene equivalent value as measured by gel permeation chromatography (GPC). As a result, it was found that the weight average molecular weight was 15,100, and the dispersity was 1.27. Further, the polymeric compound 8 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=75.0/25.0.

[Chemical Formula 79]

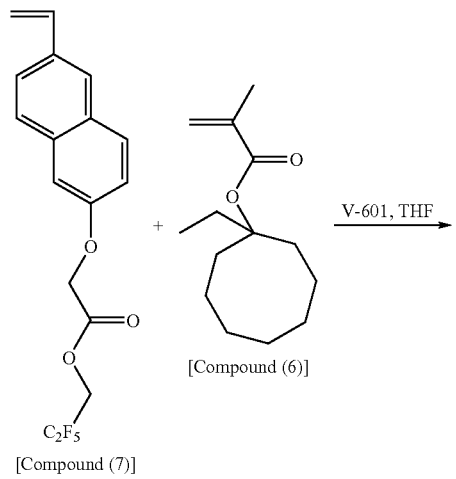

[Compound (7)]       [Compound (6)]

[Polymeric compound 8]

Synthesis Example 17

Synthesis of Polymeric Compound 9

20.00 g (88.44 mmol) of the compound (9) and 6.60 g (29.48 mmol) of the compound (6) were added to a three-necked flask equipped with a thermometer and a reflux tube and were dissolved by adding 39.90 g of tetrahydrofuran thereto. Then, 23.58 mmol of dimethyl 2,2'-azobis(isobutyrate) (product name: V-601) as a polymerization initiator was added and dissolved in the resulting solution. The resulting solution was added dropwise to 22.17 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 13 g of a polymeric compound 9 as an objective compound.

With respect to the polymeric compound 9, the weight average molecular weight (Mw) and the dispersity (Mw/Mn) were determined by the polystyrene equivalent value as measured by gel permeation chromatography (GPC). As a result, it was found that the weight average molecular weight was 13,800, and the dispersity was 1.50. Further, the polymeric compound 9 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=77.6/22.4.

[Chemical Formula 80]

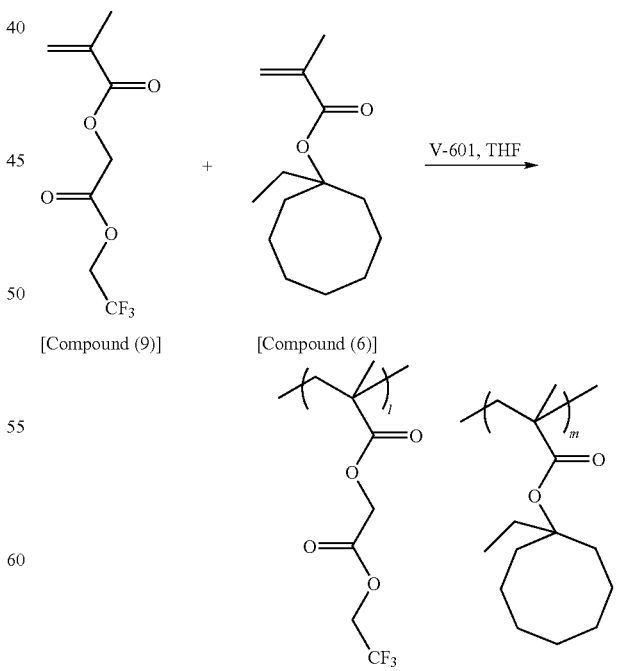

[Compound (9)]       [Compound (6)]

[Polymeric compound 9]

Synthesis Example 18

Synthesis of Polymeric Compound 10

13.65 g (60.36 mmol) of the compound (9) and 10.20 g (45.53 mmol) of the compound (6) were added to a three-necked flask equipped with a thermometer and a reflux tube and were dissolved by adding 35.78 g of tetrahydrofuran thereto. Then, 21.18 mmol of dimethyl 2,2'-azobis(isobutyrate) (product name: V-601) as a polymerization initiator was added and dissolved in the resulting solution. The resulting solution was added dropwise to 19.87 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 14 g of a polymeric compound 10 as an objective compound.

With respect to the polymeric compound 10, the weight average molecular weight (Mw) and the dispersity (Mw/Mn) were determined by the polystyrene equivalent value as measured by gel permeation chromatography (GPC). As a result, it was found that the weight average molecular weight was 14,100, and the dispersity was 1.39. Further, the structure of the polymeric compound 10 was similar to that of the polymeric compound 9 except for the composition of the copolymer (ratio (molar ratio) of the respective structural units within the structural formula). It was found that the composition of the copolymer of the polymeric compound 10, as determined by carbon 13 nuclear magnetic resonance spectroscopy (600 MHz, $^{13}$C-NMR), was l/m=60.3/39.7.

Synthesis Example 19

Synthesis of Polymeric Compound 11

20.00 g (61.32 mmol) of the compound (8) and 5.34 g (23.85 mmol) of the compound (6) were added to a three-necked flask equipped with a thermometer and a reflux tube and were dissolved by adding 38.01 g of tetrahydrofuran thereto. Then, 17.03 mmol of dimethyl 2,2'-azobis(isobutyrate) (product name: V-601) as a polymerization initiator was added and dissolved in the resulting solution. The resulting solution was added dropwise to 21.17 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 14 g of a polymeric compound 11 as an objective compound.

With respect to the polymeric compound 11, the weight average molecular weight (Mw) and the dispersity (Mw/Mn) were determined by the polystyrene equivalent value as measured by gel permeation chromatography (GPC). As a result, it was found that the weight average molecular weight was 17,100, and the dispersity was 1.35. Further, the polymeric compound 11 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=75.5/24.5.

[Chemical Formula 81]

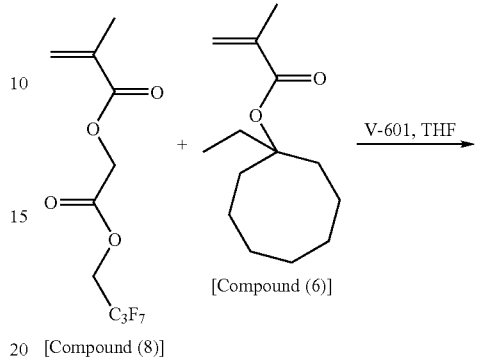

[Compound (8)]

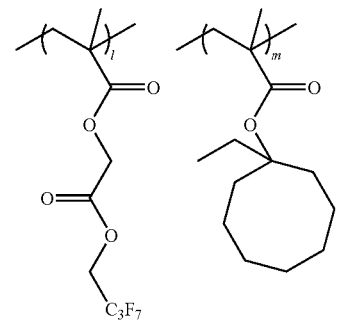

[Polymeric compound 11]

Synthesis Example 20

Synthesis of Polymeric Compound 12

10.45 g (32.04 mmol) of the compound (8) and 5.41 g (24.17 mmol) of the compound (6) were added to a three-necked flask equipped with a thermometer and a reflux tube and were dissolved by adding 23.79 g of tetrahydrofuran thereto. Then, 11.24 mmol of dimethyl 2,2'-azobis(isobutyrate) (product name: V-601) as a polymerization initiator was added and dissolved in the resulting solution. The resulting solution was added dropwise to 13.22 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 3 g of a polymeric compound 12 as an objective compound.

With respect to the polymeric compound 12, the weight average molecular weight (Mw) and the dispersity (Mw/Mn) were determined by the polystyrene equivalent value as measured by gel permeation chromatography (GPC). As a result, it was found that the weight average molecular weight was 23,700, and the dispersity was 1.51. Further, the structure of the polymeric compound 12 was similar to that of the polymeric compound 11 except the composition of the copolymer (ratio (molar ratio) of the respective structural units within the structural formula). It was found that the composition of the copolymer of the polymeric compound 12, as determined by carbon 13 nuclear magnetic resonance spectroscopy (600 MHz, $^{13}$C-NMR), was l/m=60.5/39.5.

Synthesis Example 21

Synthesis of Polymeric Compound 13

12.40 g (40.76 mmol) of the compound (10) and 3.04 g (13.59 mmol) of the compound (6) were added to a three-necked flask equipped with a thermometer and a reflux tube and were dissolved by adding 23.16 g of tetrahydrofuran thereto. Then, 10.87 mmol of dimethyl 2,2'-azobis(isobutyrate) (product name: V-601) as a polymerization initiator was added and dissolved in the resulting solution. The resulting solution was added dropwise to 12.87 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 3 g of a polymeric compound 13 as an objective compound.

With respect to the polymeric compound 13, the weight average molecular weight (Mw) and the dispersity (Mw/Mn) were determined by the polystyrene equivalent value as measured by gel permeation chromatography (GPC). As a result, it was found that the weight average molecular weight was 21,100, and the dispersity was 1.23. Further, the polymeric compound 13 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=77.6/22.4.

[Chemical Formula 82]

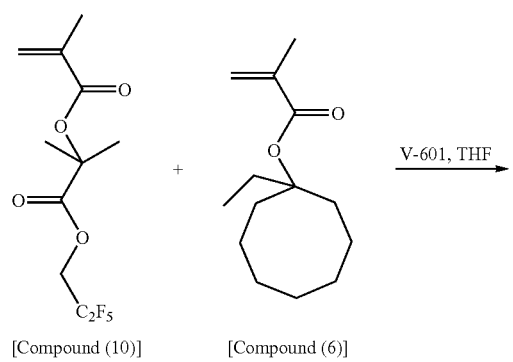

[Compound (10)]   [Compound (6)]

V-601, THF

-continued

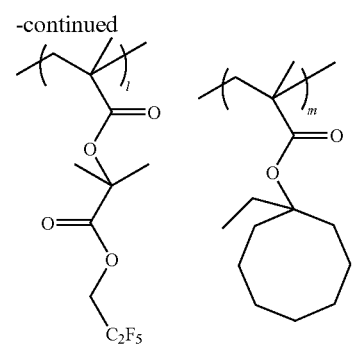

[Polymeric compound 13]

Synthesis Example 22

Synthesis of Polymeric Compound 14

10.11 g (31.38 mmol) of the compound (11) and 2.34 g (10.46 mmol) of the compound (6) were added to a three-necked flask equipped with a thermometer and a reflux tube and were dissolved by adding 18.68 g of tetrahydrofuran thereto. Then, 8.37 mmol of dimethyl 2,2'-azobis(isobutyrate) (product name: V-601) as a polymerization initiator was added and dissolved in the resulting solution. The resulting solution was added dropwise to 10.37 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 2 g of a polymeric compound 14 as an objective compound.

With respect to the polymeric compound 14, the weight average molecular weight (Mw) and the dispersity (Mw/Mn) were determined by the polystyrene equivalent value as measured by gel permeation chromatography (GPC). As a result, it was found that the weight average molecular weight was 29,800, and the dispersity was 1.17. Further, the polymeric compound 14 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=75.7/24.3.

[Chemical Formula 83]

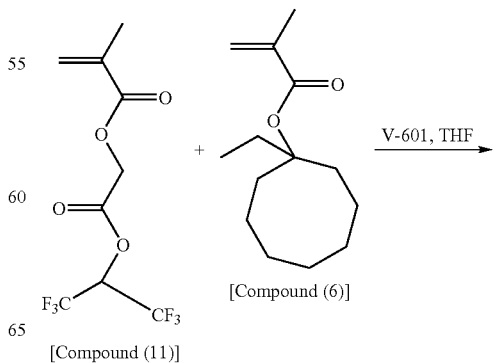

[Compound (11)]   [Compound (6)]

V-601, THF

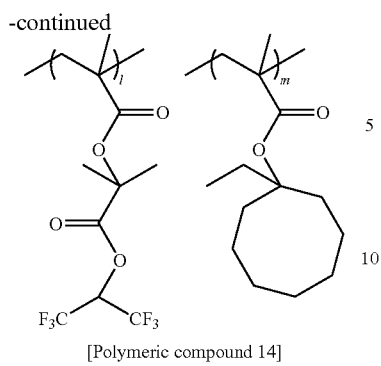

[Polymeric compound 14]

Synthesis Example 23

Synthesis of Polymeric Compound 15

15.00 g (50.99 mmol) of the compound (12) and 3.81 g (17.00 mmol) of the compound (6) were added to a three-necked flask equipped with a thermometer and a reflux tube and were dissolved by adding 28.22 g of tetrahydrofuran thereto. Then, 13.60 mmol of dimethyl 2,2'-azobis(isobutyrate) (product name: V-601) as a polymerization initiator was added and dissolved in the resulting solution. The resulting solution was added dropwise to 15.67 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise added to an excess amount of n-heptane to thereby precipitate a polymer. Then, the precipitated polymeric compound was separated by filtration, followed by washing and drying, thereby obtaining 10 g of a polymeric compound 15 as an objective compound.

With respect to the polymeric compound 15, the weight average molecular weight (Mw) and the dispersity (Mw/Mn) were determined by the polystyrene equivalent value as measured by gel permeation chromatography (GPC). As a result, it was found that the weight average molecular weight was 19,500, and the dispersity was 1.45. Further, the polymeric compound 15 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m=76.9/23.1.

[Chemical Formula 84]

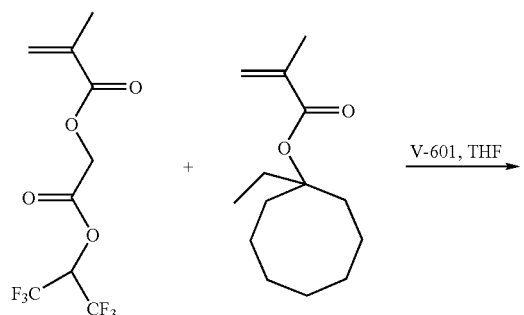

[Compound (12)]   [Compound (6)]

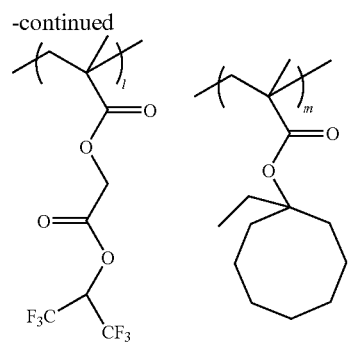

[Polymeric compound 15]

Synthesis Example 24

Synthesis of Polymeric Compound 16

10.30 g (35.02 mmol) of the compound (12) and 5.92 g (26.42 mmol) of the compound (6) were added to a three-necked flask equipped with a thermometer and a reflux tube and were dissolved by adding 24.33 g of tetrahydrofuran thereto. Then, 12.29 mmol of dimethyl 2,2'-azobis(isobutyrate) (product name: V-601) as a polymerization initiator was added and dissolved in the resulting solution. The resulting solution was added dropwise to 13.52 g of tetrahydrofuran that was heated to 67° C. under a nitrogen atmosphere over 3 hours, and was then subjected to a polymerization reaction. Following completion of the dropwise addition, the reaction solution was stirred while being heated for 4 hours, and was then cooled to room temperature. The resulting polymer solution was dropwise-added to an excess amount of n-heptane to thereby precipitate a polymer. Then, the precipitated polymeric compound was separated by filtration, followed by washing and drying, thereby obtaining 1 g of a polymeric compound 16 as an objective compound.

With respect to the polymeric compound 16, the weight average molecular weight (Mw) and the dispersity (Mw/Mn) were determined by the polystyrene equivalent value as measured by gel permeation chromatography (GPC). As a result, it was found that the weight average molecular weight was 38,600, and the dispersity was 1.57. Further, the structure of the polymeric compound 16 was similar to that of the polymeric compound 15 except the composition of the copolymer (ratio (molar ratio) of the respective structural units within the structural formula). It was found that the composition of the copolymer of the polymeric compound 16, as determined by carbon 13 nuclear magnetic resonance spectroscopy (600 MHz, $^{13}$C-NMR), was l/m=61.7/38.3.

Examples 1 to 16, Comparative Examples 1 and 2

The components shown below in Tables 1 and 2 were mixed together and dissolved to prepare a series of positive resist compositions.

TABLE 1

| | Component (A) | Component (B) | Component (F) | Component (D) | Component (S) | Contact angle (°) Prior to development | Contact angle (°) After development | Defects Unexposed portions | Defects Exposed portions | Amount of elution | Resolution | Exposure dose |
|---|---|---|---|---|---|---|---|---|---|---|---|---|
| Example 1 | (A)-1 [100] | (B)-1 [8] | (F)-1 [3.0] | (D)-1 [1] | (S)-1 [2500] | 97.7 | 72 | A | A | A | 60 nm | 13.5 |
| Example 2 | (A)-1 [100] | (B)-1 [8] | (F)-2 [3.0] | (D)-1 [1] | (S)-1 [2500] | 96 | 70.7 | A | A | A | 60 nm | 13.3 |
| Example 3 | (A)-1 [100] | (B)-1 [8] | (F)-9 [5.0] | (D)-1 [1] | (S)-1 [2500] | 88.9 | 69.6 | A | A | A | 60 nm | 12.6 |
| Example 4 | (A)-1 [100] | (B)-1 [8] | (F)-11 [3.0] | (D)-1 [1] | (S)-1 [2500] | 101 | 76.3 | A | A | A | 60 nm | 13.3 |
| Example 5 | (A)-1 [100] | (B)-1 [8] | (F)-3 [3.3] | (D)-1 [1] | (S)-1 [2500] | 93.5 | 77.4 | A | A | A | 60 nm | 12.9 |
| Example 6 | (A)-1 [100] | (B)-1 [8] | (F)-13 [1.9] | (D)-1 [1] | (S)-1 [2500] | 87.6 | 81.2 | B | A | A | 60 nm | 13.5 |
| Example 7 | (A)-1 [100] | (B)-1 [8] | (F)-14 [1.7] | (D)-1 [1] | (S)-1 [2500] | 96.2 | 85.4 | B | A | A | 60 nm | 13.4 |
| Example 8 | (A)-1 [100] | (B)-1 [8] | (F)-15 [3.0] | (D)-1 [1] | (S)-1 [2500] | 98.6 | 54.4 | A | A | A | 60 nm | 13.0 |
| Example 9 | (A)-1 [100] | (B)-1 [8] | (F)-10 [3.0] | (D)-1 [1] | (S)-1 [2500] | 89 | 70 | A | A | A | 60 nm | 12.9 |

TABLE 2

| | Component (A) | Component (B) | Component (F) | Component (D) | Component (S) | Contact angle (°) Prior to development | Contact angle (°) After development | Defects Unexposed portions | Defects Exposed portions | Amount of elution | Resolution | Exposure dose |
|---|---|---|---|---|---|---|---|---|---|---|---|---|
| Example 10 | (A)-1 [100] | (B)-1 [8] | (F)-12 [3.0] | (D)-1 [1] | (S)-1 [2500] | 101.7 | 74 | A | A | A | 60 nm | 13.4 |
| Example 11 | (A)-1 [100] | (B)-1 [8] | (F)-16 [3.0] | (D)-1 [1] | (S)-1 [2500] | 98.3 | 58.2 | A | A | A | 60 nm | 13.1 |
| Example 12 | (A)-1 [100] | (B)-1 [8] | (F)-4 [3.0] | (D)-1 [1] | (S)-1 [2500] | 97.2 | 71.4 | A | A | A | 60 nm | 13.0 |
| Example 13 | (A)-1 [100] | (B)-1 [8] | (F)-5 [3.0] | (D)-1 [1] | (S)-1 [2500] | 95 | 75 | A | A | A | 60 nm | 12.9 |
| Example 14 | (A)-1 [100] | (B)-1 [8] | (F)-6 [3.0] | (D)-1 [1] | (S)-1 [2500] | 91.3 | 72.0 | A | A | A | 60 nm | 13.1 |
| Example 15 | (A)-1 [100] | (B)-1 [8] | (F)-7 [5.0] | (D)-1 [1] | (S)-1 [2500] | 113.8 | 76.6 | A | A | A | 60 nm | 13.1 |
| Example 16 | (A)-1 [100] | (B)-1 [8] | (F)-8 [3.0] | (D)-1 [1] | (S)-1 [2500] | 88.0 | 64.2 | A | A | A | 60 nm | 13.0 |
| Comparative Example 1 | (A)-1 [100] | (B)-1 [8] | — | (D)-1 [1] | (S)-1 [2500] | 68.2 | 59.4 | — | — | B | — | — |
| Comparative Example 2 | (A)-1 [100] | (B)-1 [8] | (F)-17 [1.0] | (D)-1 [1] | (S)-1 [2500] | 89.8 | 86.2 | C | A | A | 60 nm | 13.5 |

In Tables 1 and 2, the reference characters indicate the following. Further, the values in brackets [ ] indicate the amount (in terms of parts by weight) of the component added.

(A)-1: a copolymer represented by chemical formula (A)-1 shown below (Mw: 7,000, Mw/Mn: 1.8). In the formula, the subscript numerals shown to the bottom right of the parentheses ( ) indicate the percentage (mol %) of the respective structural units within the copolymer.

(B)-1: (4-methylphenyl)diphenylsulfonium nonafluoro-n-butane sulfonate (F)-1: the polymeric compound 1
(F)-2: the polymeric compound 2
(F)-3: the polymeric compound 3
(F)-4: the polymeric compound 4
(F)-5: the polymeric compound 5
(F)-6: the polymeric compound 6
(F)-7: the polymeric compound 7
(F)-8: the polymeric compound 8
(F)-9: the polymeric compound 9
(F)-10: the polymeric compound 10
(F)-11: the polymeric compound 11
(F)-12: the polymeric compound 12
(F)-13: the polymeric compound 13
(F)-14: the polymeric compound 14
(F)-15: the polymeric compound 15
(F)-16: the polymeric compound 16
(F)-17: the polymeric compound 17 shown below which is disclosed in Japanese Unexamined Patent Application, First Publication No. 2008-114203 ([Chemical Formula 46] in paragraph [0163]).

(D)-1: tri-n-pentylamine.
(S)-1: a mixed solvent of PGMEA/PGME=6/4 (weight ratio).

[Chemical Formula 85]

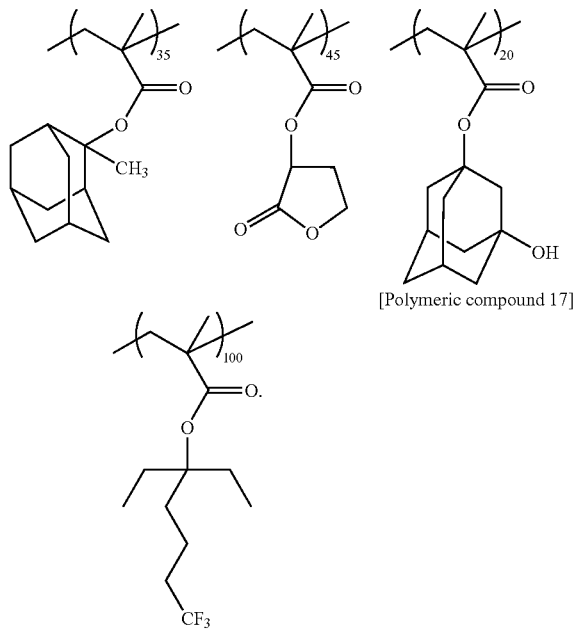

(A)-1

[Polymeric compound 17]

[Measurement of Contact Angle of Resist Film]

Using a spinner, each resist composition solution obtained in Examples 1 to 16 and Comparative Examples 1 and 2 was applied onto an 8-inch silicon wafer that had been treated with hexamethyldisilazane (HMDS), and the solution was then prebaked (PAB) and dried on a hotplate at 110° C. for 60 seconds, thus forming a resist film with a film thickness of 100 nm.

A water droplet was dripped onto the surface of each resist film (the resist film prior to exposure), and a DROP MASTER-700 apparatus (a product name, manufactured by Kyowa Interface Science Co. Ltd.) was used to measure the contact angle (the static contact angle) (contact angle measurement: water 2 µl). The measured value was defined as the "contact angle prior to development (°)".

Following measurement of the contact angle, the wafer was subjected to an alkali developing treatment for 60 seconds at 23° C. in a 2.38% by weight aqueous solution of tetramethylammonium hydroxide (TMAH). The wafer was then rinsed with pure water for 15 seconds, followed by drying by shaking. Subsequently, the contact angle was measured in the same manner as that described above. The measured values were defined as the "contact angle (°) after development".

The results are shown in Tables 1 and 2.

As is evident from the above results shown in Tables 1 and 2, the resist films formed using the resist compositions of Examples 1 to 16 which included the fluorine-containing polymeric compounds according to the present invention exhibited a high contact angle prior to development, as compared to the resist films formed using the resist compositions of Comparative Examples 1 and 2 which did not include a fluorine-containing compound. Therefore, it was found that by virtue of including a fluorine-containing compound of the present invention, the hydrophobicity of the resist film is enhanced. As a result, it is expected that not only can the water tracking ability during immersion exposure using a scanning-type immersion exposure apparatus be improved, but also elution of a substance can be suppressed.

[Evaluation of Eluted Substance]

Using a spinner, each resist composition solution obtained in Examples 1 to 16 and Comparative Examples 1 and 2 was applied onto an 8-inch silicon wafer, and the solution was then prebaked (PAB) and dried on a hotplate at 110° C. for 60 seconds, thus forming a resist film with a film thickness of 120 nm.

Then, using VRC31 OS (product name; manufactured by S.E.S Co., Ltd.), one droplet of pure water (150 µl) was moved from the center of the wafer in a circular manner at room temperature at a constant linear velocity (total area of the resist film that came in contact with the droplet: 221.56 $cm^2$).

Thereafter, the droplet was collected, and analyzed by an analyzing apparatus Agilent-HP 1100 LC-MSD (product name; manufactured by Agilent Technologies), and the total amounts of elution ($\times 10^{-11}$ mol/$cm^2 \cdot s$) of the cation moiety (PAG+) and anion moiety (PAG−) of the component (B) prior to exposure and the component (D) were determined.

With respect to the amount of elution described above, those compositions with the amount of elution of not more than $1.6 \times 10^{-11}$ mol/$cm^2 \cdot s$ were evaluated as "A" whereas those compositions with the amount of elution of more than $1.6 \times 10^{-11}$ mol/$cm^2 \cdot s$ were evaluated as "B". The results are shown in Tables 1 and 2.

[Formation of Resist Pattern]

An organic anti-reflection film composition (product name: ARC29A, manufactured by Brewer Science Ltd.) was applied onto a 12-inch silicon wafer using a spinner, and the composition was then baked and dried at 205° C. for 60 seconds, thereby forming an organic anti-reflection film having a film thickness of 89 nm.

Then, each resist composition solution obtained in Examples 1 to 16 and Comparative Example 2 was applied onto the anti-reflection film using a spinner, and was then prebaked (PAB) on a hotplate at 110° C. for 60 seconds and dried, thereby forming a resist film having a film thickness of 100 nm.

Subsequently, the resist film was selectively irradiated with an ArF excimer laser (193 µm) through a mask pattern, using an ArF immersion exposure apparatus NSR-S609B (manufactured by Nikon Corporation, NA (numerical aperture)=1.07, σ0.97). Thereafter, a post exposure bake (PEB) treatment was conducted at 110° C. for 60 seconds, followed by development for 30 seconds at 23° C. in a 2.38% by weight aqueous solution of tetramethylammonium hydroxide (TMAH). Then, the resist film was washed for 30 seconds with pure water, followed by drying by shaking.

As a result, in each of the examples, a line and space pattern with a line width of 60 nm and a pitch of 110 nm was formed on the resist film. The exposure dose (mJ/$cm^2$) during this process is shown in Tables 1 and 2.

It was not possible to make evaluations on the resist composition obtained in Comparative Example 1 using an immersion exposure apparatus, since a large amount of substance was eluted and contaminated the lens.

[Defects]

Subsequently, a surface defect inspection device KLA2371 (a product name) manufactured by KLA Tencor Corporation was used to observe the surface of the abovementioned resist pattern, to thereby determine the number of defects on the surface of space portions (exposed portions) and the number of defects on the surface of resist portions (unexposed portions) within the substrate. With respect to the number of defects described above, those compositions with not more than 3,000 defects were evaluated as "A", those compositions with 3,001 to 10,000 defects were evaluated as "B", and those compositions with 10,001 or more defects were evaluated as "C". The results are shown in Tables 1 and 2.

The above results confirmed that the fluorine-containing compounds according to the present invention are useful as an additive used in a resist composition for immersion exposure. Further, the above results also confirmed that the resist composition containing the above fluorine-containing compound is suitable as a resist composition for immersion exposure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition for immersion exposure comprising:
a fluorine-containing polymeric compound (F) comprising a structural unit (f1) represented by general formula (f1-1) or (f1-2) shown below and a structural unit (f2) represented by general formula (f2-1) shown below;
a base component (A) that exhibits changed solubility in an alkali developing solution under the action of acid; and
an acid generator component (B) that generates acid upon exposure:

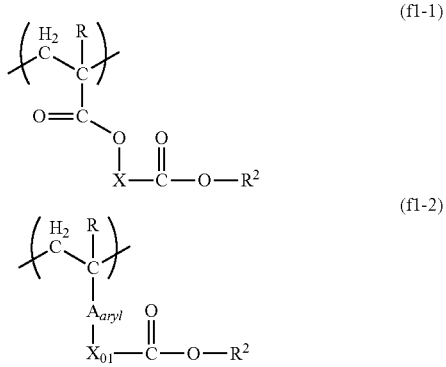

wherein each R independently represents a hydrogen atom, a lower alkyl group or a halogenated lower alkyl group; X represents a divalent organic group; $A_{aryl}$ represents a divalent aromatic cyclic group which may have a substituent; $X_{01}$ represents a single bond or a divalent linking group; and each $R^2$ independently represents an organic group having a fluorine atom;

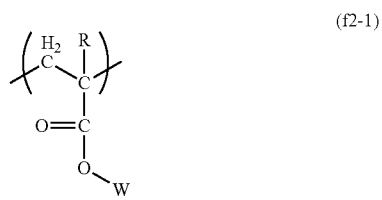

wherein R represents a hydrogen atom, a lower alkyl group or a halogenated lower alkyl group; and W is a group represented by any one of general formulas (w-1) to (w-4):

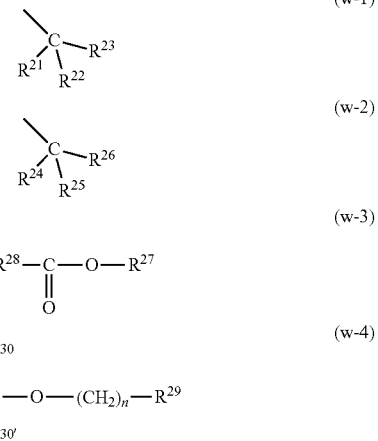

wherein $R^{21}$ represents an alkyl group of 2 or more carbon atoms; $R^{22}$ and $R^{23}$ are bonded to each other to form an aliphatic monocyclic group of 7 or more carbon atoms; $R^{24}$ represents a branched alkyl group of 3 or more carbon atoms; $R^{25}$ and $R^{26}$ are bonded to each other to form an aliphatic cyclic group; $R^{27}$ represents an acid dissociable, dissolution inhibiting group; $R^{28}$ represents a divalent linking group; $R^{29}$ represents a linear or branched alkyl group or an aliphatic cyclic group; n represents an integer of 0 to 3; $R^{30}$ and $R^{30'}$ each independently represent a linear or branched alkyl group or a hydrogen atom; and $R^{29}$ and $R^{30}$ may be bonded to each other to form an aliphatic cyclic group.

2. The resist composition for immersion exposure according to claim 1, which is a positive resist composition.

3. The resist composition for immersion exposure according to claim 2, wherein said base component (A) is a resin component (A1) that exhibits increased solubility in an alkali developing solution under action of acid.

4. The resist composition for immersion exposure according to claim 3, wherein said resin component (A1) comprises a structural unit (a1) derived from an acrylate ester having an acid dissociable, dissolution inhibiting group.

5. The resist composition for immersion exposure according to claim 4, wherein said resin component (A1) further comprises a structural unit (a2) derived from an acrylate ester having a lactone-containing cyclic group.

6. The resist composition for immersion exposure according to claim 4, wherein said resin component (A1) further comprises a structural unit (a3) derived from an acrylate ester having a polar group-containing aliphatic hydrocarbon group.

7. The resist composition for immersion exposure according to claim 1, which further comprises a nitrogen-containing organic compound (D).

8. A method of forming a resist pattern comprising:
applying the resist composition for immersion exposure of any one of claims 1 and 2-7 to a substrate to form a resist film;
subjecting said resist film to immersion exposure; and
subjecting said resist film to alkali developing to form a resist pattern.

9. A fluorine-containing polymeric compound comprising:
a structural unit (f1) represented by general formula (f1-1) or (f1-2) shown below:

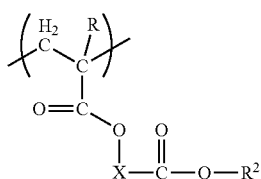
(f1-1)

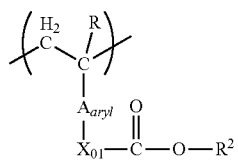
(f1-2)

wherein each R independently represents a hydrogen atom, a lower alkyl group or a halogenated lower alkyl group; X represents a divalent organic group; $A_{aryl}$ represents a divalent aromatic cyclic group which may have a substituent; $X_{01}$ represents a single bond or divalent linking group; and each $R^2$ independently represents an organic group having a fluorine atom, and a structural unit (f2) represented by general formula (f2-1) shown below:

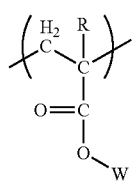
(f2-1)

wherein R represents a hydrogen atom, a lower alkyl group or a halogenated lower alkyl group; and W is a group represented by any one of general formulas (w-1) to (w-4):

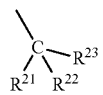
(w-1)

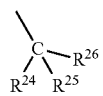
(w-2)

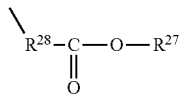
(w-3)

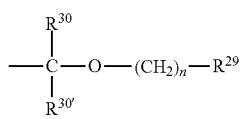
(w-4)

wherein $R^{21}$ represents an alkyl group of 2 or more carbon atoms; $R^{22}$ and $R^{23}$ are bonded to each other to form an aliphatic monocyclic group of 7 or more carbon atoms; $R^{24}$ represents a branched alkyl group of 3 or more carbon atoms; $R^{25}$ and $R^{26}$ are bonded to each other to form an aliphatic cyclic group; $R^{27}$ represents an acid dissociable, dissolution inhibiting group; $R^{28}$ represents a divalent linking group; $R^{29}$ represents a linear or branched alkyl group or an aliphatic cyclic group; n represents an integer of 0 to 3; $R^{30}$ and $R^{30'}$ each independently represent a linear or branched alkyl group or a hydrogen atom; and $R^{29}$ and $R^{30}$ may be bonded to each other to form an aliphatic cyclic group.

* * * * *